(12) United States Patent
Takehara et al.

(10) Patent No.: US 7,432,201 B2
(45) Date of Patent: Oct. 7, 2008

(54) HYBRID PVD-CVD SYSTEM

(75) Inventors: Takako Takehara, Hayward, CA (US); Sheng Sun, Foster City, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 249 days.

(21) Appl. No.: 11/185,535

(22) Filed: Jul. 19, 2005

(65) Prior Publication Data

US 2007/0020903 A1 Jan. 25, 2007

(51) Int. Cl.
*H01L 21/31* (2006.01)
(52) U.S. Cl. .................. 438/685; 438/761; 438/763; 438/778
(58) Field of Classification Search .......... 438/763, 438/685, 778, 761
See application file for complete search history.

(56) References Cited

U.S. PATENT DOCUMENTS

| | | | |
|---|---|---|---|
| 6,287,430 B1 | 9/2001 | Matsumoto et al. | |
| 6,688,375 B1 | 2/2004 | Turner et al. | |
| 2001/0015074 A1* | 8/2001 | Hosokawa | 62/378 |
| 2002/0170671 A1 | 11/2002 | Matsushita et al. | |
| 2005/0205870 A1* | 9/2005 | Yamazaki | 257/72 |

FOREIGN PATENT DOCUMENTS

| | | |
|---|---|---|
| JP | 05-109655 | 4/1993 |
| JP | 05-287530 | 11/1993 |
| JP | 10-098085 | 4/1998 |
| JP | 11-145084 | 5/1999 |
| JP | 2002-158090 | 5/2002 |
| JP | 2003-027234 | 1/2003 |
| JP | 2004-342455 | 12/2004 |
| KR | 10-0297971 | 8/2001 |
| KR | 2003-0047581 | 6/2003 |
| KR | 10-2005-0038121 | 4/2005 |

\* cited by examiner

*Primary Examiner*—Thanh Nguyen
(74) *Attorney, Agent, or Firm*—Patterson & Sheridan LLP

(57) ABSTRACT

A method for making a film stack containing one or more silicon-containing layers and one or more metal-containing layers and a substrate processing system for forming the film stack on a substrate are provided. The substrate processing system includes one or more transfer chambers coupled to one or more load lock chambers and two or more different types of process chambers. The two or more types of process chambers are used to deposit the one or more silicon-containing layers and the one or more metal-containing layers in the same substrate processing system without breaking the vacuum, taking the substrate out of the substrate processing system to prevent surface contamination, oxidation, etc., such that additional cleaning or surface treatment steps can be eliminated. The substrate processing system is configured to provide high throughput and compact footprint for in-situ substrate processing and carry out different types of processes.

22 Claims, 27 Drawing Sheets

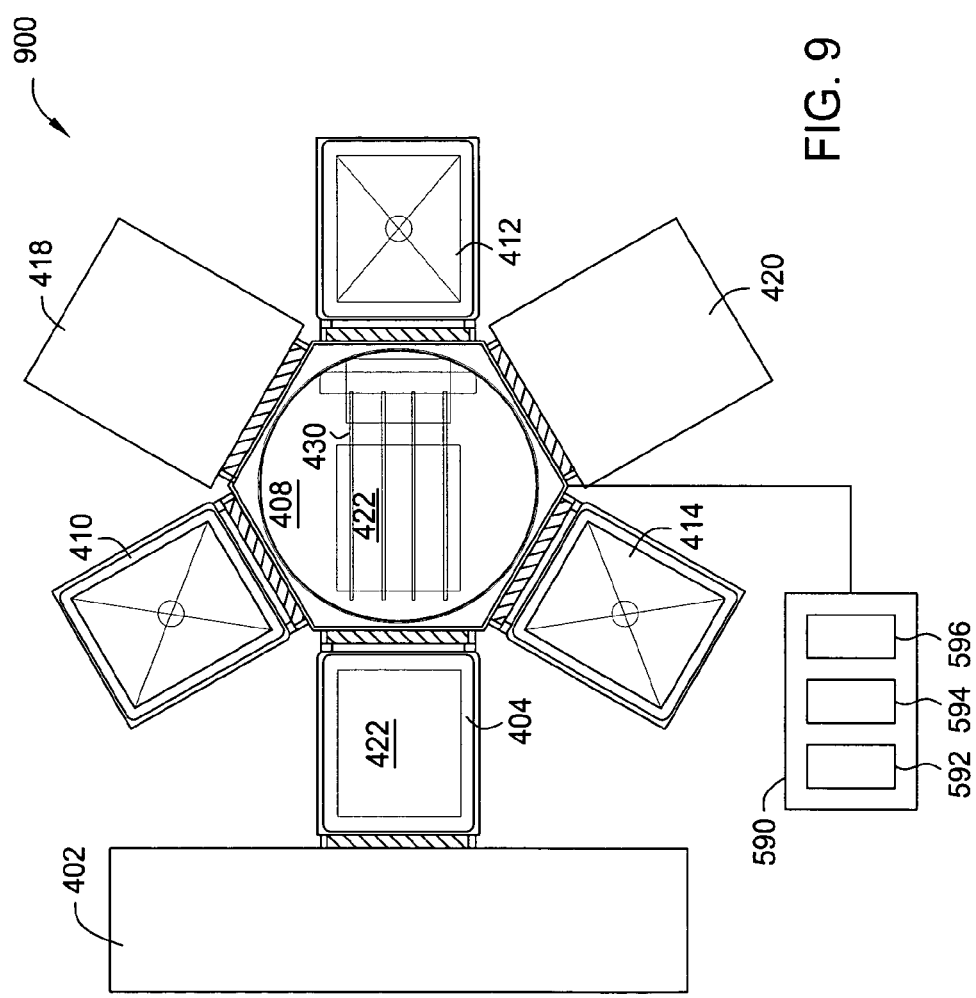

HYBRID PVD-CVD SYSTEM

BACKGROUND OF THE INVENTION

1. Field of the Invention

Embodiments of the invention generally relate to an apparatus and method for substrate processing of a multilayer film stack. The invention is particularly useful for fabrication of flat panel displays.

2. Description of the Related Art

Fabrication of semiconductor integrated circuits (IC) and flat panel display (FPD) devices require processing of multilayer film stacks to create devices, conductors and insulators on a substrate. One example of a multilayer film stack is a thin film transistor (TFT) structure useful for fabricating liquid crystal display (LCD) devices. FIG. 1 depicts an exemplary bottom gate structure of a thin film transistor 1 having a glass substrate 10 and an optional underlayer 20 formed thereon. A bottom gate formed on the underlayer 20 comprises a gate electrode layer 30 and a gate insulation layer 40. The gate electrode controls the movement of charge carriers in a transistor. The gate insulation layer 40 electrically isolates the gate electrode layer 30 from a bulk semiconductor layer 50 and a doped semiconductor layer formed thereover, each of which may function to provide charge carriers to the transistor. A source region 70a and a drain region 70b formed in the doped semiconductor layer is patterned and isolated by an interlayer dielectric/etch stop layer 60 formed over the bulk semiconductor layer 50. A conductive layer is deposited over the doped semiconductor layer to form a source contact 80a disposed on the source region 70a and a drain contact 80b disposed on the drain region 70b. Finally, a passivation layer 90 encapsulates the thin film transistor 1 to protect the transistor from environmental hazards such as moisture and oxygen. The gate electrode layer 30 generally comprises a conductive metal material. The gate dielectric layer 40, the bulk semiconductor layer 50, and the doped semiconductor layer generally comprises a silicon-containing material.

In general, the substrate for device fabrication is subjected to various processes, such as sputtering, chemical vapor deposition (CVD), physical vapor deposition (PVD), lithography, etching, ion implantation, ashing, cleaning, heating, annealing, and the like in a specific multi-step fabrication sequence to process layers of metal and silicon containing films thereon. For example, a process chamber is usually configured to perform a single step of the fabrication sequence and the substrate is processed through steps of deposition, patterning, lithography and etching repeated multiple times. A number of process chambers can also be coupled together to a central transfer chamber, having a robot therein to facilitate substrate transfer between the process chambers, to perform one or more substrate processing steps in a single processing platform, such as a cluster tool, examples of which are the families of AKT PECVD, PRODUCER®, CENTURA® and ENDURA® processing platforms available from Applied Materials, Inc., of Santa Clara, Calif.

Typically, the substrate is repeatedly taken in and out among various process chambers and/or cluster tools, partially because a specific substrate processing platform requires a special fabrication sequence. Another reason is that different types of films generally require different types of process chambers and chamber peripherals that may not be technically capable or economical to be coupled together in a single processing system. In addition, in between each step, the surface of the previous thin film may need to be treated, such as annealing to form an interlayer or cleaned by a cleaning solution to remove any surface residues, by-products, contaminants, before taking to the next substrate processing system.

As an example, FIG. 2 depicts a prior art example of a method 200 for processing a film stack having a silicon-containing film and a metal film. The silicon-containing film can be deposited on a substrate in a CVD chamber of a first processing system at step 210. The surface of the substrate is inspected at step 220 and additional patterning, lithography and etching steps may be needed. Since the surface of a silicon-containing film tends to be oxidized when exposed to air so the deposited silicon-containing film needs to be cleaned and/or processed immediately within certain time frame due to the increase potential for particle contamination, moisture penetration, and surface oxidation before and/or after a next patterning step or deposition step. Oftentimes, the next film may contain metal or other materials and may need to be deposited by a different type of process chamber or cluster tool. In this case, the substrate is removed from the vacuum environment of the first substrate processing system and transferred to a hydrofluoric acid cleaning station to clean the surface of the silicon-containing film at step 230. After the deposited silicon-containing film on the surface of the substrate is cleaned, at step 240, the substrate may again need to be immediately transferred, to a second processing system for additional deposition, etching, annealing, and cleaning steps. For example, the substrate after cleaning may need to be additionally processed within 30 minutes to prevent the surface of the silicon-containing film from further oxidation, moisture penetration, and contamination. Then, at step 250, a metal film is deposited over the silicon-containing film on the substrate in a PVD chamber of the second processing system. Thereafter, at step 260, the metal film on the surface of the substrate is inspected again and additional lithography and etching steps are performed. As silicon deposition, metal deposition, and etching processes are typically performed in separate processing systems/tools, the cost for fabricating devices on substrates is high due to the number and size of different tools required and the expense of additional steps or substrate transfer between tools during processing. Moreover, the number of substrate transfer between different tools has an adverse effect on product yields and throughput.

Further, as the demand for semiconductor and flat panel devices continues to grow, there is a trend to reduce cost by increasing the sizes of the semiconductor substrates, glass substrates, and the like for large scale fabrication. For example, glass substrates utilized for flat panel fabrication, such as those utilized to fabricate computer monitors, large screen televisions, displays for PDAs and cell phones and the like, have increased in size from 550 mm×650 mm to 1500 mm×1800 mm in just a few years and are envisioned to exceed four square meters in the near future. Thus, the dimension of a substrate processing system has become ever so large. The cost associated with chamber parts and tool components configured to process large area substrates continues to escalate dramatically. To cut down the cost and reduce surface contamination, it is desirable to design a novel fabrication sequence to eliminate or combine one or more processing steps and to develop processing tools to accommodate sequential processing steps in the same tool for such large area substrates in high throughput and yet in a compact and reduced footprint.

Therefore, there is a need for an improved method and apparatus to process multilayer metal and silicon-containing thin films.

SUMMARY OF THE INVENTION

Embodiments of a substrate processing system, process chambers and processing method for in-situ processing of a substrate are provided. In one embodiment, a method of processing a film stack containing one or more silicon-containing layers and one or more metal-containing layers on a substrate in a substrate processing system is provided. The method includes depositing the one or more silicon-containing layers on the substrate by a chemical vapor deposition chamber of the substrate processing system, transferring the substrate to a physical vapor deposition chamber of the same substrate processing system, and depositing the one or more metal-containing layers on the surface of the silicon-containing layers by the physical vapor deposition chamber without any surface treatment of the one or more silicon-containing layer.

Another embodiment of a method of processing a film stack on a substrate in a substrate processing system includes loading the substrate into one or more load lock chambers of the substrate processing system and transferring the substrate from the one or more load lock chambers into one or more chemical vapor deposition chambers of the substrate processing system using a vacuum transfer robot positioned in a transfer chamber of the substrate processing system. The method further includes depositing one or more silicon-containing layers on the substrate by the one or more chemical vapor deposition chambers of the substrate processing system and transferring the substrate from the one or more chemical vapor deposition chambers into one or more physical vapor deposition chambers of the same substrate processing system without breaking any vacuum and depositing one or more metal-containing layers on the surface of the one or more silicon-containing layers by the one or more physical vapor deposition chambers. The method additionally includes transferring the substrate from the one or more physical vapor deposition chambers into the one or more load lock chambers and unloading the substrate from the one or more load lock chambers of the substrate processing system.

In another embodiment, a method of processing a substrate includes loading the substrate into a first load lock chamber of a substrate processing system, transferring the substrate from the first load lock chamber through a first transfer chamber into a second transfer chamber, and transferring the substrate into one or more chemical vapor deposition chambers of the substrate processing system. The method further includes depositing one or more silicon-containing layers on the substrate by the one or more chemical vapor deposition chambers of the substrate processing system, transferring the substrate from the one or more chemical vapor deposition chambers into the second transfer chamber, transferring the substrate from the second transfer chamber into the first transfer chamber, and transferring the substrate form the second transfer chamber into one or more physical vapor chambers of the same substrate processing system without breaking any vacuum. Further, the method includes depositing one or more metal-containing layers on the surface of the one or more silicon-containing layers by the one or more physical vapor chambers, transferring the substrate from the one or more physical vapor deposition chambers into the first load lock chamber, and unloading the substrate from the first load lock chamber of the substrate processing system.

In addition, a substrate processing system for processing one or more substrates is provided. The substrate processing system includes one or more load lock chambers, one or more transfer chambers coupled to the one or more load lock chambers, and one or more chemical vapor deposition chambers coupled to the one or more transfer chambers and configured to deposit one or more silicon-containing layers on the substrate. The substrate processing system further includes one or more physical vapor deposition chambers coupled to the one or more transfer chambers and configured to deposit one or more metal-containing layers on the substrate.

In another embodiment, a substrate processing system for processing one or more substrates includes a first load lock chamber for loading and unloading the one or more substrates, a first transfer chamber coupled to the first load lock chamber, and a first process module coupled to the first transfer chamber. The substrate processing system further includes a second process module coupled to the first transfer chamber via a second load lock chamber. The first process module includes one or more first process chambers and the second process module includes one or more second process chambers configured to perform a different process than the one or more first process chambers. In addition, a first ransfer robot is included and positioned inside the first transfer chamber to be rotably movable among the first load lock chamber, the first process module, and the second load lock chamber. Optionally, one or more shuttle mechanisms may be coupled to the one or more second process chambers. Further, a shuttle chamber may be optionally coupled to the second load lock chamber and/or the one or more second process chambers.

In still another embodiment, a substrate processing system of the invention includes a second process module coupled to a first transfer chamber via a second transfer chamber. In addition, the first transfer chamber and the second transfer chamber are separated by a vacuum sealable valve, where a first transfer robot is included and positioned inside the first transfer chamber to be rotably movable among the first load lock chamber, the first process module, and the second transfer chamber. A shuttle mechanism may be optionally coupled to the first transfer chamber and the second transfer chamber. The second transfer chamber may include a second transfer robot positioned therein to be rotably movable among the one or more second process chambers.

Still further, a substrate processing system of the invention includes a second process module that is coupled to a first transfer chamber via at least one of the one or more second process chambers, where a first transfer robot is included and positioned inside the first transfer chamber to be rotably movable among the first load lock chamber, the first process module, and the at least one second process chamber.

Further, a substrate processing system for processing one or more substrates may include a first load lock chamber adapted to load and unload the one or more substrates into the substrate processing system, a first transfer chamber coupled to the first load lock chamber, one or more first process chambers coupled to the first transfer chamber, and one or more second process chambers different from the one or more first process chambers, where at least one of the second process chambers is coupled to the first transfer chamber. The substrate processing system further includes a second load lock chamber positioned between the one or more second process chambers and adapted to load and unload the one or more substrates between the one or more second process chambers. In addition, a first transfer robot is positioned inside the first transfer chamber to be rotably movable among the first load lock chamber, the one or more first process chambers, and the at least one second process chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 9 is a plan view of an exemplary cluster tool configured for in-situ processing of a film stack according to a still further embodiment of the invention.

DETAILED DESCRIPTION

The invention provides a method and a substrate processing system for in-situ processing of a film stack containing one or more silicon-containing layers and one or more metal layers without taking the substrate out of the substrate processing system or cleaning the substrate in between the silicon-containing and/or metal layers are deposited. The silicon-containing layers and the metal containing layers can be processed in high volume and high throughput by different types of process chambers, for example, physical vapor deposition (PVD) and sputtering chambers, ion metal implant (IMP) chambers, chemical vapor deposition (CVD) chambers, atomic layer deposition (ALD) chambers, plasma etching chambers, annealing chambers, other furnace chambers, cleaning stations, etc. The substrate processing system may include a deposition chamber in which a substrate is exposed to one or more gas-phase materials or plasma. In one embodiment, a hybrid cluster type substrate processing system including at least one physical vapor deposition (PVD) process chamber and at least one chemical vapor deposition (CVD) process chamber is provided for in-situ deposition of metal and silicon-containing layers of a film stack. In another embodiment, the substrate processing system is also configured to include various types of process chambers to perform different etching, deposition, annealing, and cleaning processes.

Figure 1:
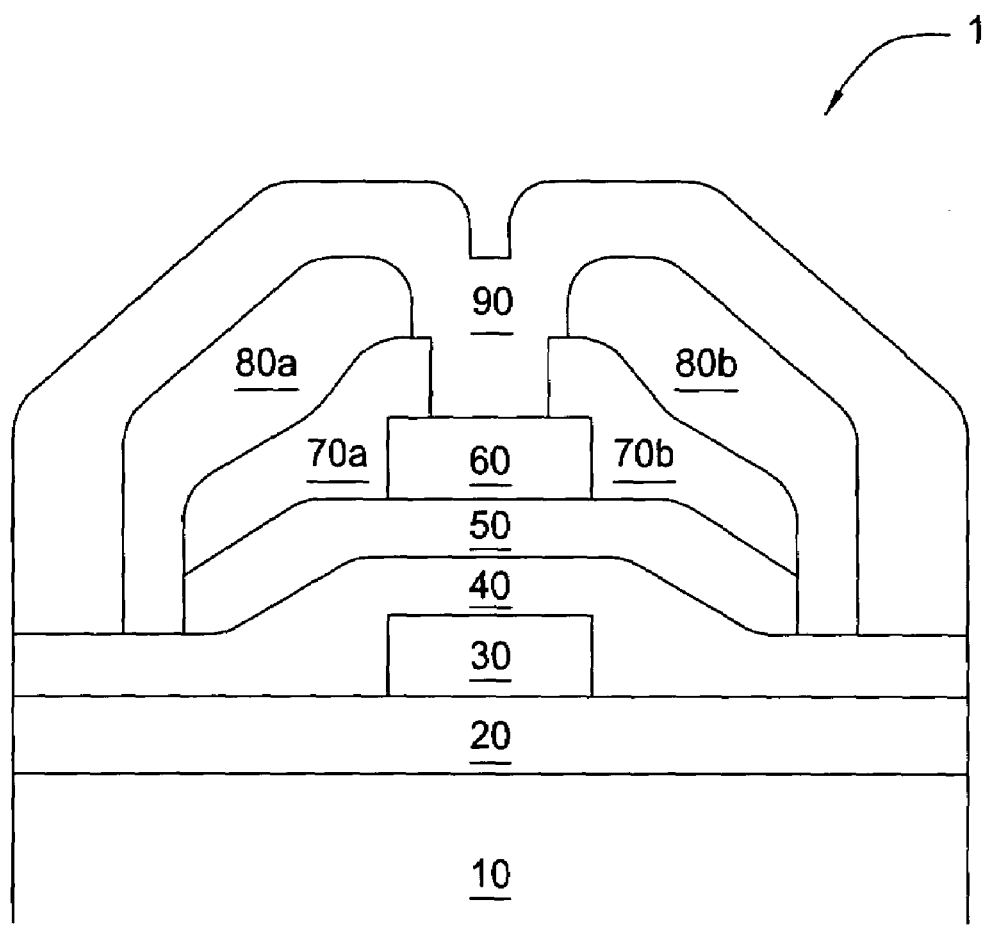
FIG. 1 depicts a cross-sectional schematic view of an exemplary bottom gate thin film transistor.
Figure 2:
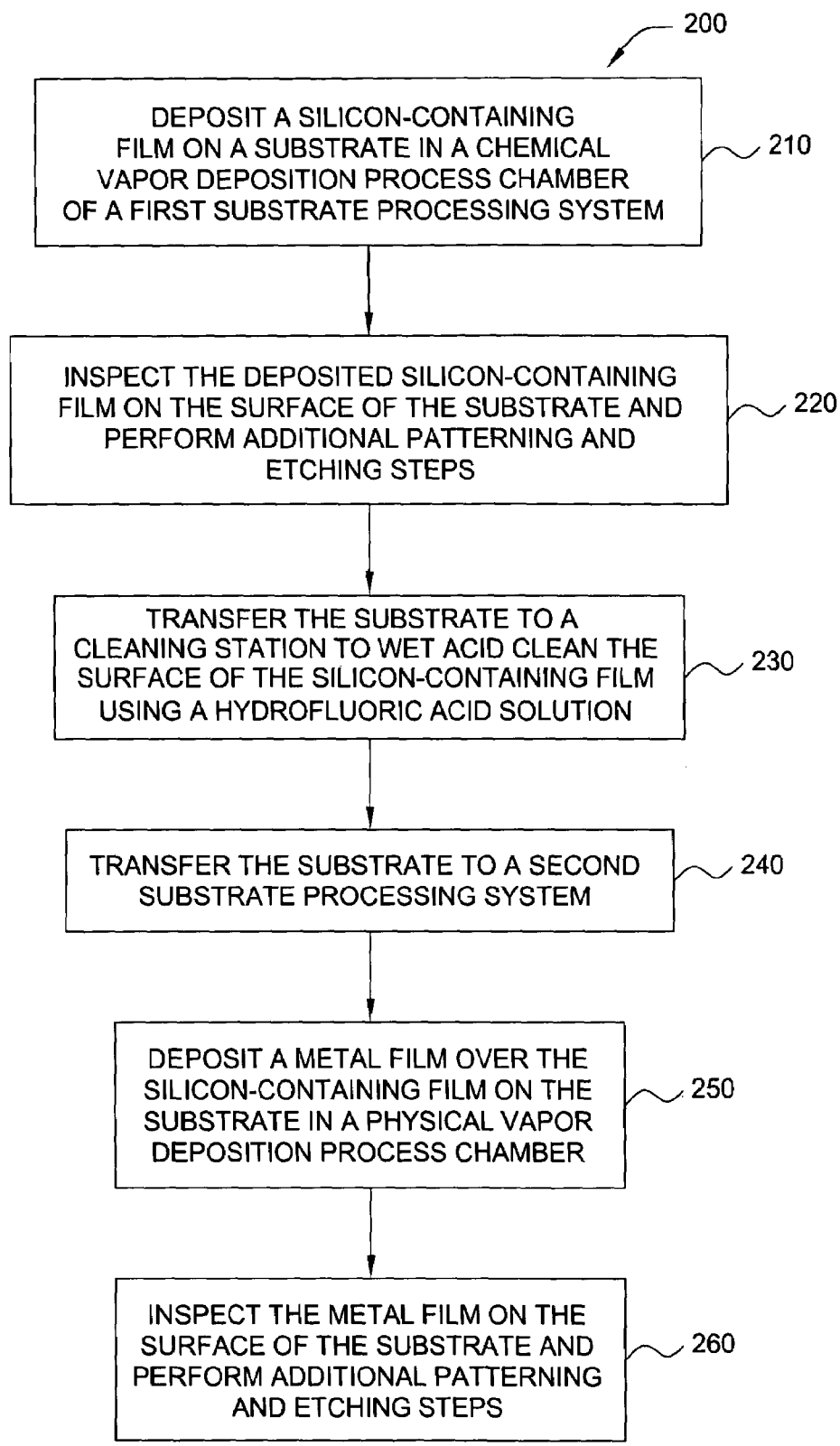
FIG. 2 is a flow diagram of an exemplary conventional transistor fabrication process.
Figure 3A:
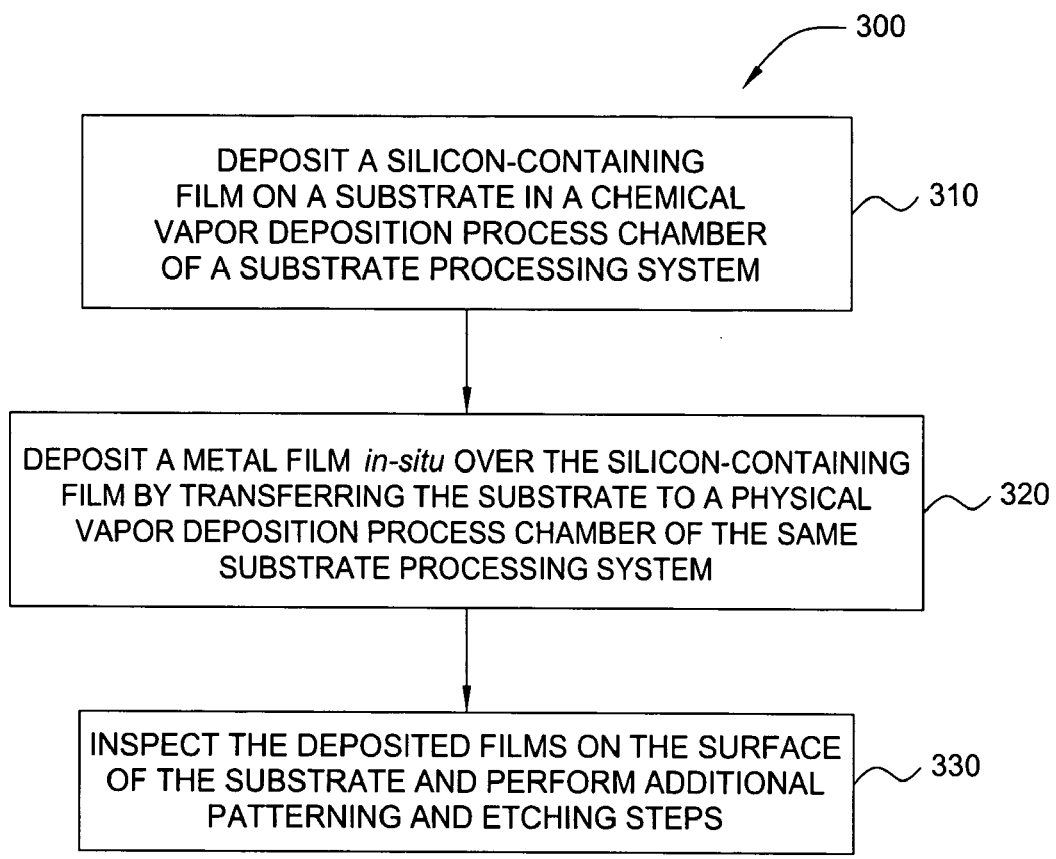
FIG. 3A depicts a flow diagram of an exemplary method for in-situ processing of a film stack according to one embodiment of the invention.

FIG. 3A illustrates a flow chart of a method 300 for in-situ processing of a film stack according to one embodiment of the invention. At step 310, a silicon-containing film is deposited on a substrate in a CVD chamber of a substrate processing system. In one embodiment, the silicon-containing film includes one or more gate insulation layer, semiconductor layer, n-type (n+) doped semiconductor layer, p-type (p+) doped semiconductor layer, and combinations thereof. The silicon-containing film generally includes one or more layers of silicon-containing materials, including, but not limited to, amorphous silicon, n-type (n+) doped amorphous silicon, p-type (p+) doped amorphous silicon, polysilicon, n-type (n+) doped polysilicon, p-type (p+) doped polysilicon silicon nitride, silicon oxide, n-type (n+) doped silicon oxide, p-type (p+) doped silicon oxide, silicon carbide, silicon oxyinitride, and combinations thereof.

In another embodiment, the one or more silicon-containing layers are sequentially deposited on the substrate by the same CVD chamber. In still another embodiment, the one or more silicon-containing layers are sequentially deposited on the substrate by different CVD chambers, where at least one of the CVD chambers are coupled to the substrate processing system for processing the next film in situ without taking out of the substrate processing system. Additional substrate processing systems having CVD chambers and/or PVD chambers may also be used for depositing the one or more silicon-containing layers.

At step 320, a metal film is deposited in situ over the silicon-containing film by transferring the substrate to a metal deposition chamber of the same substrate processing system without taking the substrate out of the vacuum environment of the substrate processing system. Since the surface of the silicon-containing film is immediately transferred to a metal deposition chamber and kept in the vacuum environment of the same substrate processing system, air and other contaminants is unlikely to penetrate the surface of the silicon-containing film and there is no additional need for surface cleaning, such as using a hydrofluoric acid cleaning solution, or any other surface treatment. The substrate processing systems of the invention make the in-situ deposition possible to eliminate conventional steps of transferring the substrate in and out of different substrate processing tools, cleaning the substrate surface, and immediate depositing a material over the silicon-containing film to prevent surface reaction, oxidation, and other steps. The metal deposition chamber preferably is a PVD chamber, however, other types of deposition chambers can also be used.

In one embodiment, the metal film includes one or more gate metal layer, conductor layer, gate electrode layer, and combinations thereof. The metal film may include one or more layers of the same or different metal materials. Suitable metal materials include, but are not limited to, aluminum (Al), molybdenum (Mo), neodymium (Nd), aluminum neodymium (AlNd), tungsten (W), chromium (Cr), tantalum (Ta), titanium (Ti), copper (Cu), aluminum nitride ($Al_xN_y$), molybdenum nitride ($Mo_xN_y$), tantalum nitride (TaN), titanium nitride (TiN), other metal nitrides, their alloys, and combinations thereof. For example, the metal film may be a single layer of molybdenum or a triple layer of molybdenum, aluminum, and molybdenum. In another layer, the metal film may be a triple layer of titanium, aluminum, and titanium, or titanium nitride, aluminum, and titanium nitride. As another example, the metal film may include a layer of molybdenum and a layer of aluminum neodymium (AlNd) alloy. Other example includes a layer of aluminum nitride. Another example includes a layer of chromium and a layer of aluminum neodymium. Further, a film stack containing copper and various barrier material suitable for copper can be deposited using the method and apparatus of the invention.

In another embodiment, the one or more metal layers are sequentially deposited by the same PVD chamber located in a substrate processing system having a CVD chamber. In still another embodiment, the one or more metal layers are sequentially deposited on a substrate by different PVD chambers, where at least one of the PVD chambers are coupled to a substrate processing system for processing a film by the at least one PVD chamber in situ with another film deposited on the substrate by a CVD chamber in the same substrate processing system without taking the substrate out of the substrate processing system.

In one aspect, the one or more metal layers are deposited by one or more substrate processing systems, where at least one of the substrate processing system is a hybrid system having at least one PVD chamber and at least one CVD chamber. Additional substrate processing systems having CVD chambers and/or PVD chambers may also be used for depositing the one or more metal layers.

At step 330, the deposited film on the surface of the substrate is inspected and additional deposition, patterning and etching steps can be performed. For example, a layer of photoresist may be coated over the surface of the substrate and a mask having a pattern may be applied onto the surface. The deposited film may then be etch using a dry etch process, a wet etch process, among others, to etch one or more layers of the deposited metal layers. In one aspect, it may require etching using different masks for different layers which need to be etched. In another aspect, in addition to etching the metal layers exposed on the surface, one or more layers of the deposited silicon-containing layers may need to be etched using the same or different masks. Further, oxygen ashing, ion-implant, or other plama treatment may be needed to remove portions of the photoresist material before additional one or more etching processes are performed on the surface of the substrate.

In addition, one or more surface treatments can be performed prior to deposition of the silicon-containing film or after deposition of the metal film on the surface of the substrate. For example, the substrate may be heated by using a radiant heat lamp, inductive heater, or an IR type resistive heater, and/or annealed in an annealing chamber. As another example, the substrate may be chemically cleaned prior to or the steps of the method 300 using any of the cleaning solutions known in the art, such as a distilled water solution, a sulfuric acid solution, a hydrofluoric acid solution, among others. The method 300 may further include etching to form a pattern on the surface of the substrate before the step 310 using the same or different substrate processing system as in the method 300.

One embodiment of the invention includes that these additional processes can be performed in the same substrate processing system in the method 300. Another embodiment of the invention includes additional substrate processing system to perform one or more of these additional processes.

Figure 3B:
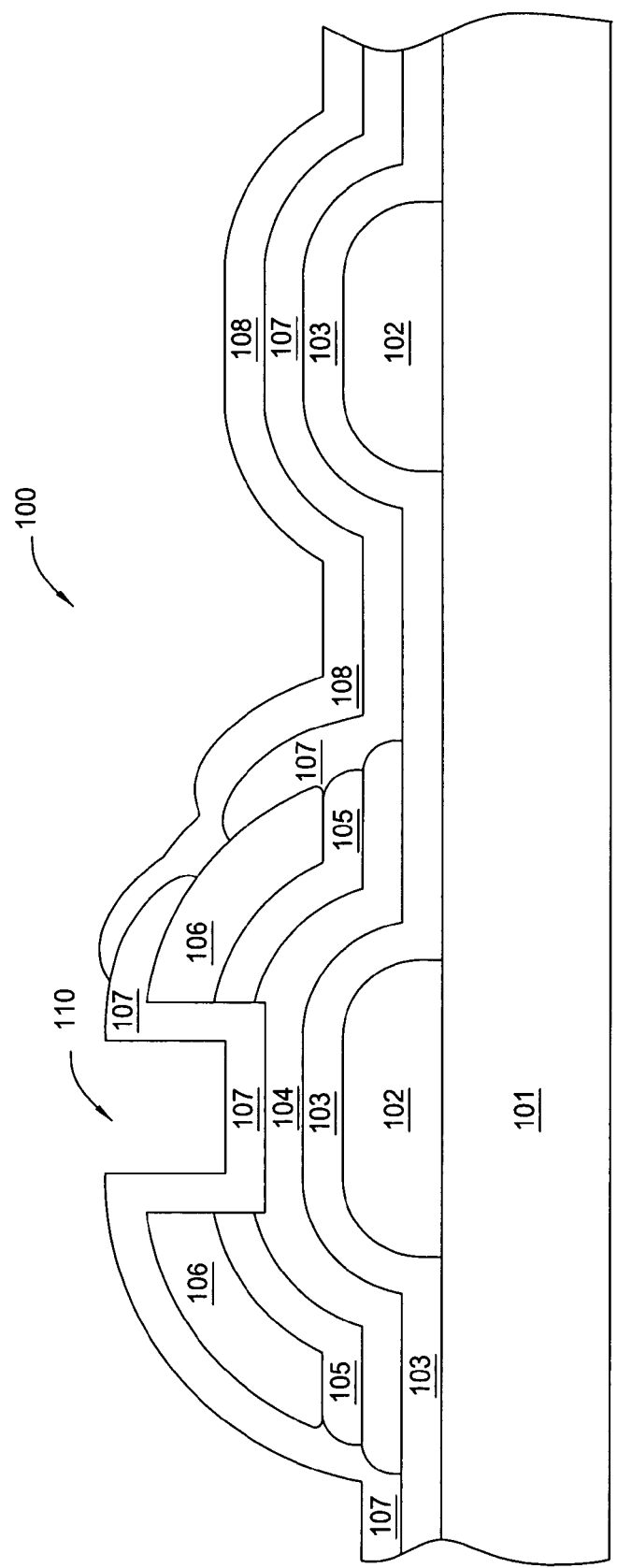
FIG. 3B depicts a cross-sectional schematic view of an exemplary bottom gate thin film transistor fabricated using methods of the invention.

FIG. 3B depicts one embodiment of the film stack formed by the method 300 of the invention, such as a bottom gate thin film transistor (TFT) having a back channel etch (BCE) inverted staggered structure formed on a substrate 101. For flat panel display application, the substrate 101 may comprise a material that is essentially optically transparent in the visible spectrum, for example glass or clear plastic. The substrate may be of varying shapes or dimensions. For example, for thin film transistors applications, the substrate may be a large area glass substrate having a high degree of optical transparency with a surface area greater than about 500 mm². However, the invention is equally applicable to substrate processing of any types and sizes. Substrates of the invention can be circular, square, rectangular, or polygonal for semiconductor wafer manufacturing and flat panel display manufacturing.

The surface area of a rectangular substrate for flat panel display is typically large, for example, a rectangle of about 500 mm² or larger, such as at least about 300 mm by about 400 mm, e.g., about 120,000 mm² or larger. In addition, the invention applies to any devices, such as flat panel display (FPD), organic light emitting diode (OLED) displays, flexible organic light emitting diode (FOLED) display, polymer light emitting diode (PLED) display, liquid crystal displays (LCD), organic thin film transistor, active matrix, passive matrix, top emission device, bottom emission device, solar cell, solar panel, etc., and can be on any of the silicon wafers, glass substrates, metal substrates, plastic films (e.g., polyethylene terephthalate (PET), polyethylene naphthalate (PEN), etc.), plastic epoxy films, among others.

A gate electrode layer 102 is deposited and patterned on the surface of the substrate 101. The gate electrode layer 102 may include an electrically conductive material, such as a metal material, for example, aluminum (Al), molybdenum (Mo), neodymium (Nd), aluminum neodymium (AlNd), tungsten (W), chromium (Cr), tantalum (Ta), titanium (Ti), copper (Cu), aluminum nitride ($Al_xN_y$), molybdenum nitride ($Mo_xN_y$), tantalum nitride (TaN), titanium nitride (TiN), other metal nitrides, their alloys, and combinations thereof, among others, to control the movement of charge carriers within the thin film transistor. The gate electrode layer 102 may be formed using an embodiment of a substrate processing system described in this invention by a deposition technique, such as PVD, CVD, among others. The thickness of the gate electrode layer 102 is not limiting and may range from about 100 Å to about 3000 Å. Between the substrate 101 and the gate electrode layer 102, there may be an optional layer of an insulating material, such as silicon dioxide ($SiO_2$), silicon nitride (SiN), which can be formed using an embodiment of a substrate processing system described herein. The gate electrode layer 102 is then applied with a layer of photoresist, lithographically patterned, and etched to define the gate electrode.

The film stack further includes one or more silicon-containing layers, for example, a gate insulation layer 103 and a semiconductive layer formed over the gate electrode layer 102. In one embodiment, the semiconductive layer in the film stack includes one or more silicon-containing layers. For example, in the embodiment depicted in FIG. 3B, a bulk semiconductor layer 104 and a doped semiconductor layer 105 are formed on the gate insulation layer 103. The doped semiconductor layer 105 directly contacts portions of the bulk semiconductor layer 104, forming a semiconductor junction.

The gate insulation layer 103 may include a dielectric material, such as silicon nitride (SiN), silicon oxynitride (SiON), silicon dioxide ($SiO_2$), among others, deposited using an embodiment of a substrate processing system described in this invention. The gate insulation layer 103, which also serves as storage capacitor dielectric, may be formed to a thickness in the range of about 100 Å to about 6000 Å. One example of the gate insulation layer 103 is a silicon nitride film deposited by a CVD process chamber of the substrate processing system of the invention.

The bulk semiconductor layer 104 may comprise amorphous silicon (α-Si), polycrystalline silicon (polysilicon), silicon dioxide ($SiO_2$), and other silicon materials, which are deposited using an embodiment of a substrate processing system described herein. The bulk semiconductor layer 104 may be deposited to a thickness in the range of about 100 Å to about 3000 Å. One example of the bulk semiconductor layer 104 is an α-Si film deposited by a CVD process chamber of the substrate processing system of the invention.

The doped semiconductor layer 105 formed on top of the semiconductor layer 104 may comprise n-type (n+) amorphous silicon (α-Si), doped p-type (p+) doped amorphous silicon (α-Si), n+ doped polycrystalline (polysilicon), p+ polycrystalline (polysilicon), among others, which could be deposited using an embodiment of a substrate processing system described herein. The doped semiconductor layer 105 may be deposited to a thickness within a range of about 100 Å to about 3000 Å. One example of the doped semiconductor layer 105 is a n+ doped α-Si film deposited by a CVD process chamber of the substrate processing system of the invention.

Prior art methods requires the bulk semiconductor layer 104 and the doped semiconductor layer 105 are lithographically patterned and etched using conventional techniques to define a mesa of these two films over the gate insulation layer 103 before a conductive layer 106 is deposited on the exposed surface of these silicon-containing semiconductor layers.

Using the method 300 of the invention, one or more fabrication steps can be eliminated. The substrate 101 having the exposed surface of these silicon-containing semiconductor layers on the film stack is processed immediately in situ (i.e., without removal of the substrate 101 from the substrate processing system of the invention) to deposit the conductive layer 106. In the vacuum environment of the same substrate processing system, oxidation of the exposed surface of these silicon-containing semiconductor layers is unlikely and there is no need to clean the substrate surface.

The conductive layer 106 may comprise a metal material, for example, aluminum (Al), molybdenum (Mo), neodymium (Nd), aluminum neodymium (AlNd), tungsten (W), chromium (Cr), tantalum (Ta), titanium (Ti), copper (Cu), aluminum nitride ($Al_xN_y$), molybdenum nitride ($Mo_xN_y$), tantalum nitride (TaN), titanium nitride (TiN), other metal nitrides, their alloys, and combinations thereof, among others. The conductive layer 106 may be formed using CVD, PVD, and other deposition techniques. In one embodiment, the conductive layer 106 is formed by a PVD process chamber of the substrate processing system of the invention. The conductive layer 106 may be deposited to a thickness within a range of about 100 Å to about 6000 Å.

As described previously at step 330 of the method 300, the invention provides that, after the conductive layer 105 is formed, the conductive layer 106 and one or more underlying semiconductor layers, e.g., the bulk semiconductor layer 104 and the doped semiconductor layer 105, may be lithographically patterned to define source and drain contacts of the TFT. The invention also provides patterning the film stack of the invention and etching an upper metal layer and/or one or more underlying silicon-containing layers without removing the substrate from the substrate processing system when additional process chambers are installed for additional deposition, lithography, etching, photoresist ashing, and other steps such that, for example, channel 110 can be formed in active regions between the source and drain contacts.

As also shown in FIG. 3B, a passivation layer 107 may be deposited to conformably coats exposed surfaces of the film stack and over the channel 110 and the source and drain contacts of the TFT. The passivation layer 107 is generally an insulator and may comprise a dielectric material, for example, silicon dioxide ($SiO_2$), silicon nitride (SiN), among others. The passivation layer 107 may be formed using, for example, PECVD and other deposition process. The passivation layer 107 may be deposited to a thickness of about 100 Å or larger, such as in the range of about 1000 Å to about 5000 Å. The passivation layer 107 is then lithographically patterned and etched using conventional techniques to open contact holes in the passivation layer 107.

A transparent conductor layer 108 is then deposited and patterned to make contacts with the conductive layer 106. The transparent conductor layer 108 comprises a material that is essentially optically transparent in the visible spectrum and is electrically conductive. The transparent conductor layer 108 may comprise, for example, indium tin oxide (ITO) or zinc oxide, among others. Patterning of the transparent conductive layer 108 is accomplished by conventional lithographical and etching techniques.

In the film stack of the exemplary TFT device as shown in FIG. 3B, any of the metal, doped or un-doped (intrinsic) silicon-containing materials, doped or un-doped amorphous silicon (α-Si), doped or un-doped polysilicon, silicon nitride (SiN), silicon dioxide (SiO2), silicon oxynitride (SiON) films used in liquid crystal displays (or flat panels) can all be deposited using an embodiment of a substrate processing system having at least one CVD chamber and at least one PVD chamber, such as one or more plasma enhanced chemical vapor deposition (PECVD) and physical vapor deposition (PVD) chambers coupled to the same substrate processing system, which will be further described in detail below. In one embodiment, a TFT structure formed by the back channel etch (BCE) fabrication sequence is preferred, because the gate dielectric (SiN), and the intrinsic amorphous silicon as well as n+ doped amorphous silicon films can be deposited in the same PECVD pump-down run. The film stack using the BCE process as described here involves only 4 patterning masks.

FIGS. 4A-9 are top plan views of exemplary substrate processing systems 400A, 400B, 500, 600A, 600B, 700, 800A, 800B, 900 suitable for processing different types of metal and silicon-containing films on a substrate 422 using various deposition techniques according to embodiments of the invention. The substrate processing systems 400A, 400B, 500, 600A, 600B, 700, 800A, 800B, 900 typically include a transfer chamber 408 or two transfer chambers 408A, 408B coupled to a factory interface 402 via a load lock chamber 404.

The factory interface 402 generally includes one or more substrates stored therein or substrate storage cassettes. The substrate storage cassettes are typically removably disposed in a plurality of storage bays/compartment formed inside the factory interface 402. The factory interface 402 may also include an atmospheric robot, such as a dual blade atmospheric robot. The atmospheric robot is adapted to transfer one or more substrates between the one or more substrate storage cassettes and the load lock chamber 404. Typically, the factory interface 402 is maintained at or slightly above atmospheric pressure and the load lock chamber 404 is disposed to facilitate substrate transfer between a vacuum environment of the transfer chamber 408 and a generally ambient environment of the factory interface 402.

The transfer chamber 408, 408A or 408B (generally 408) is adapted to transfer substrates among a plurality of process chambers 410, 410A, 412, 414, 416, 418, 420 and one or more load lock chambers 404, 406 such that the transfer chamber 408, 408A, or 408B is surrounded by one or more process chambers 410, 410A, 412, 414, 416, 418, 420 and one or more load lock chambers 404, 406. The transfer chamber 408 is maintained at a vacuum condition to eliminate or minimize pressure differences between the transfer chamber 408 and the individual process chambers 410, 410A, 412, 414, 416, 418, 420 after each substrate transfer.

According to one aspect of the invention, the substrate processing systems 400A, 400B, 500, 600A, 600B, 700, 800A, 800B, 900 generally include a first process module 450 and a second process module 460. In one embodiment, the first process module 450 is configured to support substrate processing of a specific type of films and the second process module 460 is configured to support substrate processing of a different type of films. For example, the first process module 450 can be used to process one or more silicon-containing films and the second process module 460 can be used to process one or more metal-containing films to facilitate in-situ processing of these two types of films with reduced numbers of cluster tools, fabrication footprint, and utility requirement.

In another embodiment, the first process module 450 is adapted to include a specific type of process chambers and the second process module 460 is adapted to include a different type of process chambers. For example, the first process module 450 may include one or more CVD chambers. As another example, the second process module 460 may include one or more PVD chambers. The invention contemplates coupling other types of process chambers to the first process module 450 and the second process module 460, such as PVD, ion metal implant (IMP), CVD, atomic layer deposition (ALD), plasma etching, annealing, cleaning, and other furnace chambers, etc.

The invention provides the use of the first process module 450 and the second process module 460 in a single substrate processing system to greatly enhance the throughput of the substrate processing system, generally represented by enhanced TACT time (Total Actual Cycle Time, the time period required for a substrate to be processed/cycled inside a tool, e.g., seconds/substrate) or enhanced numbers of substrates that a process tool can handled in a hour (numbers of substrates/hour). For example, the TACT time for the substrate processing systems 400A, 400B, 500, 600A, 600B, 700, 800A, 800B, 900 of the inventions is about 15 substrates per hour or larger, such as about 24 substrates per hour or even about 30 substrates per hour for a in-situ deposition process containing at least three layers of silicon-containing materials and one or more layers of metal-containing materials.

Figure 4A:
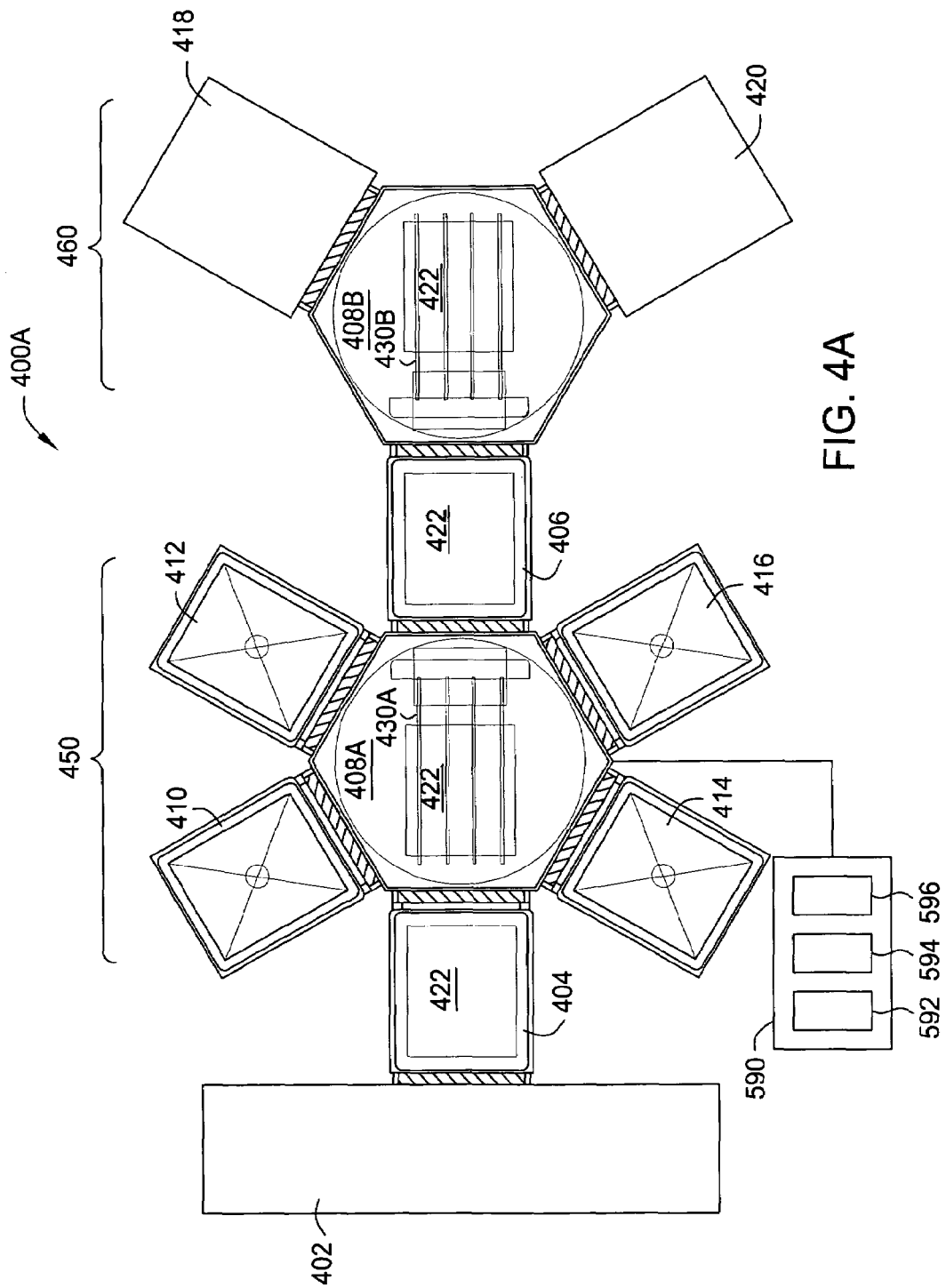
FIG. 4A is a plan view of an exemplary cluster tool configured for in-situ processing of a film stack according to one embodiment of the invention.

In the embodiment of FIG. 4A, the first process module 450 is coupled to a first transfer chamber, e.g., the transfer chamber 408A, to receive the substrate 422 being loaded into the first process module 450 from a first load lock chamber, e.g., the load lock chamber 404, of the substrate processing system 400A. The first process module 450 is coupled to the second process module 460 via a second load lock chamber, such as the load lock chamber 406, positioned in between the first process module 450 and the second process module 460.

In the exemplary configuration of FIG. 4A, the substrate 422 can be transferred within the first process module 450 among one or more process chambers 410, 412, 414, 416. In one embodiment, at least one of the process chambers 410, 412, 414, 416 is a CVD chamber. Preferably, the CVD chamber is configured for depositing a silicon-containing material on a substrate.

In addition, the substrate 422 is transferred in-between the first process module 450 and the second process module 460 using the first transfer chamber (e.g., the first transfer chamber 408A) and the second load lock chamber (e.g., the load lock chamber 406). The second process module 460 is configured to receive the substrate 422 from the second load lock chamber, such as the load lock chamber 406, coupled thereto. The substrate 422 received in the second process module 460 is processed by transferring through the second load lock chamber to one or more process chambers 418, 420 using a second transfer chamber, e.g., the second transfer chamber 408B.

Further, the substrate 422 can also be transferred within the second process module 460 among one or more process chambers 418, 420. In one embodiment, at least one of the process chambers 418, 420, and any additional process chambers coupled to the second transfer chamber 408B is a PVD chamber. Preferably, the PVD chamber is configured for depositing a metal-containing material on a substrate.

A transfer robot 430, 430A, 430B (generally, 430), such as a dual arm vacuum robot available from Applied Materials, Inc., can be coupled to the transfer chamber 408 for moving the substrate 422. For example, in FIG. 4A, a first transfer robot 430A and a second transfer robot 430B are coupled to the first and second transfer chamber 408A, 408B, respectively. Accordingly, in FIG. 4A, the first transfer robot 430A is configured to be rotably movable among the first load lock chamber, the first process module 450, and the second load lock chamber, whereas the second transfer robot 430B is configured to be rotably movable among the second load lock chamber and the one or more process chambers of the second process module 460. Additional process chambers, such as etching chambers, ashing chambers, ion implant chambers, heating chambers, among others, can also be coupled to the second transfer chamber 408B to perform additional processes on the substrate 422 after being processed by the second process module 460.

As shown in FIG. 4A, the substrate 422 processed by the substrate processing system 400A can be flowed through from the factory interface 402 to the first process module 450 via the first load lock chamber 404 for processing of a fabrication sequence on the substrate 422. Further, the substrate 422 processed by the first process module 450 can be flowed through from the first process module 450 to the second process module 460 via the second load lock chamber 406 such that the substrate are flowed through in-between different type of processes performed by the two process modules to integrate an in-situ compact fabrication sequence, such as the method 300 of the invention. The load lock chambers, 404, 406 provides a good buffer station for flowing the substrate 422 in a specific timely manner as may be needed during an in-situ integrated fabrication sequence.

Further, the use of the second load lock chamber provides a reliable substrate processing system, high substrate processing throughput, substrate flow through between different types of process chambers and process modules, and a vacuum buffer region between different types of process chambers and process modules. For example, the vacuum pressure requirements for different types of process chambers and process modules may be different (e.g., a PVD process may need to be at a lower vacuum pressure level, thus, a higher degree of vacuum, than a CVD process).

As an example, various vacuum pressure levels of the substrate processing system of the invention can be controlled in part by opening one valve positioned on one side of the second load lock chamber and connected to the first process module or the first transfer chamber while closing the other valve positioned on the other side of the second load lock chamber connected to the first process module or the first transfer chamber. As another example, one or more valves are configured to be positioned in between the process chambers 410, 412, 414, 416, 418, 420 and the transfer chamber for maintaining various pressure levels required for the process chambers. Preferably, various valves used in various parts of the substrate processing systems of the invention are vacuum sealable valves, such as slit valves, gate valves, slot valves, etc. For example, the first load lock chamber may include internal or external vacuum sealable valves for maintaining a low pressure level after the substrate is loaded into and from the atmospheric environment of the factory interface 402. In addition, the valves may be coupled to an internal or external actuator for opening and closing.

In addition, the use of the first transfer chamber 408A, the second transfer chamber 408B, and the second load lock chamber in the substrate processing system 400A provides different vacuum pressure levels or staged vacuum levels such that different types of pumps, such as a dry pump, a roughing pump, a turbo pump, and a cryogenic pump, among others, can be used to save equipment cost, lifetime, and maintenance. For example, the first transfer chamber 408A, the second transfer chamber 408B, and/or the second load lock chamber 406 can be kept in an intermediate vacuum environment using a less expensive pump, such as a regular dry pump or a shared pump coupled to various chambers, while the process chambers can be kept in a highly vacuum environment using a more expensive pump, such as a cryogenic pump.

Figure 4B:
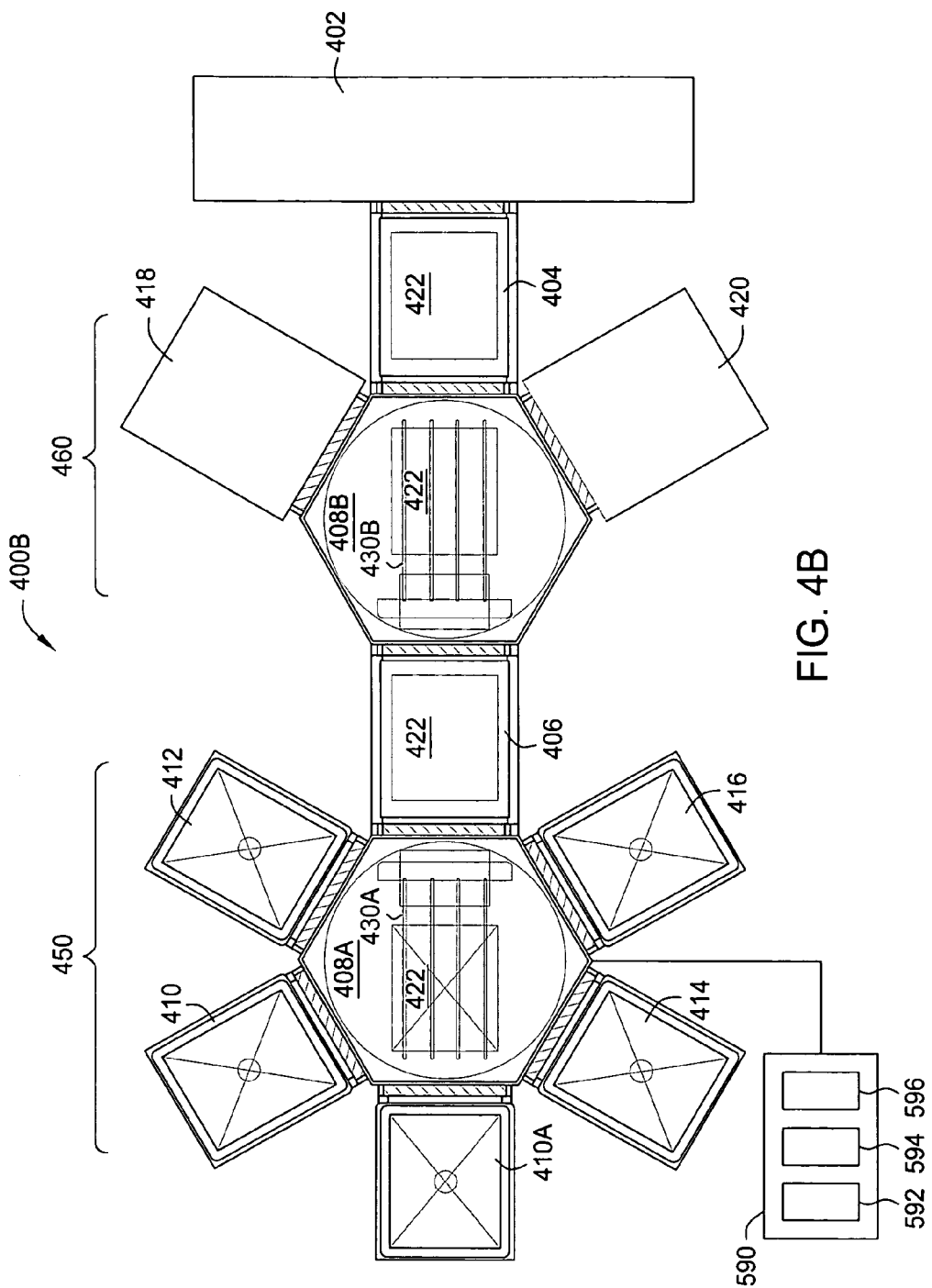
FIG. 4B is a plan view of an exemplary cluster tool configured for in-situ processing of a film stack according to another embodiment of the invention

In the embodiment of FIG. 4B, the substrate processing system 400B similar to the substrate processing systems 400A is provided. In FIG. 4B, the first load lock chamber 404 is coupled to the second process module 460 such that the substrate 422 to be processed is first loaded onto the load lock chamber 404, transferred through the second transfer chamber 408B of the second process module 460, and placed onto the second load lock chamber 406 using the second transfer robot 430B. All of these steps may not affect too much of the throughput of the substrate processing system 400B, since the same amount of time for flowing though, into and out of the two process modules is need as the substrate processing systems 400A.

After transferring through the second transfer chamber 408B and the second load lock chamber 406, and into the first transfer chamber 408A, the substrate 422 is transferred by the first transfer robot 430A into one or more process chambers of the first process module 450 for one or more layers to be deposited on the substrate 422. Then, the substrate 422 is transferred through the second load lock chamber 406, back to the second transfer chamber 408B to be delivered by the first transfer robot 430A into the one or more process chambers of the second process module 460.

In addition, flexible substrate processing sequences can by applied to the two substrate processing system 400A and 400B. For example, a substrate can be processed in the first process module and then the second process module though loading and unloading the substrate via the load lock chamber coupled to the first process module as shown in FIG. 4A or, alternatively, via the load lock chamber coupled to the second process module as shown in FIG. 4B. Alternatively, a substrate can be first processed in the second process module, then in the first process module, and/or in the second process module.

Referring back to FIG. 4B, the substrate processing system 400B different from the substrate processing systems 400A in that additional process chamber 410A can be configured and positioned inside the first process module 450 to increase system throughput for handling more substrates therein. For example, a throughput increase of at least about sixty (60) substrates per hour per chamber for a single-layer deposition can be obtained. As another example, the process chamber 410A can be used to assist deposition of multiple silicon-containing material layers of a thin film transistor structure as described in the method 300 of the invention and a throughput increase of at least about five (5) substrates per hour per chamber for a three-layer deposition can be obtained.

In operation, according to one or more embodiments of the invention, a method of processing a substrate in a system, for example, the substrate processing system 400B of the invention, is provided to transfer the substrate through various different transfer chambers, load lock chambers, process modules before placing the substrate onto one or more process chambers. The method provides flexible chamber configuration for a hybrid substrate processing system. In addition, the first and the second transfer chambers and the first and the second process modules in FIG. 4B are relative term and should not construed to limit the scope of the invention.

For example, a substrate processing method of the invention may include loading the substrate into a first load lock chamber of a substrate processing system, transferring the substrate from the first load lock chamber through a first transfer chamber into a second transfer chamber, and transferring the substrate from the second transfer chamber into one or more process chambers of a first process module of the substrate processing system. The method includes depositing one or more material layers using the one or more process chambers of the first process module, for example, depositing one or more silicon-containing layers on the substrate by one or more chemical vapor deposition chambers of the substrate processing system.

In addition, the method may also includes transferring the substrate from the one or more process chambers of a first process module into the second transfer chamber, transferring the substrate from the second transfer chamber into the first transfer chamber, and transferring the substrate form the second transfer chamber into one or more process chamber of a second process module of the same substrate processing system without breaking any vacuum and depositing one or more material layers using the one or more process chamber of the second process module. For example, one or more metal-containing layers are deposited on the surface of the one or more silicon-containing layers using one or more physical vapor chambers of the substrate processing system of the invention.

Further, the method includes transferring the substrate from the one or more process chamber of the second process module back into the first load lock chamber without going through the second transfer chamber, and unloading the substrate from the first load lock chamber of the substrate processing system.

Figure 5:
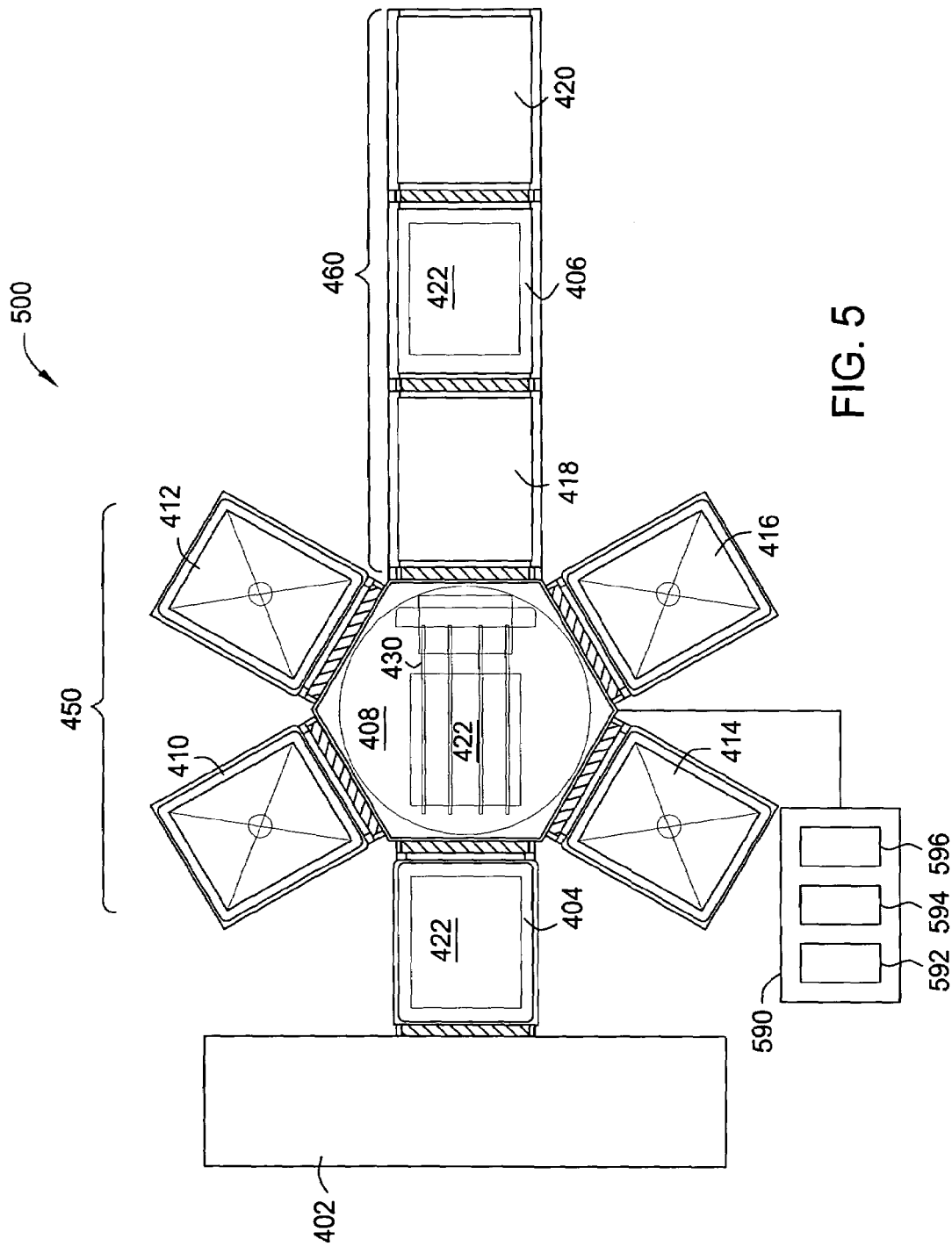
FIG. 5 is a plan view of an exemplary cluster tool configured for in-situ processing of a film stack according to another embodiment of the invention.

In the embodiment of FIG. 5, the first process module 450 is coupled to the second process module 460 via a transfer chamber, such as the transfer chamber 408, which is directly coupled to one process chamber of the second process module 460, such as the process chamber 418. Using only one transfer chamber, such as the transfer chamber 408, the substrate 422 is transferred to one or more process chambers 410, 412, 414, 416 of the first process module 450 and in between the first process module 450 and the second process module 460 in a compact and reduced footprint.

In FIG. 5, the second process module 460 is configured to receive the substrate 422 from the transfer chamber 408 coupled to at least one of the second process chambers, directly to a process chamber, such as the process chamber 418, rather than a load lock chamber, an intermediate/buffer chamber, a transfer/shuttle chamber or other compartments. Thus, there is no need for a bulky transfer chamber positioned in the second process module 460 in order to reduce the footprint of the substrate processing system 500.

The substrate 422 received in the second process module 460 and being processed by the at least one of the process chambers of the second process module 460 to deposit at least a layer on the substrate may optionally be transferred in between the process chambers of the second process module 460 for additional multi-layer deposition. For example, via a second load lock chamber 406 or a shuttle chamber 426 which can be positioned in-between the one or more process chambers of the second module 460, such as between the process chambers 418, 420. The location of the second load lock chamber 406 in FIG. 5 can be configured to position a load lock chamber, a small size transfer chamber, a transfer shuttle chamber, or other suitable chambers in order to reduce the footprint of the substrate processing system 500.

In FIG. 5, the load lock chamber 406 and/or the shuttle chamber 426 adapted to be installed in the substrate processing system 500 may generally include one or more substrate transfer shuttles 1600 therein. For example, the load lock chamber 406 and/or the shuttle chamber 426 included in the substrate processing system 500 are configured to handle and transfer the substrate 422 in one linear movement between the process chambers 418, 420. The load lock chamber 406 and/or the shuttle chamber 426 may generally include one or more substrate transfer shuttles 1600 coupled therein in various configurations (as described in detail in FIGS. 10, 11, 12, 16, 17A, and 17B), such that the one or more substrate transfer shuttles 1600 can be further coupled to the one or more process chambers 418, 420 of the second process module 460 according to various embodiments of the invention.

Accordingly, in FIG. 5, the transfer chamber 408 is rotably movable among the first load lock chamber (e.g., the load lock chamber 404), the first process module 450, and the second process module 460 for transferring the substrate 422, whereas the substrate 422 is linearly movable among one or more process chambers of the second process module 460 using the second load lock chamber (e.g., the load lock chamber 406) and/or the shuttle chamber 426. Additional process chambers, such as etching chambers, ashing chambers, ion implant chambers, heating chambers, among others, can also be coupled linearly to the second process module 460 to perform additional processes on the substrate 422 after being processed by the second process module 460.

In the exemplary configuration of FIG. 5, there is no flow through of the substrate 422 processed by the first process module 450, since the substrate 422 may be transferred back to the load lock chamber 404 of the substrate processing system 500 to be unloaded to the factory interface 402 or transferred directly to the process chambers of the second process module, such that there is no staged buffer station between the first process module 450 and the second process module 460 or any vacuum buffer from the transfer chamber 408 to the process chamber 418 of the second process module 460.

Figure 6A:
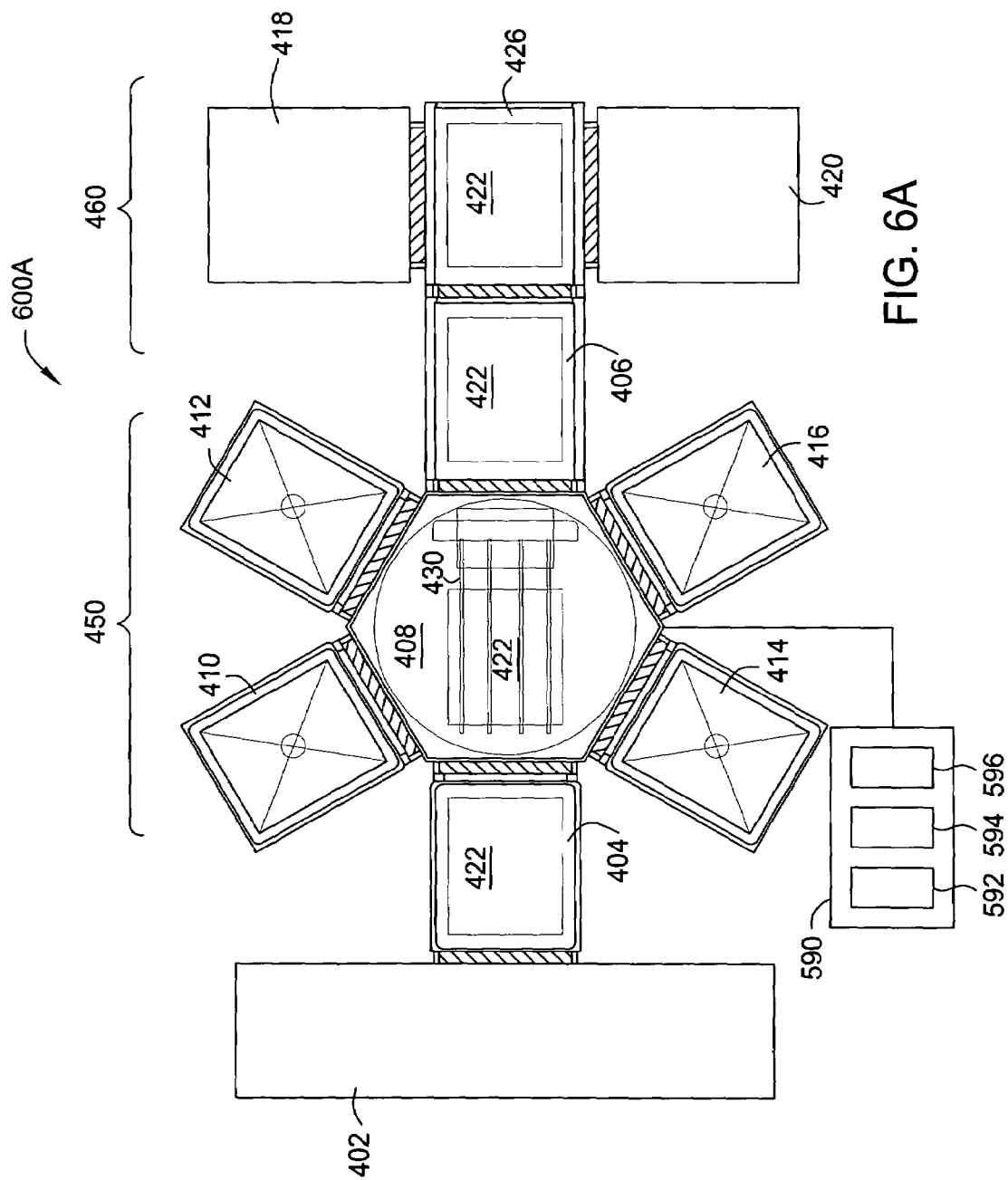
FIG. 6A is a plan view of an exemplary cluster tool configured for in-situ processing of a film stack according to still another embodiment of the invention.

In the embodiment of FIG. 6A, the first process module 450 is coupled to a first transfer chamber, e.g.; the transfer chamber 408, to receive the substrate 422 being loaded into the first process module 450 from a first load lock chamber, e.g., the load lock chamber 404, of the substrate processing system 600A. The first process module 450 is coupled to the second process module 460 via a second load lock chamber positioned in between the first process module 450 and the second process module 460, such as the load lock chamber 406. Accordingly, using only one transfer chamber, the transfer chamber 408, the substrate 422 is transferred to one or more process chambers 410, 412, 414, 416 positioned in the first process module 450. In addition, using the transfer chamber 408 and the second load lock chamber (e.g., the load lock chamber 406), the substrate 422 can be transferred in between the first process module 450 and the second process module 460.

In the exemplary configuration of FIG. 6A, the second process module 460 is configured to receive the substrate 422 from the load lock chamber 406 coupled thereto. In order to reduce the footprint of the substrate processing system 600 and save space, a bulky second transfer chamber, e.g., the transfer chamber 408B, is eliminated and the shuttle chamber 426 is included to provide loading and unloading the substrate 422 into and out of the one or more process chambers within the second process module 460, e.g., the process chambers 418, 420, and in the right orientation. In one embodiment, one or more substrate transfer shuttles 1600 and the like (as described in detail in FIGS. 16-20) are configured inside the shuttle chamber 426 and also coupled to the load lock chamber 406 and/or the process chambers of the second process module 460 in various configurations.

As shown in FIG. 6A, the shuttle chamber 426 coupled to the second process module 460 is necessary to be used to transfer the substrate 422 between the second load lock chamber 406 and one or more process chambers 418, 420 since the process chambers may not be able to be coupled directly to the load lock chambers due to space constraint. In addition, when the substrate 422 is rectangle in shape, the orientation of the substrate 422 need to be changed in a 90 degree angle from the load lock chamber 406 into the process chambers 418, 420 before processing, or from the process chamber 418, 420 into the load lock chamber 406 after processing. The shuttle chamber 426 and the one or more substrate transfer shuttles 1600 therein can also provide shuttling of the substrate 422 among the process chambers of the second process module 460, such as between the process chambers 418, 420, for a single-layer, two-layer, three-layer or other deposition process within the second process module 460.

Accordingly, in the substrate processing system 600A of FIG. 6A, the transfer robot 430 positioned within the transfer chamber 408 and the substrate 422 to be transferred by the transfer robot 430 can be rotably movable among the first load lock chamber, the first process module, and the second load lock chamber, whereas the substrate 422 processed within the second process module 460 is linearly movable among the process chambers, the second load lock chamber (e.g., the load lock chamber 406), and the shuttle chamber 426, using, for example, the substrate transfer shuttles 1600. The shuttle chamber 426 is adapted to quickly shuffle the substrate 422 into and out of the second process module by providing rotational change of the orientations of the substrate 422 in a compact configuration. Additional process chambers, such as etching chambers, ashing chambers, ion implant chambers, heating chambers, among others, can also be coupled linearly to the second process module 460 to perform additional processes on the substrate 422 after being processed by the second process module 460.

Further, the use of the second load lock chamber in FIG. 6A provides a vacuum buffer region between different types of process chambers and process modules, which may require different vacuum pressure levels. Using various vacuum sealable valves and pumps, various intermediate vacuum levels and highly vacuum levels can be obtained. In addition, the use of the transfer chamber 408 and the second load lock chamber in the substrate processing system 600A provides different vacuum pressure levels therein to save cost. For example, the transfer chamber 408, the load lock chamber 406, and/or the shuttle chamber 426 can be kept in an intermediate vacuum environment using a less expensive pump or a shared pump, while the process chambers can be kept in a highly vacuum environment using a more expensive pump.

The substrate 422 processed by the substrate processing system 600A can be flowed from the factory interface 402 to the first process module 450 via the first load lock chamber 404, and through the first process module 450 to the second process module 460 via the second load lock chamber 406. This is important and enables timing of different processes when multiple substrates are processed in different process modules, such that one or more substrates can be processed at the same time inside the substrate processing systems of the invention.

Figure 6B:
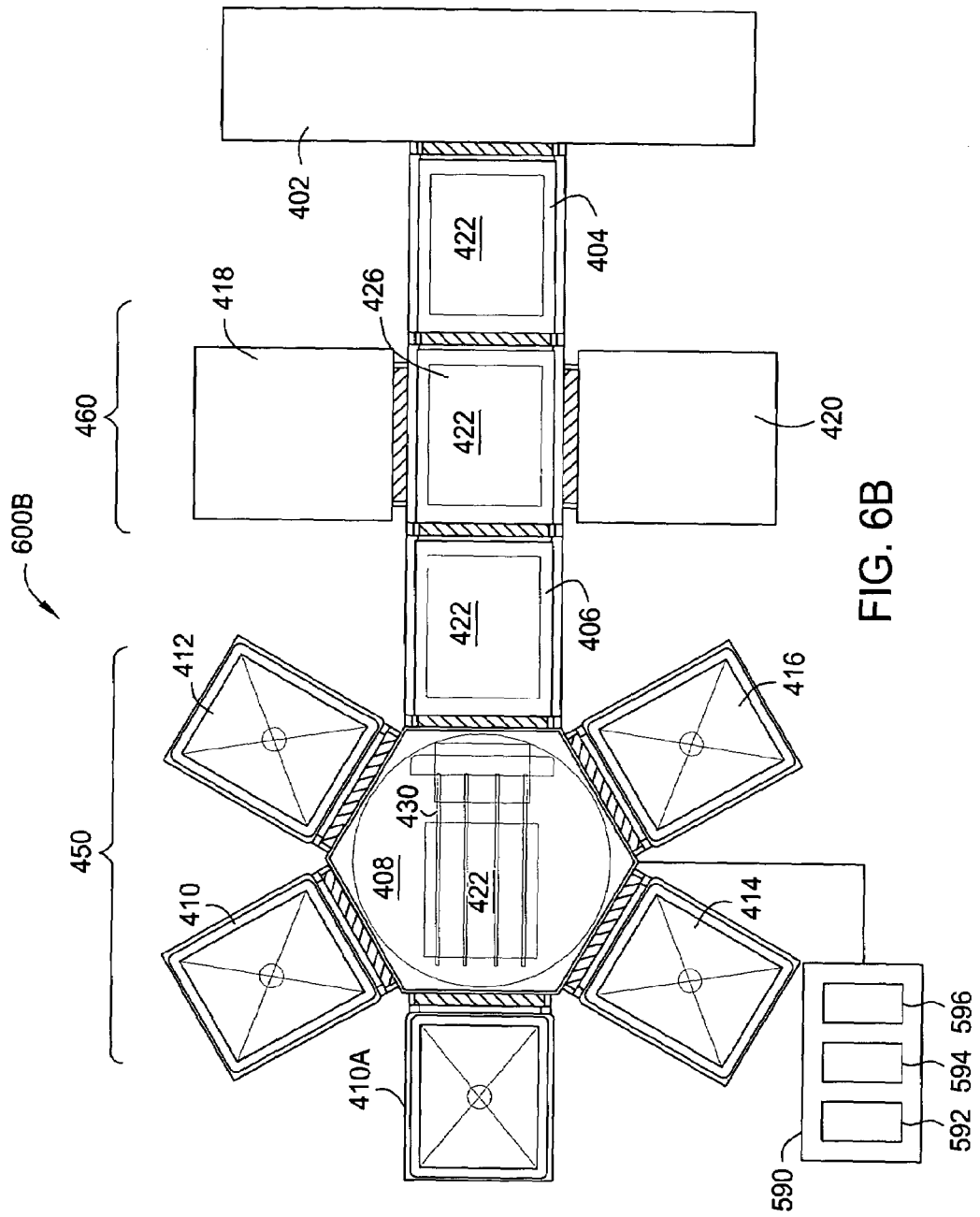
FIG. 6B is a plan view of an exemplary cluster tool configured for in-situ processing of a film stack according to another embodiment of the invention

In the embodiment of FIG. 6B, the substrate processing system 600B is configured similar to the substrate processing system 600A, where the first load lock chamber is coupled to the second process module 460 instead of the first process module 450. Flexible and varied substrate processing sequences can be applied using the substrate processing system 600B for processing a substrate in the first process module and then the second process module or vice versa. In addition, the substrate processing system 600B provides higher substrate processing throughput than the substrate processing system 600A for a given substrate fabrication process. Additional process chamber 410A can be configured and coupled to the substrate processing system 600B to increase throughput.

Figure 7:
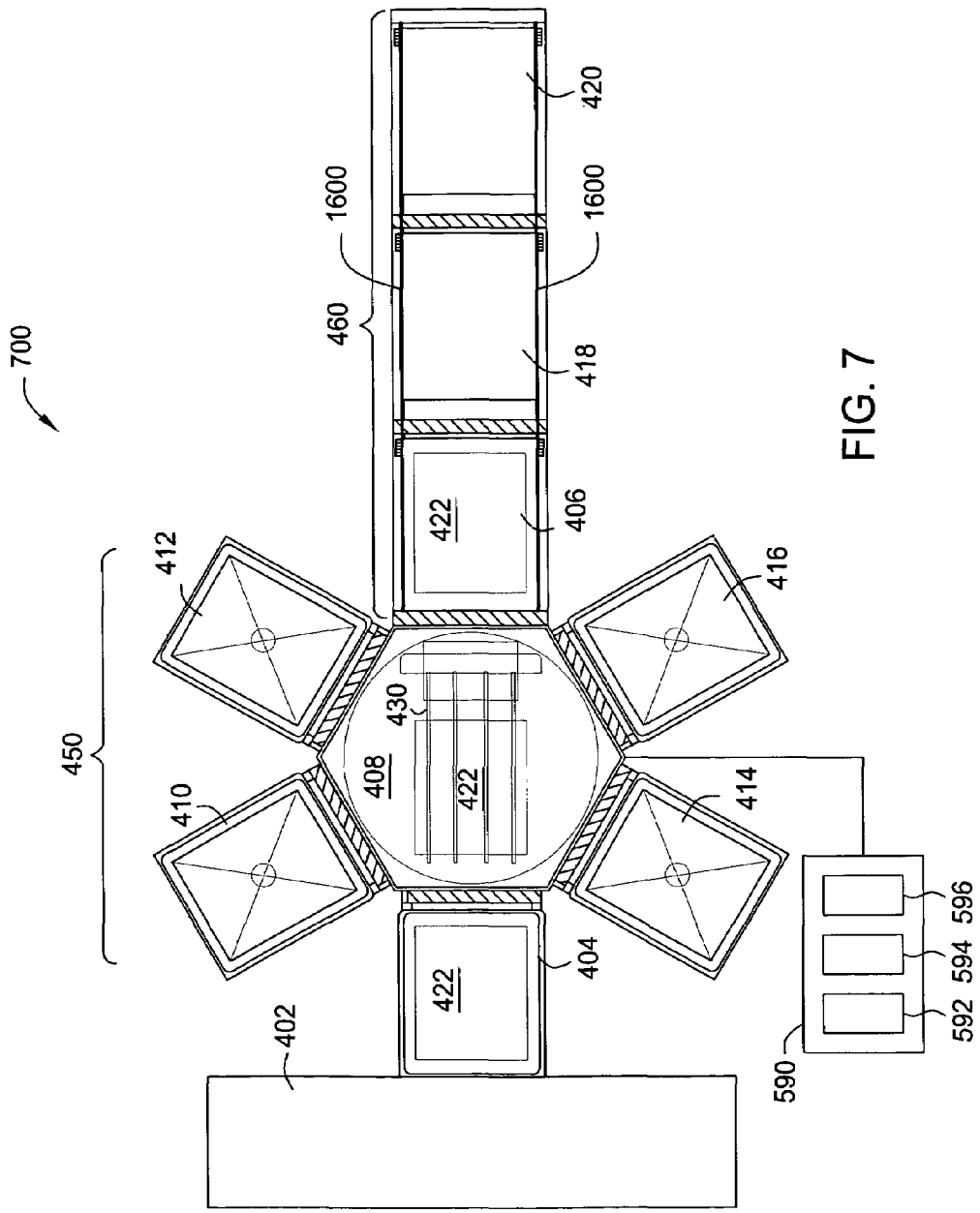
FIG. 7 is a plan view of an exemplary cluster tool configured for in-situ processing of a film stack according to a further embodiment of the invention.

In the embodiment of FIG. 7, the first process module 450 is coupled to a transfer chamber, e.g., the transfer chamber 408, to receive the substrate 422 being loaded into the first process module 450 from a first load lock chamber, e.g., the load lock chamber 404, of the substrate processing system 700. The first process module 450 is coupled to the second process module 460 via a second load lock chamber, such as the load lock chamber 406, positioned in between the first process module 450 and the second process module 460.

In the exemplary configuration of FIG. 7, the substrate 422 is transferred to one or more process chambers 410, 412, 414, 416 of the first process module 450 and in between the first process module 450 and the second process module 460 using the transfer chamber 408 and the second load lock chamber (e.g., the load lock chamber 406). The use of the second load lock chamber in FIG. 7 provides a vacuum buffer region, thus a different vacuum pressure level, between different types of process chambers for the first process module 450 and the second process module 460. For example, the transfer chamber 408 and/or the load lock chamber 406 can be kept in an intermediate vacuum environment while the process chambers in the process modules can be kept in a highly vacuum environment.

The substrate processing system 700 differs from other substrate processing systems of the invention in which no second transfer chamber or shuttle chamber is included in the second process module 460 such that the substrate 422 is processed in the second process module by linearly moving in and out one or more of the process chambers 418, 420 of the second process module 460. As shown in the example of FIG. 7, the process chambers 418, 420 and other additional process chambers in the second process module 460 are configured in a linear direction and the substrate 422 being processed is transferred by one or more substrate transfer shuttles 1600 positioned in the second process module 460 within the substrate processing system 700 for directly moving the substrate among one or more process chambers of the second process module 460, such as the process chambers 418, 420. Accordingly, compact in-situ fabrication of the substrate 422 can be performed in a reduced footprint of the substrate processing system 700. The one or more substrate transfer shuttles 1600 may also be coupled to the load lock chamber 406 for transferring the substrate 422 in-and-out and in-between the process chambers of the second process module 460. In addition, one-layer, two-layer, three-layer deposition sequences using the process chambers 418, 420 (and additional process chambers coupled thereto) are contemplated by the inventors to be flexibly applied to the substrate processing system 700.

Further, the substrate processing system 700 is still able to provide flowing of multiple substrates from the factory interface 402 through one or more process chambers of the first process module 450 and through the second process module 460 via the load lock chambers 404 and 406. The substrate 422 received in the second process module 460 is processed by moving among one or more process chambers 418, 420, and additional process chambers, such as etching chambers, ashing chambers, ion implant chambers, heating chambers, among others, can also be coupled to the second process module linearly or side ways to perform additional processes on the substrate 422 by the second process module 460.

The use of the one or more substrate transfer shuttles 1600 in the substrate processing system 700 provides a reliable substrate processing system kept in the same vacuum environment of the process chambers of the second process module 460 and in high substrate processing throughput without the need to load and reload to an additional transfer chamber and additional pump down time required for maintaining the vacuum environment of the transfer chamber. For example, one or more shared pumps can be used for the process chambers of the second process module. In addition, the vacuum pressure requirements for different types of process chambers, transfer chambers, and process modules may be different such that different types of pumps for vacuum evacuation can be used to be cost effective. Elimination of additional transfer chamber and associated peripherals and pumps surely is very cost-effective without the need to change a specific fabrication sequence.

Figure 8A:
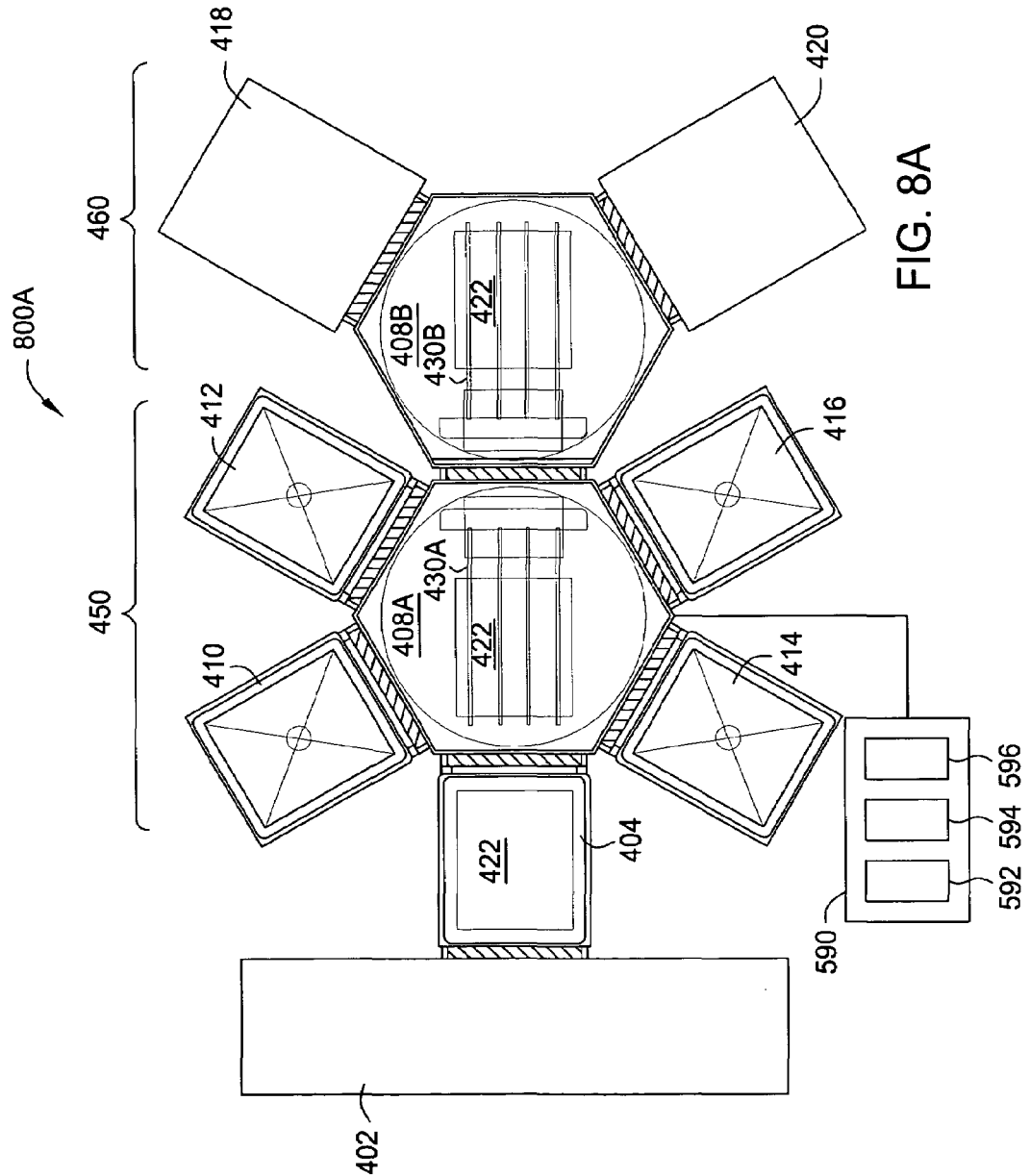
FIG. 8A is a plan view of an exemplary cluster tool configured for in-situ processing of a film stack according to a still further embodiment of the invention.

In the embodiment of FIG. 8A, the first process module 450 is coupled to a first transfer chamber, e.g., the first transfer chamber 408A, for transferring of the substrate 422 from a first load lock chamber, e.g., the load lock chamber 404, of the substrate processing system 800A. The second process module 460 is coupled to a second transfer chamber, e.g., the second transfer chamber 408B, for transferring of the substrate 422 from the first process module 450 into the second process module 460. Thus, the two process modules are coupled together via the transfer chambers, the first transfer chamber 408A and the second transfer chamber 408B.

The substrate processing system 800A differs from the substrate processing system 400A in which no second load lock chamber is included in the second process module 460 such that the substrate 422 is rotably movable within the first transfer chamber 408A among one or more process chambers 410, 412, 414, 416 of the first process module 450 using the first transfer robot 430A, and rotably movable within the second process module 460 by the second transfer chamber 408B among the one or more process chambers 418, 420 using the second transfer robot 430B. Additional process chambers, such as etching chambers, ashing chambers, ion implant chambers, heating chambers, among others, can also be coupled to the second process module 460 to perform additional processes on the substrate 422. As shown in FIG. 8A, flow-though of the substrate 422 being processed from the factory interface 402, through the first process module 450 and the second process module 460, and back to the factory interface 402 can also be obtained.

In the exemplary configuration of FIG. 8A, a substrate transfer shuttle may be adapted to be coupled to the first transfer chamber 408A and the second transfer chamber 408B for transferring the substrate between the two transfer chambers, 408A, 408B to be coordinated with the substrate placed on the first transfer robot 230A and the second transfer robot 230B. A substrate transfer shuttle may be the substrate transfer shuttle adapted to be positioned on the top or bottom of the first transfer chamber 408A and the second transfer chamber 408B via various vacuum seals in order to save space (reduced footprint than the substrate processing system 400A) and still obtain high throughput (e.g., the same or enhanced TACT time as the substrate processing system 400A). Coupling of a vacuum transfer robot and a substrate transfer shuttle is further described in FIGS. 18-19. In addition, a vacuum sealable valve may be positioned between the first transfer chamber 408A and the second transfer chamber 408B to provide them as vacuum buffer/intermediate regions in the substrate processing system 800 for a flexible range of pressure levels therein such that the first transfer chamber 408A and the second transfer chamber 408B can be kept in an intermediate vacuum environment while all the process chambers can be kept in a highly vacuum environment.

Figure 8B:
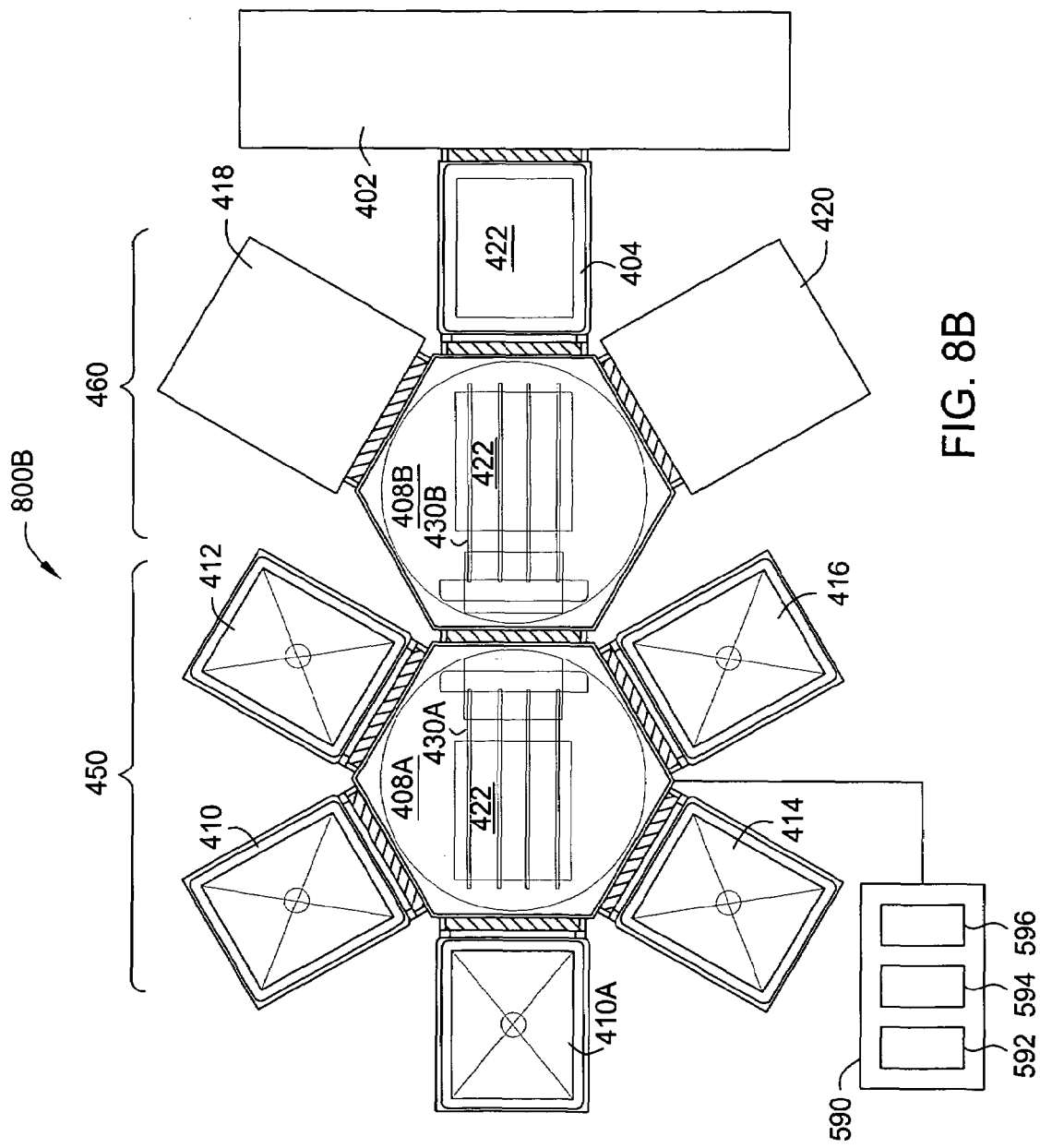
FIG. 8B is a plan view of an exemplary cluster tool configured for in-situ processing of a film stack according to a still further embodiment of the invention.

In the embodiment of FIG. 8B, the substrate processing system 800B is similarly configured, as applied to the substrate processing systems, 400B, 600B to add an additional process chamber 410A and increase system throughput. Various flexible substrate processing sequences can be applied using the substrate processing systems 800A and 800B.

In the embodiment of FIG. 9, the first process module 450 and the second process module 460 are coupled together in the substrate processing system 900 to the same transfer chamber, e.g., the transfer chamber 408. Accordingly, the substrate 422 being processed is rotably movable among the different types of the process chambers of the two process modules using a single substrate transfer robot positioned in the transfer chamber 408 in order to further reduce the footprint and still provide in-situ substrate processing without sacrificing substrate throughput. In one embodiment, the substrate processing system 900 is a hybrid PVD-CVD tool and includes one or more CVD chambers, such as the process chambers 410, 412, 414, and one or more PVD chambers, such as the process chambers 418, 420.

As shown in FIG. 9, the second transfer chamber, the second load lock chamber, and others are further eliminated in the substrate processing system 900 as compared to the substrate processing system 400A. Additional types of process chambers can also be coupled to the substrate processing system 900. In addition, there is no vacuum buffer or intermediate pressure region, since a PVD chamber generally requires a highly vacuum environment. However, one or more pumps or a shared pump may be used in different components of the substrate processing system 900. Further, no flow-through of the substrate 422 since substrate processing is continued from the factory interface 402, into and out of one or more of the different types of process chambers 410, 412, 414, 418, 420 of the substrate processing system 900 and go back directly to the factory interface 402.

As shown in FIGS. 4A-9, a controller 590 is included to interface with and control various components of the substrate processing systems 400A, 400B, 500, 600A, 600B, 700, 800A, 800B, 900. The controller 590 typically includes a central processing unit (CPU) 594, support circuits 596 and a memory 592. The CPU 594 may be one of any form of computer processor that can be used in an industrial setting for controlling various chambers, apparatuses, and chamber peripherals. The memory 592, any software, or any computer-readable medium coupled to the CPU 594 may be one or more readily available memory devices, such as random access memory (RAM), read only memory (ROM), hard disk, CD, floppy disk, or any other form of digital storage, for local or remote for memory storage. The support circuits 596 are coupled to the CPU 594 for supporting the CPU 594 in a conventional manner. These circuits include cache, power supplies, clock circuits, input/output circuitry, subsystems, and the like.

The controller 590 is configured into computer readable medium to execute various steps of one or more methods of the invention, such as the method 300 in the substrate processing systems of the invention. For example, the controller 590 may be used to control operational/processing steps of the substrate processing systems, including any transferring between process modules, process chambers, load lock chambers, and deposition processes performed therein. The controller 590 is also used to control sequences for processing multiple substrates inside the substrate processing systems, to improve various process time between different types of the processes performed by the first process module, the second process module, and the timing sequence/order for transferring multiple substrates in and out of the load lock chambers, the transfer chambers, and the process chambers in accordance with one or more aspects of the invention. In addition, a person can also modify steps performed by the controller according to a desired fabrication sequence for one or more substrates to be processed.

In one embodiment, the controller 590 of the invention is used to control movements of one or more substrates being processed concurrently within the substrate processing systems. Specifically, the control of substrate movement by various substrate transfer or loading mechanisms, e.g., transfer chambers 408, 408A, 408B, load lock chambers 404, 406, and shuttle chamber 426, and any software associated therewith are linked to the software required for controlling different process time and process conditions for the different types of the process chambers in the first process module 450 and the second process module 460. In one aspect, the same software, as compared to prior art separate softwares or commands linked to the controller, is used to control the movement of various substrate transfer mechanisms, such as the robots 430, 430A, 430B, the substrate transfer shuttle 1600, and the substrate support plate 1320, and others, such that the movements of one or more substrate supports in one or more process chambers are engaged or coordinated when the substrate being processed is being transferred to the process chamber from the previous substrate transfer mechanism, transfer chamber, load lock chamber, shuttle assembly, or any previous intermediate vacuum buffer region. By linking the control of the movement of various substrate supports (e.g., moving up and down in a vertical z-direction) and the control of the movement of various transfer robots and substrate transfer shuttles (e.g., moving up and down, and rotably in 360° three dimensionally in all x-y-z-directions) together by the same software and engaging the two control steps at the same time, transferring the substrate and depositing materials on the substrate can then be coordinated together to save overall process time and system throughput.

For example, opening and closing of various vacuum sealable valves among different chambers of the substrate processing systems of the invention can be coordinated and linked together with the substrate transfer steps. However, moving the substrate support to engage the substrate supports before or after substrate processing can be coordinated with the opening and closing of various vacuum sealable valves such that the substrate supports can be engaged earlier and before the various vacuum sealable valves are completely opened and closed to save process time and increase throughput.

One embodiment of the invention also provides maintaining of various pressure levels inside the various chambers and component of the substrate processing system 400A, 400B, 500, 600A, 600B, 700, 800A, 800B, 900 using the controller 590 to control various pumps coupled thereto, such as a cryogenic pump, a turbo pump, a regular dry pump, among others. For example, a PVD chamber of the invention can be maintained at a highly vacuum level, such as at about $10^{-6}$ Torr to about $10^{-7}$ Torr. A transfer chamber of the invention coupled to a PVD chamber may be maintained at about $10^{-5}$ Torr to about $10^{-6}$ Torr, or other levels. A load lock chamber of the invention coupled to a PVD chamber may be maintained at an intermediate pressure level of about 0.5 Torr or less, such as about $10^{-4}$ Torr or less, or other levels. As another example, a CVD chamber of the invention can be maintained at about 10 Torr or less, such as from about 5 Torr or less, or about 2 Torr or less; and a transfer chamber coupled thereto can be maintained at a slight higher intermediate vacuum range, such as about 20 Torr or less, or about 3 Torr or less. However, the invention is not limited to the above mentioned exemplary pressure ranges.

Figure 10:
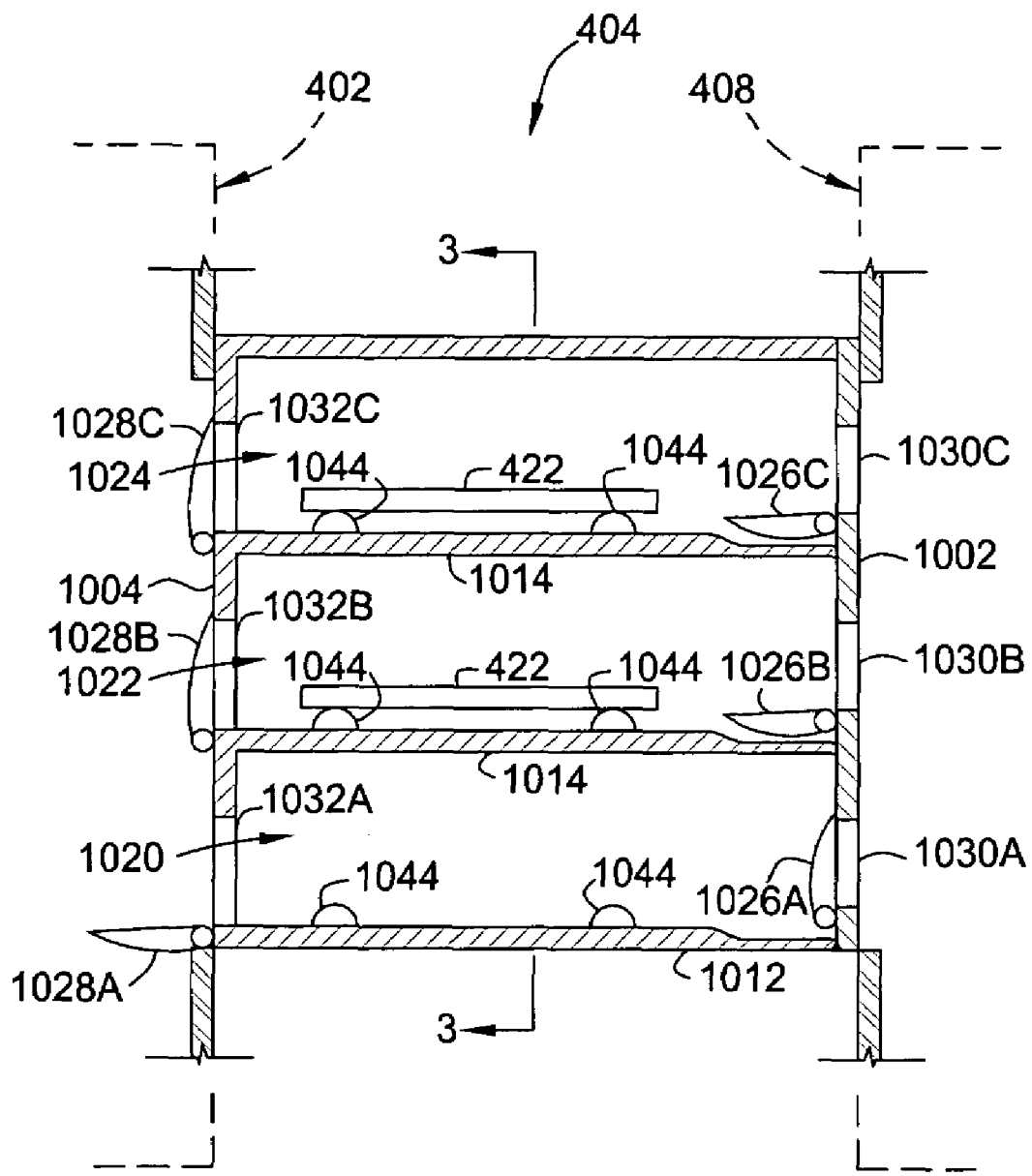
FIG. 10 is a cross-sectional view of one embodiment of a substrate loading and unloading station.

FIG. 10 is a sectional view of one embodiment of the load lock chambers 404, 406 of the invention. The load lock chamber 404, 406 may include a plurality of single substrate transfer compartments/sub-chambers as shown in FIG. 10, or alternatively one or more transfer compartments/sub-chambers, each sub-chamber for loading and unloading multiple substrates. Load lock chambers that may be adapted to benefit from the invention are described in commonly assigned U.S. patent application Ser. No. 09/663,862 filed on Sep. 15, 2000, by Kurita et al.; Ser. No. 09/957,784, entitled "Double Dual Slot Load Lock for Process Equipment", filed Sep. 21, 2001 by Kurita et al.; and Ser. No. 10/832,795, entitled "Load Lock Chamber for Large Area Substrate Processing System", filed Apr. 26, 2004 by Kurita et al., all of which are hereby incorporated by reference in their entireties. It is contemplated that load lock chambers of other configurations may also benefit from the invention.

The load lock chamber 404 or 406 may include a chamber body 1012 with a plurality of vertically-stacked, environmentally-isolated single substrate sub-chambers 1020, 1022, 1024 separated by a plurality of vacuum-tight, horizontal interior walls 1014. Two of the interior walls 1014 are shown in FIG. 10. Although three single substrate sub-chambers 1020, 1022, 1024 are shown in the embodiment depicted in FIG. 10, it is contemplated that the chamber body 1012 of the load lock chamber 404, 406 of the invention may include just one load lock chamber or two or more vertically-stacked substrate load lock sub-chambers. For example, the load lock chamber 404, 406 may include N substrate sub-chambers separated by N−1 horizontal interior walls 1014, where N is an integer number.

In the embodiment depicted in FIG. 10, the substrate sub-chambers 1020, 1022, 1024 are each configured to accommodate a single large area substrate, such as the substrate 422, so that the volume of each chamber may be minimized to enhance fast pumping and vent cycles. For example, each substrate sub-chamber 1020, 1022, 1024 may be configured to support substrates therein and have an interior volume of equal to or less than about 1000 liters to accommodate substrates, each having a plan surface area of about 2.7 square meters. Alternatively, a dual slot dual substrate load lock chamber having an interior volume of about 1600 liters for supporting two substrates in each sub-chamber/slot, can also be used. Multiple slots or multiple substrate support mechanisms can also be adapted to the load lock chambers 404, 406 of the invention. It is contemplated that load lock chambers or sub-chambers of the invention having a greater width and/or length and equal height may be configured to accommodate even larger substrates.

The chamber body 1012 can be fabricated from a rigid material suitable for use under vacuum conditions, such as stainless steel, aluminum, etc. In addition, the chamber body 1012 can be fabricated from a single block (e.g., one piece) of a rigid material, such as aluminum. Alternatively, the chamber body 1012 or portions thereof may be fabricated from modular sections, each modular section generally comprising a portion of one of the substrate sub-chambers 1020, 1022, 1024, and assembled in a fashion suitable to maintain vacuum integrity, such as continuous welding. In addition, the horizontal walls 1014 of the chamber body 1012 may be vacuum sealed to sidewalls of the chamber body 1012, thereby isolating the substrate sub-chambers 1020, 1022, 1024. For example, the horizontal walls 1014 assembled into the load lock chamber 404, 406 may be continuously welded to the chamber body 1012 to allow greater access to the entire interior of the chamber body 1012.

Each of the substrate sub-chambers 1020, 1022, 1024 defined in the chamber body 1012 includes two substrate access ports. For example, in FIG. 10, the first substrate sub-chamber 1020 disposed at the bottom of the chamber body 1012 includes a first substrate access port 1030A and a second substrate access port 1032A coupled to the transfer chamber 408 and the factory interface 402, respectively. The two access ports may be positioned, for example, on opposite sides of the chamber sidewalls, however, they may alternatively be positioned on adjacent walls of the body 1012. The substrate access ports are configured to facilitate the entry and egress of the substrates 422 from the load lock chamber 404, 406 and may have a width of, for example, greater than about 2000 mm, depending on the sizes of the substrates 422. Similarly, the substrate sub-chamber 1022 is configured with access ports 1030B, 1032B and the substrate sub-chamber 1024 is similarly configured with access ports 1030C, 1032C.

Each of the substrate access ports 1030A, 1030B, 1030C, 1032A, 1032B, 1032C is selectively sealed by a respective slit valve 1026A, 1026B, 1026C, 1028A, 1028B, 1028C adapted to selectively isolate the substrate sub-chambers 1020, 1022, 1024 from the environments of the transfer chamber 408 and the factory interface 402. The slit valves 1026A, 1026B, 1026C, 1028A, 1028B, 1028C are pivotally coupled to the chamber body 1012 and may be moved between an open and closed position using an actuator (not shown).

The slit valves 1026A, 1026B, 1026C seal the substrate access ports 1030A, 1030B, 1030C from the interior side of a first sidewall 1002 and is thereby positioned within the substrate sub-chambers 1020, 1022, 1024 such that a vacuum (e.g., pressure) differential between the substrate sub-chambers 1020, 1022, 1024 and the vacuum environment of the transfer chamber 408 assists in loading and sealing the slit valves 1026A, 1026B, 1026C against the sidewall of the chamber body 1012, thereby enhancing the vacuum seal. Correspondingly, the slit valves 1028A, 1028B, 1028C are disposed on the exterior side of a second sidewall 1004 and are thereby positioned such that the pressure differential between the ambient environment of the factory interface 402 and the vacuum environment of the substrate sub-chambers 1020, 1022, 1024 assists in sealing the substrate access ports 1032A, 1032B, 1032C. Examples of the slit valves that may be adapted to benefit from the invention are described in U.S. Pat. No. 5,579,718, issued Dec. 3, 1996 to Freerks and U.S. Pat. No. 6,045,620, issued Apr. 4, 2000 to Tepman et al, both of which are hereby incorporated by reference in their entireties.

The substrate 422 is supported above the bottom of each of the substrate sub-chambers 1020, 1022, 1024 by a plurality of substrate supports 1044, which are configured and spaced at an elevation with the chamber body 1012 or the horizontal walls 1014. The substrate supports 1044 may be, for example, stainless pins having a rounded upper end configured to minimize scratching and contamination of the substrates 422. Other suitable substrate supports are described in U.S. Pat. No. 6,528,767, filed Mar. 4, 2003; U.S. patent application Ser. No. 09/982,406, filed Oct. 17, 2001; and U.S. patent application Ser. No. 10/376,857, filed Feb. 27, 2003, all of which are incorporated by reference in their entireties.

Figure 11:
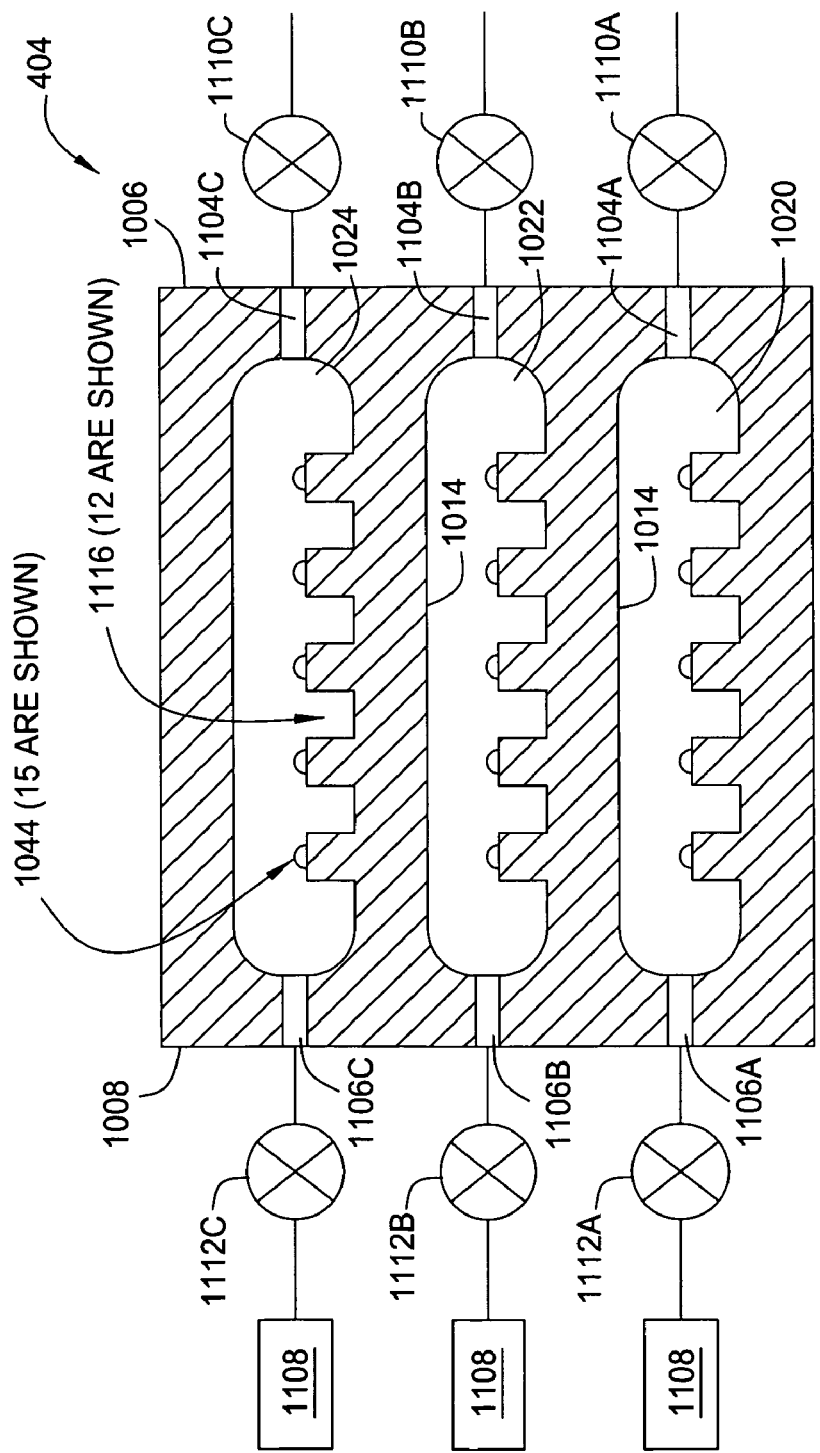
FIG. 11 is another cross-sectional view of a substrate loading and unloading station according to one embodiment of the invention.

FIG. 11 is a sectional view of the load lock chamber 404, 406 taken along section line 3-3 of FIG. 10. The sidewalls of each of the substrate sub-chambers 1020, 1022, 1024 includes at least one port disposed therethrough to facilitate controlling the pressure within the interior volume of each chamber. For example, In the embodiment depicted in FIG. 11, the chamber body 1012 includes vent ports 1104A, 1104B, 1104C formed through a third sidewall 1006 and vacuum ports 1106A, 1106B, 1106C formed through a fourth sidewall 1008 of the chamber body 1012 for venting and pumping down of the substrate sub-chambers 1020, 1022, 1024. Valves 1110A, 1110B, 1110C, 1112A, 1112B, 1112C are respectively coupled to the vent ports 1104A, 1104B, 1104C and the vacuum ports 1106A, 1106B, 1106C to selectively prevent flow therethrough. The vacuum ports 1106A, 1106B, 1106C are coupled to one or more vacuum pumps 1108. For example, one or more of the substrate sub-chambers 1020, 1022, 1024 may share a single vacuum pump equipped with appropriate flow controls or restrictors to facilitate selective pumping between the substrate sub-chambers, or alternatively, there may be two or more vacuum pumps. The vacuum pump 1108 is utilized to selectively lower the pressure within the interior volume of each of the substrate sub-chambers 1020, 1022, 1024 to a level that substantially matches the pressure of the transfer chamber 408.

When the pressures between the transfer chamber 408 and the substrate sub-chambers 1020, 1022, 1024 of the load lock chamber 404 are substantially equal, the slit valves 1026A, 1026B, 1026C may be opened to allow substrates that has been processed to be transferred to the load lock chamber 404 and, alternatively, substrates that will be processed to be transferred to the transfer chamber 408 using the transfer robot 430 via the substrate access ports 1030A, 1030B, 1030C. After placing the substrates 422 returning from the transfer chamber 408 onto the substrate supports 1044 of the substrate sub-chambers 1020, 1022, 1024 of the load lock chamber 404, the slit valves 1026A, 1026B, 1028C are closed and the valves 1110A, 1110B, 1110C can be opened, thereby allowing venting gas, for example, $N_2$ and/or He, etc., flowing into the substrate sub-chambers 1020, 1022, 1024 of the load lock chamber 404 through the vent ports 1104A, 1104B, 1104C and raising the pressure within the internal volume of the substrate sub-chamber 1020, 1022, 1024. Typically, venting gas entering the interior volume via the vent ports 1104A, 1104B, 1104C is filtered to minimize potential particulate contamination of the substrate 422. Maintaining the vacuum pressure level and venting within the substrate sub-chambers 1020, 1022, 1024 can be performed individually on each of the substrate sub-chambers 1020, 1022, 1024. Once the pressure within each of the substrate sub-chambers 1020, 1022, 1024 is substantially equal to that of the factory interface 402, the slit valves 1028A, 1028B, 1028C open, thus allowing the atmospheric robot from the factory interface 402 to transfer substrates between the substrate sub-chamber 1020, 1022, 1024 and the substrate storage cassettes coupled to the factory interface 402 through the substrate access port 1032A, 1032B, 1032C.

As the substrate sub-chambers 1020, 1022, 1024 are configured to be compact, for example, with less than or equal to about 1000 liters of volume for a substrate size of greater than 3 square meters, the load lock chambers 404, 406 may transfer about 70 substrates per hour at a reduced pumping rate as compared to a conventional load lock chamber, which has a substrate transfer rate of about 60 substrates per hour. A reduced pumping rate of between about 160-180 seconds per pump/vent cycles can be obtained. Other load lock chamber having a reduced pumping rate of about 130 seconds per cycle can also be used. The substantially longer cycle reduces air velocity within the load lock chamber 404, 406, thereby reducing the probability of particular contamination of the substrate, while eliminating the condensation. Furthermore, the exemplary stacked configuration of the substrate sub-chambers improves substrate processing throughput without increasing the footprint of the load lock chamber, highly desirable in reducing the overall cost of a fabrication facility.

Additionally, the overall height of the load lock chamber having three single substrate sub-chambers is less than the height of conventional load lock chamber, further providing greater throughput in a smaller, less expensive package. Moreover, greater substrate throughput can be achieved using other suitable pumps having lower capacity, which contributes to reducing the costs.

In FIG. 11, the bottom of the chamber body 1012 and the interior walls 1014 may also include one or more grooves 1116 formed therein and configured to provide clearance between the substrate 422 disposed on the substrate supports 1044 and the transfer robot 430. The blades or fingers of the transfer robot 430 can be moved into the grooves 1116 to a predefined position within the substrate sub-chamber, the blades are elevated to lift the substrate 422 from the substrate supports 1044. The blade carrying the substrate 422 is then retracted from the substrate sub-chamber. The substrate 422 can be placed onto the substrate supports 1044 in a reverse manner.

The load lock chambers, 404, 406 may also be used to perform additional substrate preparation or treatment steps on the substrate 422, such as heating, cooling, among others, while the substrate 422 is moved from the factory interface 402 into and out of the substrate processing systems of the invention to be processed by different types of processes performed by the process chambers of different process modules. In one embodiment, at least one of the substrate sub-chambers 1020, 1022, 1024 of the load lock chamber 404 is adapted to rapidly heat and/or cool the substrate 422 when positioned on the substrate supports 1044. Detail of the heating and cooling capability of the load lock chamber 404 is described in commonly assigned U.S. Pat. Nos. 6,086,362; 6,193,507; and 6,435,868, titled "Multi-Function Chamber for a Substrate Processing System, all of which are incorporated by reference in their entirety.

Figure 12:
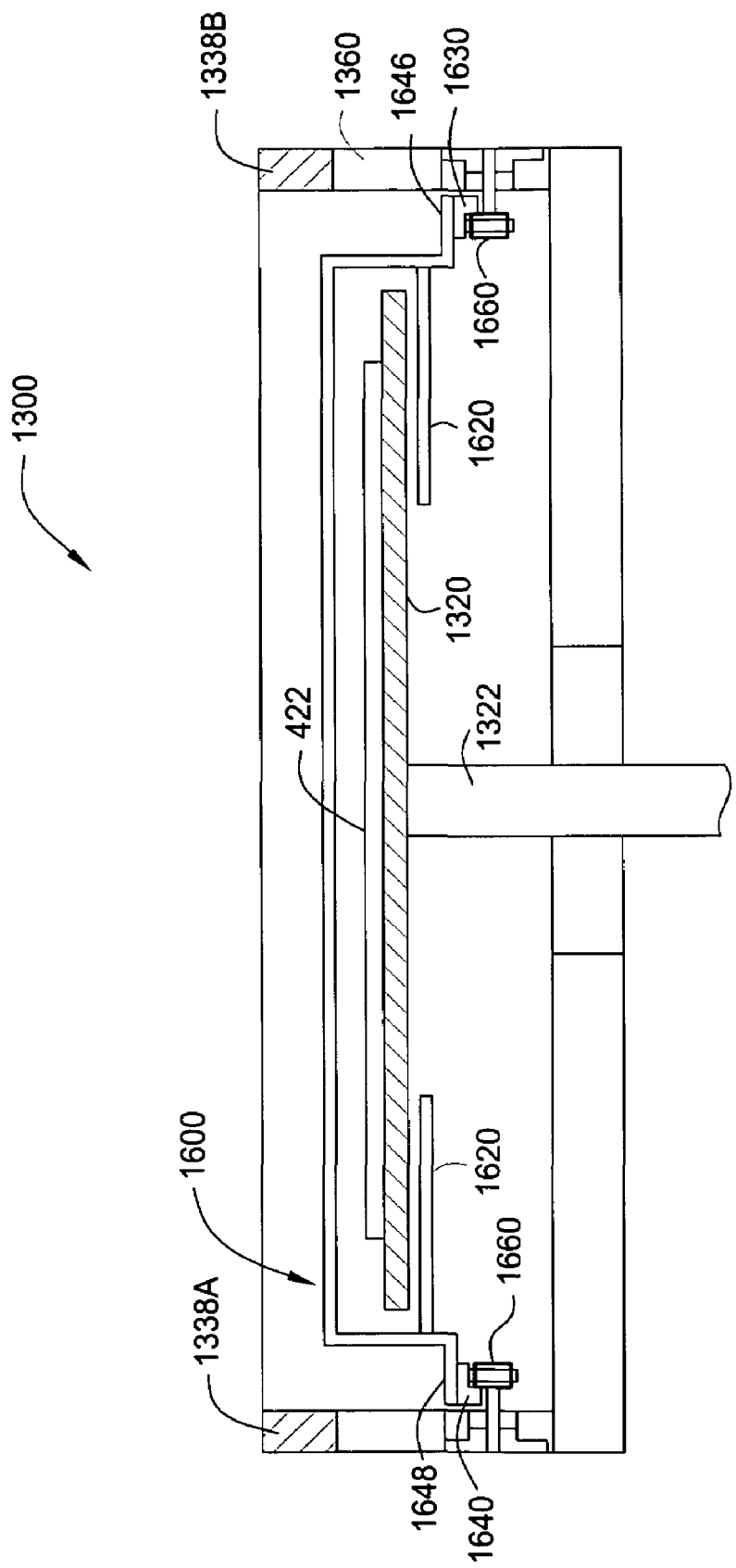
FIG. 12 is a cross-sectional view of a substrate loading and unloading station according to another embodiment of the invention.

FIG. 12 depicts another exemplary load lock chamber 1300 which can be configured and adapted to be the load lock chambers of the invention which can be coupled to a substrate transfer shuttle mechanism, such as the substrate transfer shuttle 1600. For example, the load lock chamber 1300 can be adapted to be the load lock chamber 406 in FIGS. 5, 6A, 6B, and 7. The load lock chamber 1300 may include a substrate support plate 1320 or similar supporting mechanisms to support a substrate received thereon from a transfer robot or a substrate transfer shuttle.

The substrate support plate 1320 is positioned above a shaft 1322 coupled to a lift mechanism (not shown) for lifting the substrate on the substrate support plate 1320 up and down into various raised or lowered positions to be coordinated with different positions suitable for loading and unloading the substrate from the transfer robots and/or substrate transfer shuttles of the invention. The surface of the substrate support plate 1320 is generally conformal to the shape of the substrate and may optionally be slightly larger or smaller than the plan surface of the substrate.

In FIG. 12, chamber walls 1338A, 1338B of the load lock chamber 1300 may include vacuum sealable valves, such as a slit valve 1360, or a gate valve, etc., coupling to other chambers of the substrate processing systems of the invention. The load lock chamber 1300 may also include heating elements or cooling tubes therein or underneath, such as within the substrate support plate 1320 or underneath the substrate support plate 1320, to provide heating or cooling of the substrate prior to or after substrate processing.

In addition, one or more substrate support plates 1320 can be configured and positioned to a single load lock chamber 1300 for supporting one or more substrates therein. Alternatively, two or more load lock chambers 1300 or sub-chambers can be used, such as by vertically or horizontally coupled two or more load lock chamber 1300 together, each having at least one movable substrate support plate 1320 or more.

Figure 13:
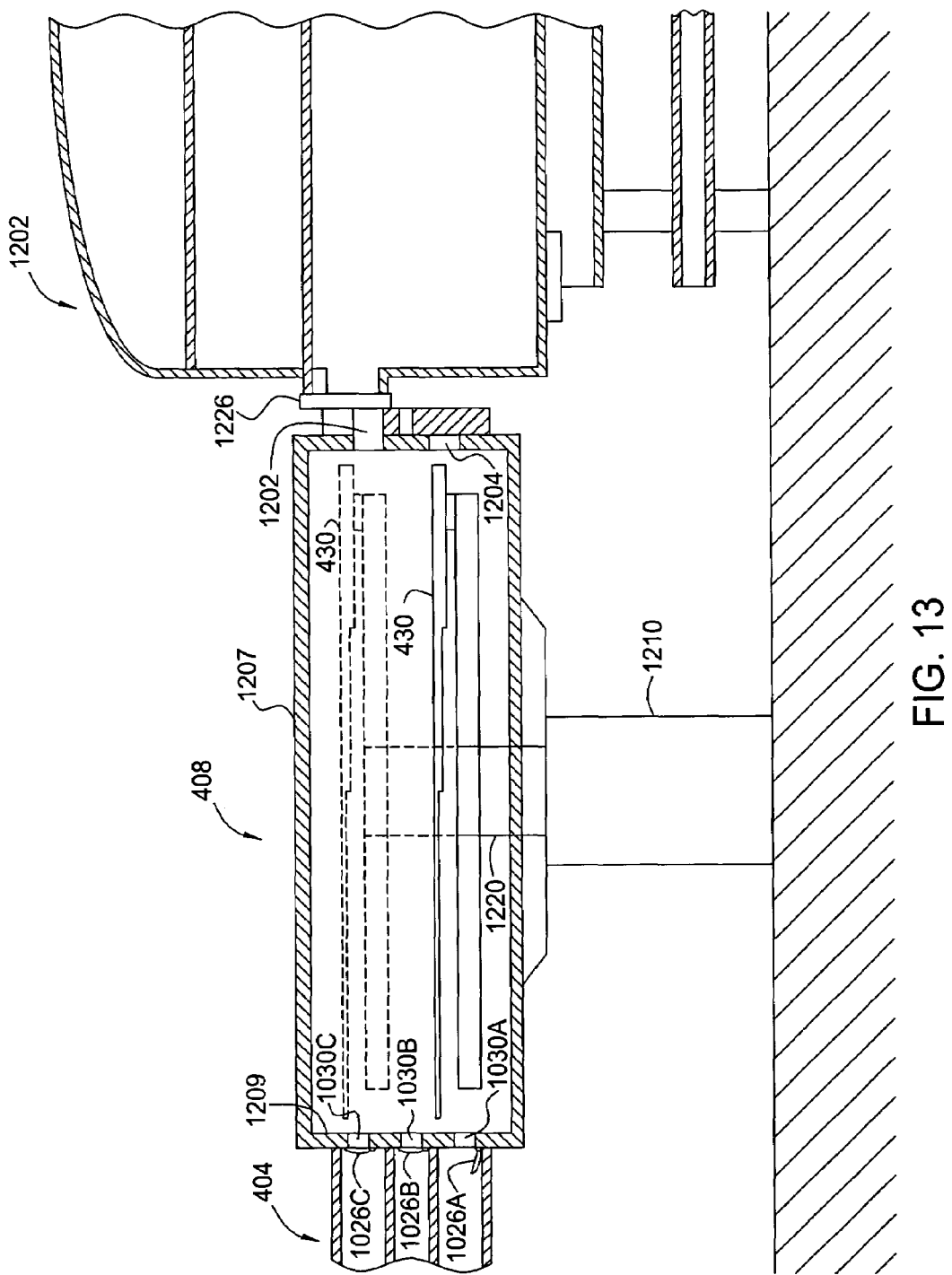
FIG. 13 is a cross-sectional view of one exemplary substrate transfer station having an exemplary robot assembly therein according to one embodiment of the invention.

FIG. 13 is a sectional view of one embodiment of the transfer chamber of the invention. The transfer chambers 408, 408A, or 408B may include at least one transfer robot 430, 430A, or 430B, such as a dual blade vacuum robot, disposed therein. The transfer chamber 408 may be coupled to one or more load lock chambers or different load lock chambers stacked together, where each load lock chamber may be, for example, a triple single substrate load lock (TSSR), a double dual slot load lock (DDSL), a single dual slot load lock (DSL), or other conventional load locks. The transfer chamber 408 may also be coupled to at least one process chamber and/or other additional load lock chambers, buffer stations, shuttle chambers, and shuttle mechanisms, such as the process chambers 410, 410A, 412, 414, 416, 418, 420, the load lock chambers 404, 406, and the shuttle chamber 426 of the invention.

A shown in FIG. 13, the transfer chamber 408 includes a main body 1207 configured to be positioned above a base 1210. The main body 207 may have an interior wall 1209 and an exterior wall 1211. The shape of the interior wall 1209 may be cylindrical in shape or other shape, and the exterior wall 1211 may be hexagonal or other shapes and may include flat regions which form side walls that are adapted to couple to the process chambers or load lock chambers of the invention. The main body 1207 may be, for example, machined from a single piece of a material, such as stainless steel, aluminum, among others. The height of the main body 1207 is minimized so as to reduce the overall volume and weight of the transfer chamber 408.

Each side wall may include one or more openings coupled to one or more valves, such as the slit valves 1026A, 1026B, 1026C, through which the substrate 422 (not shown) may be transferred from the transfer chamber 408 to a load lock chamber, or vice versa, using the transfer robot 430. Other side wall may include one or more openings 1202, 1204. For example, the opening 1202 may be coupled to a process chamber, for example, the process chamber 418 as shown in FIG. 13, via a valve 1226. The valve 1226 may be a conventional gate valve, a slit valve, or other conventional valves. The valve 1226 may selectively open and close the opening 1202 from the interior or exterior side of the side wall of the transfer chamber 408 using an actuator (not shown) associated therewith. In addition, the opening 1204 may be coupled to a pumping mechanism (not shown) to pump down the pressure level of the transfer chamber 408 to a suitable degree of vacuum.

A shaft 1220 and a lift mechanism may be coupled to the transfer robot 430 and the base 1210 of the transfer chamber 408 to provide rotational movement, preferably 360 degree, and vertical movement of the transfer robot 430. The rotational movement of the transfer robot 430 may be required for moving the substrates 422 among the different chambers coupled to the transfer chamber 408 and the vertical movement of the transfer robot 430 may be required for moving the substrates 422 vertically to a position to be aligned to the different access ports and/or openings on the side walls of the various chambers of the invention.

The pressure of the transfer chamber 408 is maintained by the pumping mechanism coupled thereto, which may include one or more pumps, such as a dry pump, a roughing pump, a turbo pump, and a cryogenic pump, among others. The pressure of the transfer chamber 408 can be kept at a range of about 5 Torr or lower, such as a range of about 1 Torr to about 5 Torr, or about 2 Torr to about 3 Torr, depending on the required minimum pressure difference between the process chambers and the transfer chamber. Alternatively, when high vacuum base pressure of the transfer chamber is needed, the transfer chamber 408 can be kept at about $10^{-3}$ Torr or less, such as at about $10^{-5}$ Torr to about $10^{-6}$ Torr.

One embodiment of the invention provides the second transfer chamber being coupled to a cryogenic pump with high evacuation efficiency to obtain high vacuum base pressure of the second transfer chamber compatible for the high vacuum requirement of various PVD process chamber coupled thereto and the second transfer chamber can be kept at a base pressure of about $10^{-4}$ Torr or less, such as at about $10^{-5}$ Torr to about $10^{-6}$ Torr.

Additional transfer chambers that may be adapted to benefit from the invention are described in commonly assigned U.S. Pat. No. 6,786,935, filed Mar. 10, 2000, entitled "Vacuum Processing System for Producing Components", by Powell; and U.S. patent application Ser. No. 10/601,185, filed Jun. 20, 2003, entitled "Transfer Chamber for Vacuum Processing System", by Kurita et al., which are hereby incorporated by reference in their entireties.

Figure 14:
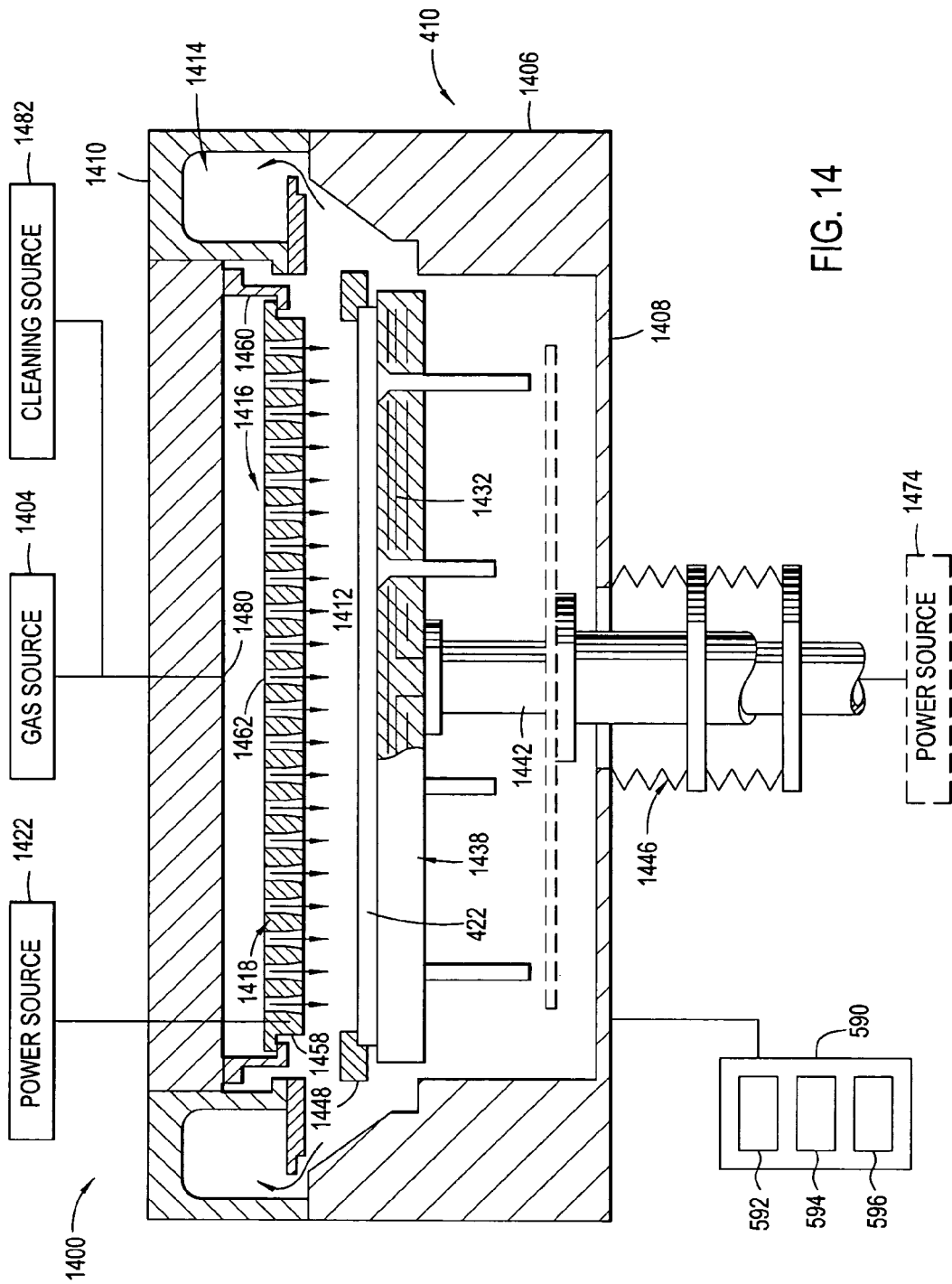
FIG. 14 is a sectional view of one exemplary chemical vapor deposition (CVD) process chamber according to one embodiment of the invention.

FIG. 14 is a schematic cross-sectional view of one embodiment of a deposition system 1400, such as a chemical vapor deposition system or a plasma enhanced chemical vapor deposition system, available from AKT, a division of Applied Materials, Inc., Santa Clara, Calif. The deposition system 1400 generally includes a process chamber of the invention, for example, the process chamber 410 as shown, coupled to a gas source 1404, a power source 1422, and/or a cleaning source 1482. The process chambers 410A, 412, 414, 416 of the invention can be configured in a similar manner.

The process chamber 410 includes walls 1406 and a bottom 1408 that partially define a process region 1412. The process region 1412 is typically accessed through a port and a valve (not shown) to facilitate movement of the substrate 422 into and out of the process chamber 410. The walls 1406 support a lid assembly 1410 that contains a pumping plenum 1414 that couples the process region 1412 to an exhaust port (that includes various pumping components coupled to a pump, not shown) for exhausting any gases and process by-products out of the process chamber 410.

A temperature controlled substrate support assembly 1438 is centrally disposed within the process chamber 410. The substrate support assembly 1438 supports the substrate 422 during processing. The substrate support assembly 1438 includes at least one heater 1432 embedded therein. The heater 1432, such as a resistive element, disposed in the substrate support assembly 1438, is coupled to an optional power source 1474 and controllably heats the support assembly 1438 and the substrate 422 positioned thereon to a predetermined temperature, such as about 500° C. or lower, e.g., between about 300° C. to about 400° C.

In one embodiment, the temperature of the heater 1432 can be set at about 100° C. or lower, such as between about 20° C. to about 80° C., depending on the deposition processing parameters for the material layer being deposited. For example, the heater can be set at about 60° C. for a low temperature deposition process. In another embodiment, a port having hot water flowing therein is disposed in the substrate support assembly 1438 to maintain the temperature of the substrate 422 to be processed at a uniform temperature of 100° C. or lower, such as between about 20° C. to about 80° C. Alternatively, the heater 1432 can be turned off with only hot water flowing inside the substrate support assembly 1438 to control the temperature of the substrate during deposition, resulting in a substrate temperature of about 80° C. or lower for a low temperature deposition process.

The support assembly 1438 generally is grounded such that RF power supplied by the power source 1422 to a gas distribution plate assembly 1418 positioned between the lid assembly 1410 and substrate support assembly 1438 (or other electrode positioned within or near the lid assembly of the chamber) may excite gases present in the process region 1412 between the support assembly 1438 and the gas distribution plate assembly 1418. The RF power from the power source 1422 is generally selected commensurate with the size of the substrate to drive the chemical vapor deposition process.

In one embodiment, a RF power of about 10 W or larger, such as between about 400 W to about 5000 W, is applied to the power source 1422 to generate an electric field in the process region 1412. The power source 1422 and matching network (not shown) create and sustain a plasma of the process gases from the precursor gases in the process region 1412. Preferably high frequency RF power of 13.56 MHz can be used, but this is not critical and lower frequencies can also be used. Further, the walls of the chamber can be protected by covering with a ceramic material or anodized aluminum material Generally, the support assembly 1438 includes a stem 1442 coupled thereto and connected to a lift mechanism (not shown) for moving the support assembly 1438 between an elevated processing position (as shown) and a lowered substrate transfer position. The stem 1442 additionally provides a conduit for electrical and thermocouple leads between the support assembly 1438 and other components of the chemical vapor deposition system 1400. A bellows 1446 is coupled to the substrate support assembly 1438 to provide a vacuum seal between the process region 1412 and the atmosphere outside the process chamber 410 and facilitate vertical movement of the support assembly 1438.

In one embodiment, the lift mechanism of the process chamber 410 is adjusted such that a spacing between the substrate and the gas distribution plate assembly 1418 is about 400 mils or larger, such as between about 400 mils to about 1600 mils during processing. The ability to adjust the spacing enables the process to be optimized over a wide range of deposition conditions, while maintaining the required film uniformity over the area of a large substrate. The combination of a grounded substrate support assembly, high pressures and close spacing gives a high degree of plasma confinement between the gas distribution plate assembly 1418 and the substrate support assembly 1438, thereby increasing the concentration of reactive species and the deposition rate of the subject thin films.

The support assembly 1438 additionally supports a circumscribing shadow frame 1448. Generally, the shadow frame 1448 prevents deposition at the edge of the substrate 422 and support assembly 1438. The lid assembly 1410 typically includes an entry port 1480 through which process gases provided by the gas source 1404 are introduced into the process chamber 410. The entry port 1480 is also coupled to the cleaning source 1482. The cleaning source 1482 typically provides a cleaning agent, such as disassociated fluorine, that is introduced into the process chamber 410 to remove deposition by-products and films from processing chamber hardware, including the gas distribution plate assembly 1418.

The gas distribution plate assembly 1418 is typically configured to substantially follow the profile of the substrate 422, for example, polygonal for large area substrates and circular for wafers. The gas distribution plate assembly 1418 includes a perforated area 1416 through which precursors and other gases, such as hydrogen gas, supplied from the gas source 1404 are delivered to the process region 1412. The perforated area 1416 is configured to provide uniform distribution of gases passing through the gas distribution plate assembly 1418 into the process chamber 410. The gas distribution plate assembly 1418 typically includes a diffuser plate 1458 suspended from a hanger plate 1460. A plurality of gas passages 1462 are formed through the diffuser plate 1458 to allow a predetermined distribution of gas passing through the gas distribution plate assembly 1418 and into the process region 1412.

Gas distribution plates that may be adapted to benefit from the invention are described in commonly assigned U.S. patent application Ser. No. 09/922,219, filed Aug. 8, 2001 by Keller et al.; Ser. No. 10/140,324, filed May 6, 2002; and Ser. No. 10/337,483, filed Jan. 7, 2003 by Blonigan et al.; U.S. Pat. No. 6,477,980, issued Nov. 12, 2002 to White et al.; and U.S. patent application Ser. No. 10/417,592, filed Apr. 16, 2003 by Choi et al., which are hereby incorporated by reference in their entireties.

Although the invention has been described in accordance with certain embodiments and examples, the invention is not meant to be limited thereto. For example, the exemplary process chamber as illustrated in FIG. 14 can be adapted to be any of the process chambers 410, 410A, 412, 414, 416 of the invention. Alternatively, the CVD process herein can be carried out using a plasma enhanced CVD chamber, and other CVD chambers, such as a low pressure CVD chamber, a high temperature CVD chamber, a low temperature CVD chamber, among others, by adjusting the gas flow rates, pressure and temperature so as to obtain high quality films at practical deposition rates.

One embodiment of the invention further provides that the process chambers 410, 412, 414, 416, 410A can be the same type or different types of CVD chambers used to deposit the same film type or different materials on a substrate. For example, the process chambers 410, 412, 414, 416, 410A can be used to deposit a multilayered film stack of the invention, where each one of the process chambers 410, 412, 414, 416, 410A are configured to perform the same or different CVD processes using one or more shared or different power sources, gas sources, cleaning sources and/or other chamber peripheries and chamber components for depositing the multilayered film stack of the invention.

In one example, portions of the multilayered film stack of the invention can be deposited sequentially in different chambers by transferring the substrate 422 sequentially to the process chambers 410, 412, 414, 416, 410A, each process chamber configured to deposit one or more materials over the materials deposited by the previous process chamber. As another example, the substrate is transferred from the load lock chamber to one of the process chambers 410, 412, 414, 416, 410A without going through another one of the same type of the process chambers 410, 412, 414, 416, 410A, where each process chamber is configured to sequentially deposit the whole or a portion of the multilayer film stack of the invention on the substrate in a single process chamber.

In one embodiment, one or more same type of process chambers are coupled together to the substrate processing systems of the invention in order to increase the throughput of substrate processing. For example, a plasma enhanced CVD chamber, such as the process chamber 410, used to deposit three silicon-containing active layers may have a throughput of about five substrates per hour. When three process chambers are coupled, a throughput of at least about fifteen substrates per hour can be obtained, e.g., a throughput of about eighteen substrates per hour or more can be obtained using the process chambers 410, 412, 414 of the substrate processing system 900. When other chambers in the substrate processing system are not limiting the throughput, a high throughput of at least about twenty substrates per hour, such as about twenty-four substrates per hour, can be obtained using the substrate processing systems 400A, 500, 600A, 700, 800A of the invention. For example, for depositing three silicon-containing active layers and multiple metal layers using the method 300 of the invention, the high throughput of about twenty-four substrates per hour by the substrate processing systems of the invention is remarkable. As another example, a high throughput of at least about 30 substrates per hour can be obtained using the substrate processing systems 400B, 600B, 800B of the invention. In addition, the numbers of substrate transfer among the process chambers can be desirably reduced.

In another embodiment, the invention provides shared power source 1422, shared gas source 1404, and/or cleaning source 1482 for the process chambers 410, 412, 414, 416, 410A of the invention configured to carry out similar type of CVD process in order to cut down cost and provides high throughput. In addition, the pump for the process chamber 410 can be shared with the process chambers 412, 414, 416, 410A by coupling to various pumping components and flow restrictors, in order o reduce cost. Alternatively, different pumps can be coupled to different process chamber 410, 412, 414, 416, 410A.

Figure 15:
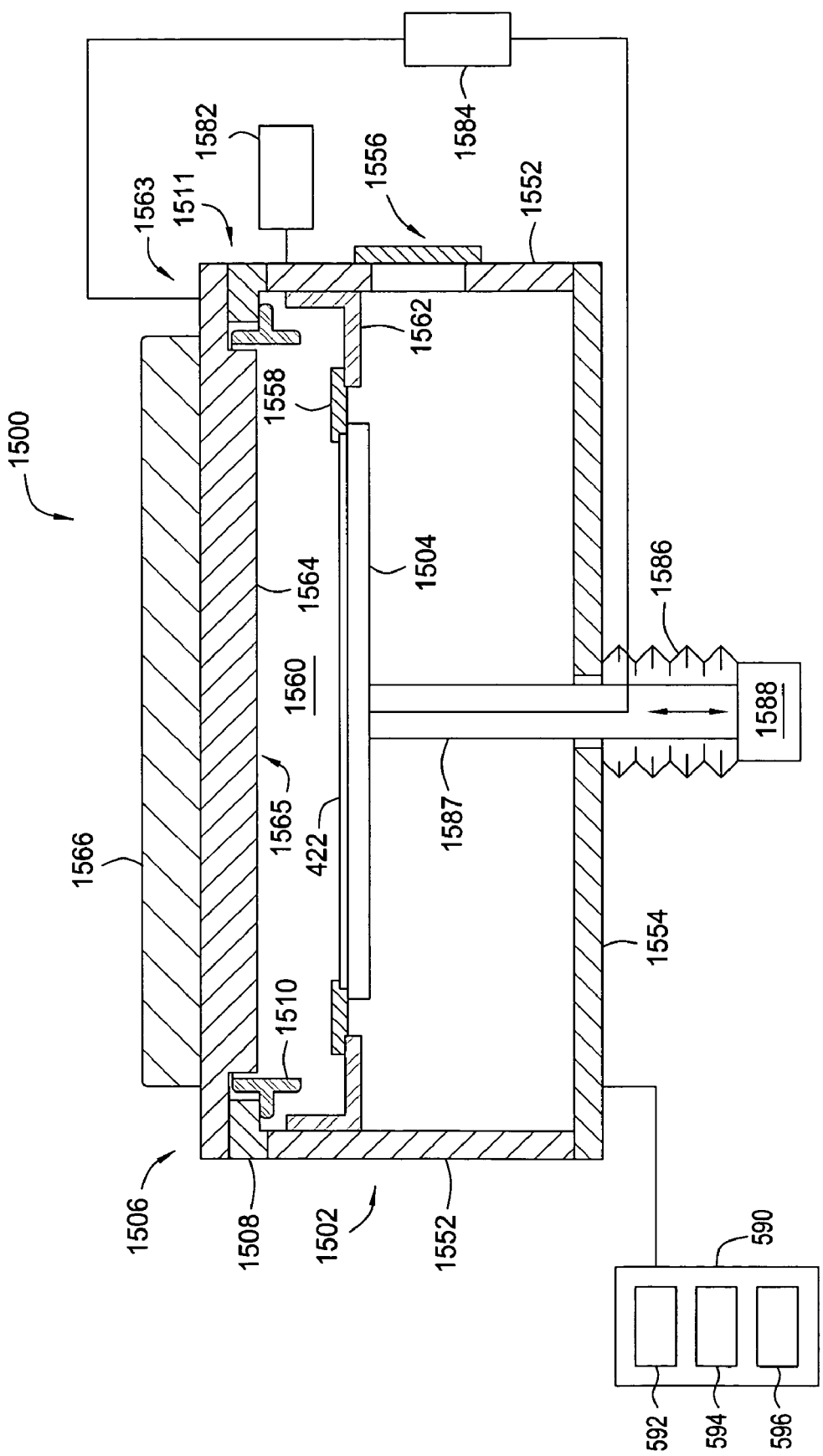
FIG. 15 is a sectional view of one exemplary physical vapor deposition (PVD) process chamber according to one embodiment of the invention.

FIG. 15 illustrates an exemplary process chamber 1500 according to one embodiment of the invention. One example of the process chamber 1500 that may be adapted to benefit from the invention is a physical vapor deposition (PVD) process chamber, available from Applied Materials, Inc., located in Santa Clara, Calif. The process chamber 1500 includes a chamber body 1502 and a lid assembly 1506, defining a process volume 1560. The chamber body 1502 is typically fabricated from a unitary block of aluminum or welded stainless steel plates. The chamber body 1502 generally includes sidewalls 1552 and a bottom 1554.

The sidewalls 1552 and/or bottom 1554 generally include a plurality of apertures, such as an access port 1556 and a pumping port (not shown). The pumping port is coupled to a pumping device (also not shown) that evacuates and controls the pressure within the process volume 1560. The pumping device is able to maintain the pressure of the process chamber 1500, such as the process chambers 418, 420, to a high vacuum level. For example, the pressure level of the process chambers 418, 420 can be maintained to about 1 Torr or less, such as at about $10^{-3}$ Torr or less, at about $10^{-5}$ Torr to about $10^{-7}$ Torr, or at about $10^{-7}$ Torr or less.

The access port 1556 is sealable, such as by a slit valve or other vacuum sealable assembly, and may be coupled to the transfer chamber 408 and other chambers of the substrate processing system of the invention to provide entrance and egress of the substrate 422 (e.g., a flat panel display substrate or a semiconductor wafer) into and out of the process chamber 1500. Other apertures, such as a shutter disk port (not shown) may also optionally be formed on the sidewalls 1552 and/or bottom 1554 of the chamber body 1502.

The dimensions of the chamber body 1502 and related components of the process chamber 1500 are not limited and generally are proportionally larger than the size and dimension of the substrate 422 to be processed in the process chamber 1500. For example, when processing a large area square substrate having a width of about 370 mm to about 2160 mm and a length of about 470 mm to about 2460 mm, the chamber body 1502 may include a width of about 570 mm to about 2360 mm and a length of about 570 mm to about 2660 mm. As one example, when processing a substrate size of about 1000 mm×1200 mm, the chamber body 1502 can have a cross sectional dimension of about 1750 mm×1950 mm. As another example, when processing a substrate size of about 1950 mm×2250 mm, the chamber body 1502 can have a cross sectional dimension of about 2700 mm×3000 mm.

The lid assembly 1506 generally includes a target 1564 and a ground shield assembly 1511 coupled thereto. The target 1564 provides a material source that can be deposited onto the surface of the substrate 422 during a PVD process. The target 1564 or target plate may be fabricated of a material that will become the deposition species or it may contain a coating of the deposition species. To facilitate sputtering, a high voltage power supply, such as a power source 1584 is connected to the target 1564. The target 1564 generally includes a peripheral portion 1563 and a central portion 1565. The peripheral portion 1563 is disposed over the sidewalls 1552 of the chamber. The central portion 1565 of the target 1564 may protrude, or extend in a direction towards a substrate support 1504. It is contemplated that other target configurations may be utilized as well. For example, the target 1564 may comprise a backing plate having a central portion of a desired material bonded or attached thereto. The target material may also comprise adjacent tiles or segments of material that together form the target. Optionally, the lid assembly 1506 may further comprise a magnetron assembly 1566, which enhances consumption of the target material during processing.

During a sputtering process to deposit a material on the substrate 422, the target 1564 and the substrate support 1504 are biased relative each other by the power source 1584. A process gas, such as inert gas and other gases, e.g., argon, and nitrogen, is supplied to the process volume 1560 from a gas source 1582 through one or more apertures (not shown), typically formed in the sidewalls 1552 of the process chamber 1500. The process gas is ignited into a plasma and ions within the plasma are accelerated toward the target 1564 to cause target material being dislodged from the target 1564 into particles. The dislodged material or particles are attracted towards the substrate 422 through the applied bias, depositing a film of material onto the substrate 422.

The ground shield assembly 1511 includes a ground frame 1508, a ground shield 1510, or any chamber shield member, target shield member, dark space shield, dark space shield frame, etc. The ground shield 1510 surrounds the central portion 1565 of the target 1564 to define a processing region within the process volume 1560 and is coupled to the peripheral portion 1563 of the target 1564 by the ground frame 1508. The ground frame 1508 electrically insulates the ground shield 1510 from the target 1564 while providing a ground path to the chamber body 1502 of the process chamber 1500 (typically through the sidewalls 1552). The ground shield 1510 constrains the plasma within the region circumscribed by the ground shield 1510 to ensure that target source material is only dislodged from the central portion 1565 of the target 1564. The ground shield 1510 may also facilitate depositing the dislodged target source material mainly on the substrate 422. This maximizes the efficient use of the target material as well as protects other regions of the chamber body 1502 from deposition or attack from the dislodged species or the from the plasma, thereby enhancing chamber longevity and reducing the downtime and cost required to clean or otherwise maintain the chamber. Another benefit derived from the use of the ground frame 1508 surrounding the ground shield 1510 is the reduction of particles that may become dislodged from the chamber body 1502 (for example, due to flaking of deposited films or attack of the chamber body 1502 from the plasma) and re-deposited upon the surface of the substrate 422, thereby improving product quality and yield. The ground shield 1510 may be formed of one or more work-piece fragments and/or one or more corner pieces, and a number of these pieces are bonded together, using bonding processes known in the art, such as welding, gluing, high pressure compression, etc.

The substrate support 1504 is generally disposed on the bottom 1554 of the chamber body 1502 and supports the substrate 422 thereupon during substrate processing within the process chamber 1500. The substrate support 1504 may include a plate-like body for supporting the substrate 422 and any additional assembly for retaining and positioning the substrate 422, for example, an electrostatic chuck and other positioning means. The substrate support 1504 may include one or more electrodes and/or heating elements imbedded within the plate-like body support.

The temperature of the substrate 422 to be processed can thus be maintained to about 500° C. or less, such as at about 200° C. or less. In one embodiment, in-situ processing of the substrate 422 can be performed by transferring the substrate 422 from the deposition system 1400 to the process chamber 1500 within the substrate processing system of the invention without breaking the vacuum, any surface treatment, any substrate cool down, and/or preheating treatment. The processing temperature ranges of the deposition system 1400 and the process chamber 1500 are comparable such that in-situ substrate processing can be obtained when the deposition system 1400 and the process chamber 1500 are coupled to the substrate processing systems 400A, 400B, 500, 600A, 600B, 700, 800A, 800B, 900 of the invention.

A shaft 1587 extends through the bottom 1554 of the chamber body 1502 and couples the substrate support 1504 to a lift mechanism 1588. The lift mechanism 1588 is configured to move the substrate support 1504 between a lower position and an upper position. The substrate support 1504 is depicted in an intermediate position in FIG. 15. A bellows 1586 is typically disposed between the substrate support 1504 and the chamber bottom 1554 and provides a flexible seal therebetween, thereby maintaining vacuum integrity of the chamber volume 1560.

Optionally, a shadow frame 1558 and a chamber shield 1562 may be disposed within the chamber body 1502. The shadow frame 1558 is generally configured to confine deposition to a portion of the substrate 422 exposed through the center of the shadow frame 1558. When the substrate support 1504 is moved to the upper position for processing, an outer edge of the substrate 422 disposed on the substrate support 1504 engages the shadow frame 1558 and lifts the shadow frame 1558 from the chamber shield 1562. When the substrate support 1504 is moved into the lower position for loading and unloading the substrate 422 from the substrate support 1504, the substrate support 1504 is positioned below the chamber shield 1562 and the access port 1556. The substrate 422 may then be removed from or placed into the process chamber 1500 through the access port 1556 on the sidewalls 1552 while cleaning the shadow frame 1558 and the chamber shield 1562. Lift pins (not shown) are selectively moved through the substrate support 1504 to space the substrate 422 away from the substrate support 1504 to facilitate the placement or removal of the substrate 422 by a transfer robot 430 or a transfer mechanism disposed exterior to the process chamber 1500, such as a single arm robot or dual arm robot. The shadow frame 1558 can be formed of one piece or it can be two or more work-piece fragments bonded together in order to surround the peripheral portion of the substrate 422.

PVD chambers that may be adapted to benefit from the invention are described in co-pending U.S. patent application Ser. No. 11/131,009 (docket number: AMAT/9566) filed on May 16, 2005, titled "Ground Shield for a PVD chamber" by Golubovsky; Ser. No. 10/888,383 (docket number: AMAT/9309) filed on Jul. 9, 2004, titled "Staggered Target Titles" by Tepman; (docket number: AMAT/10169) titled "Integrated PVD System Using Designated PVD Chambers" by Hosokawa et al; and Ser. No. 10/863,152 (docket number: AMAT/8841) filed on Jun. 7, 2004, titled "Two Dimensional Magnetron Scanning for Flat Panel Sputtering" by Tepman, all of which are hereby incorporated by reference in their entireties.

Other types of process chamber can also be coupled to the substrate processing systems of the invention. One example is an etching chamber to perform etching of one or more metal and silicon-containing films of the invention. Another example is a heat chamber that thermally conditions substrates prior to processing to condition the substrate 422 ready for a desired processing temperature and enhance throughput of the substrate processing system. The heat chamber can also be used to anneal one or more films on the substrate 422 after one or more metal and silicon-containing films of the invention are deposited on the substrate. Alternatively, the heat chamber can be used to perform ashing and other processes.

The invention is illustratively described above for a flat panel processing chambers, such as those CVD chambers, PVD chambers, and load lock chambers available from AKT, a division of Applied Materials, Inc., Santa Clara, Calif. However, it should be understood that the invention has utility in other system configurations, wherever high throughput substrate processing is desired.

Figure 16:
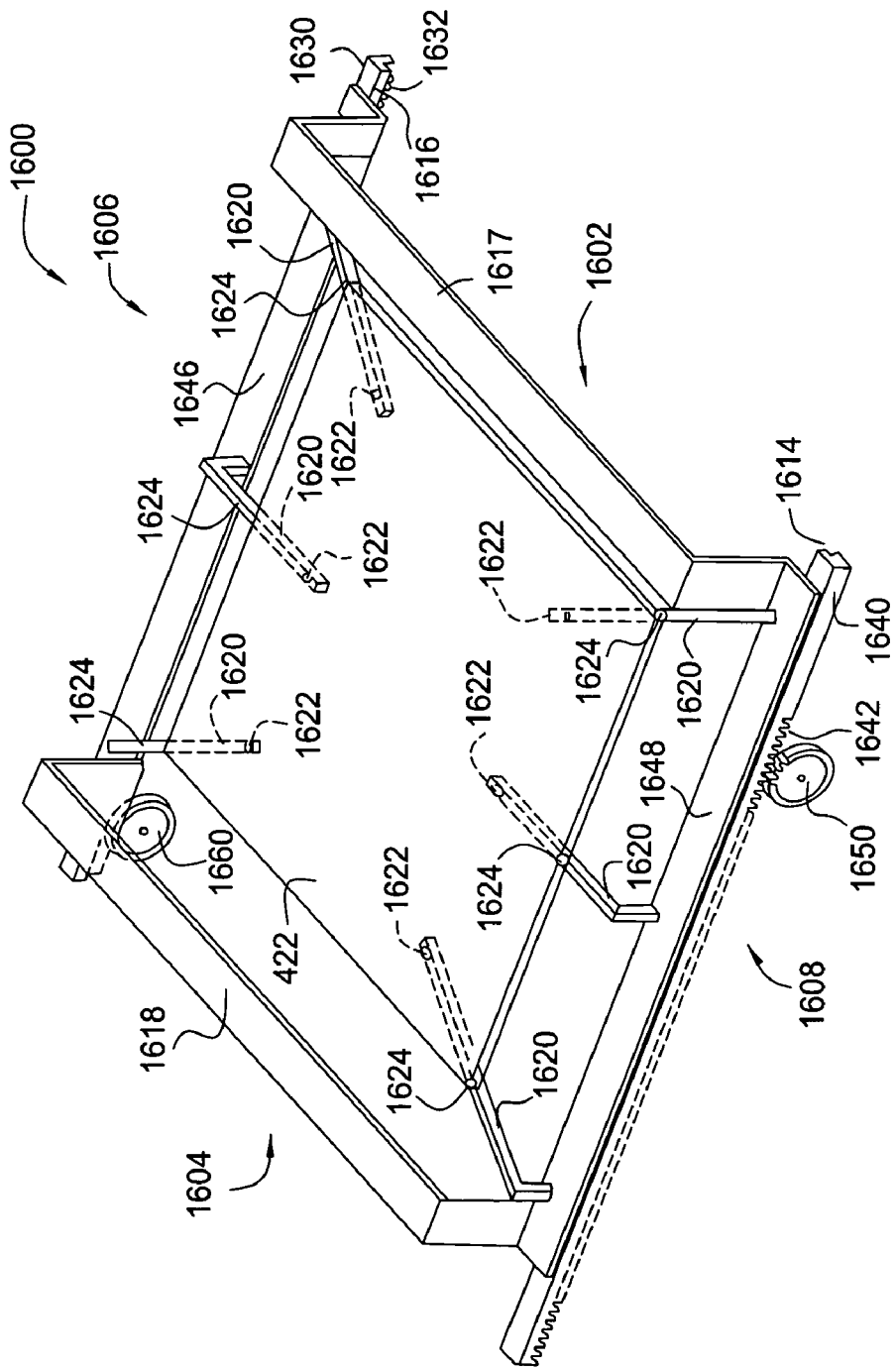
FIG. 16 is a plan view of an exemplary substrate transfer shuttle according to one embodiment of the invention.

FIG. 16 is a cross-sectional view of one exemplary substrate transfer shuttle 1600 in accordance with one or more aspects of the invention. The substrate transfer shuttle 1600 may include a first end 1602 and a second end 1604 opposite the first end 1602, along with a first side 1606 and a second side 1608. A plurality of support fingers 1620 generally extend inwardly from an outer periphery of the substrate transfer shuttle 1600, such as transverse to or at angles to the first and second sides 1606, 1608 and the first and second ends 1602, 1604.

The substrate transfer shuttle 1600 may be positioned inside the shuttle chamber 426 of the invention and can also be coupled to one or more load lock chambers 404, 406 and/or one or more process chambers of the second process module 460 to be coordinated with the substrate supports of the invention, e.g., the transfer robot 430, substrate support plate 1320, the substrate support assembly 1438, the substrate support 1504, and other substrate support mechanisms.

Each substrate transfer shuttle 1600 may include a first side rail 1646 along the first side 1606 and a second side rail 1648 along the second side 1608. The first and second side rails 1646, 1648 are generally parallel to and spaced apart from each other by cross members 1617, 1618. The cross members 1617 and 1618 are generally spaced from the plurality of the support fingers 1620 by a distance greater than the thickness of a substrate, such as the substrate 422, processed in the substrate processing systems of the invention to allow lifting of the substrate 422 from the support fingers 1620 by the substrate support mechanisms of the invention in various chambers where the substrate transfer shuttle 1600 is configured to couple thereto and coordinate with, such as the substrate support plate 1320 and substrate support 1504, and other substrate support pin plates or mechanisms.

The ends of the support fingers 1620 may include one or more support pads 1622 that extend upward from the support fingers 1620 and upon which the substrate 422 is supported. In addition, finger guides 1624 are also positioned on the support fingers 1620 to be disposed outwardly from the support pads 1622 and form a surface against which the substrate 422 can be laterally positioned.

The first and the second side rails 1646, 1648 of the substrate transfer shuttle 1600 may be configured and coupled to toothed racks 1630, 1640 on their lower surfaces for imparting motion to the substrate transfer shuttle 1600. The toothed racks 1630, 1640 include teeth 1632 and 1642, respectively, which are adapted to engage a rotating pinion gear 1650. Optionally, inward stepped surfaces 1614, 1616 on each respective rail are adapted to engage an enclosed guide roller 1660, as shown in FIG. 16.

By positioning these mechanisms, such as toothed racks 1630, 1640, rotating pinion gear 1650, and guide roller 1660 inside various chambers of the invention, it is possible to couple the substrate transfer shuttle 1600 and the like inside various transfer chambers, shuttle chambers, process chambers to help transfer or shuttle the substrate within the substrate processing systems of the invention for saving space, reducing footprint, and increasing throughput.

As an example, referring back to FIG. 12, the substrate transfer shuttle 1600 can be coupled to one or more load lock chambers of the invention, such as, by extending the toothed racks 1630, 1640 into the load lock chamber 1300 and coupling the first side rail 1646 and the second side rail 1648 of the substrate transfer shuttle 1600 to one or more guide roller 1660 and one or more rotating pinion gears 1650.

Figure 17A:
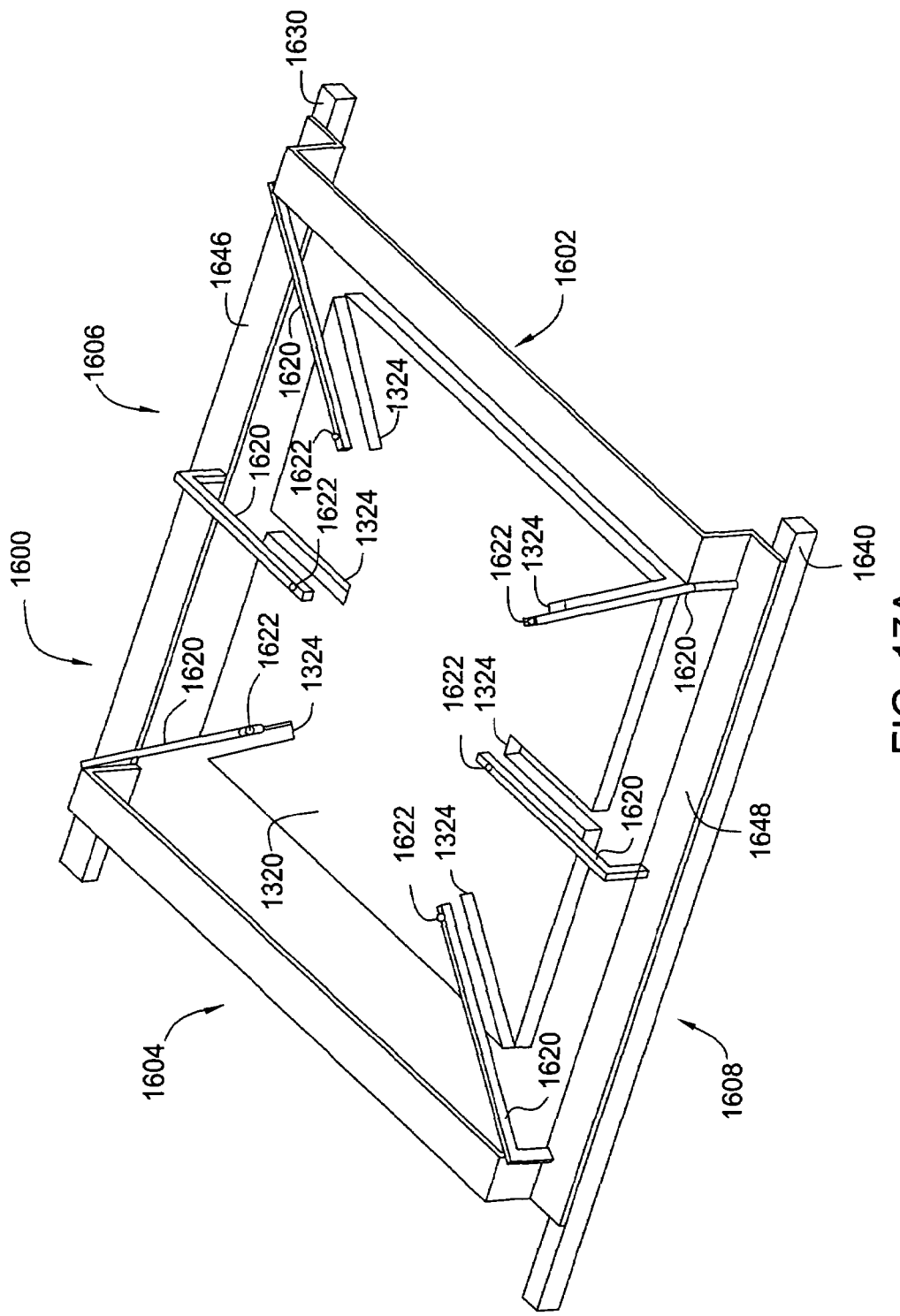
FIG. 17A is a plan view of an exemplary substrate transfer shuttle coupled to an exemplary substrate support plate according to one embodiment of the invention.

FIG. 17A depicts another view of the substrate transfer shuttle 1600 when moved inside a load lock chamber of the invention. The substrate support plate 1320 inside the load lock chamber 1300 can be raised to pass around the support fingers 1620 of the substrate transfer shuttle 1600 in order to contact and lift the substrate place on the substrate transfer shuttle 1600. For example, there may be a plurality of channels 1324 disposed on the substrate support plate 1320 of the load lock chamber 1300, extending inwardly from the sides of the substrate support plate 1320 to be matched with and accommodate the support fingers 1620 of the substrate transfer shuttle 1600 when the substrate support plate 1320 is raised or lowered through a substrate transfer shuttle of the invention.

Figure 17B:
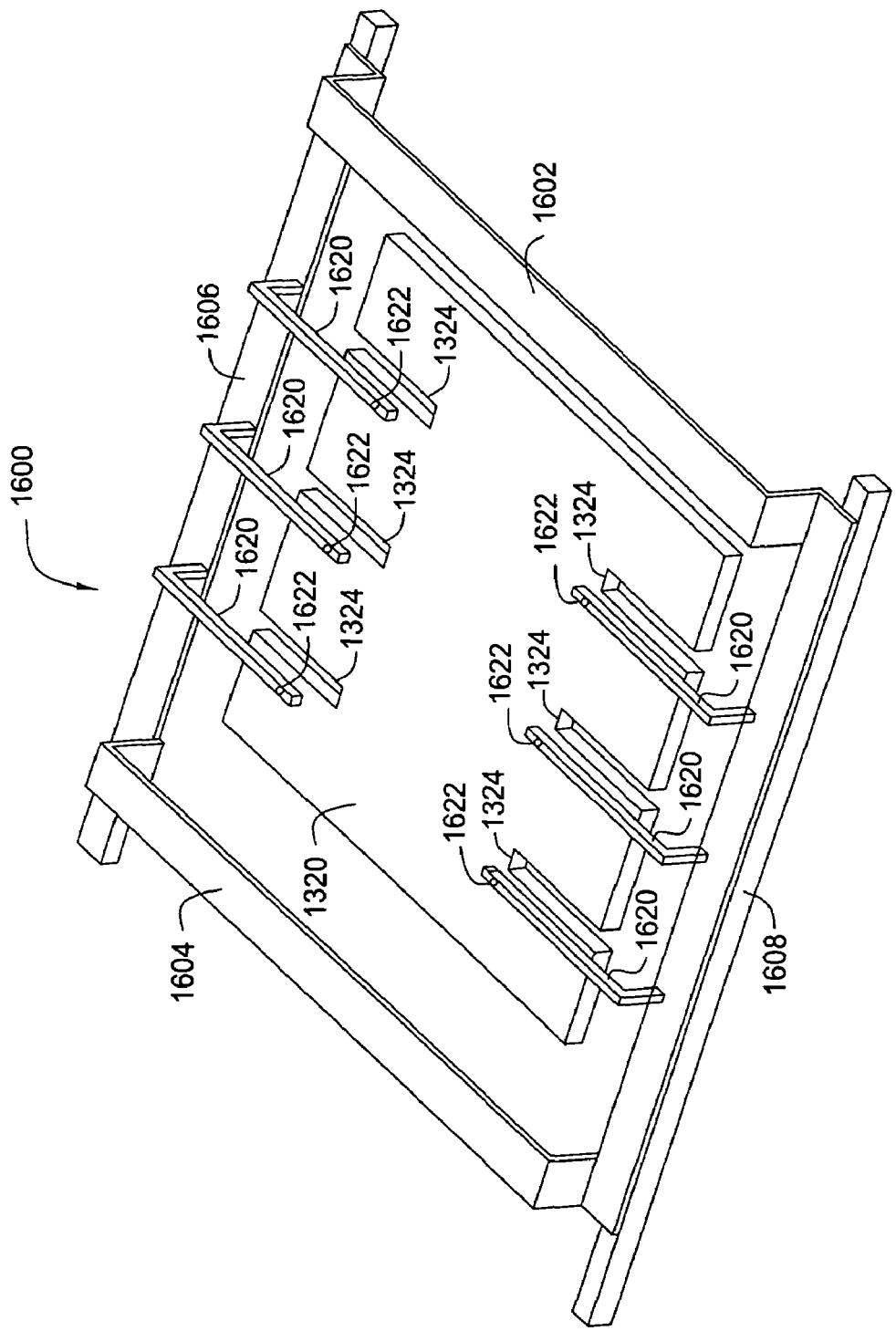
FIG. 17B is a plan view of another exemplary substrate transfer shuttle coupled to an exemplary substrate support plate according to another embodiment of the invention.

FIG. 17B depicts another arrangement of the matching of the channels 1324 of the substrate support plate 1320 with the support fingers 1620 of the substrate transfer shuttle 1600. The numbers and the positioning of the support fingers 1620 and the channels 1324 can be adjusted and arranged flexibly according to one or more aspects of the invention.

Figure 18:
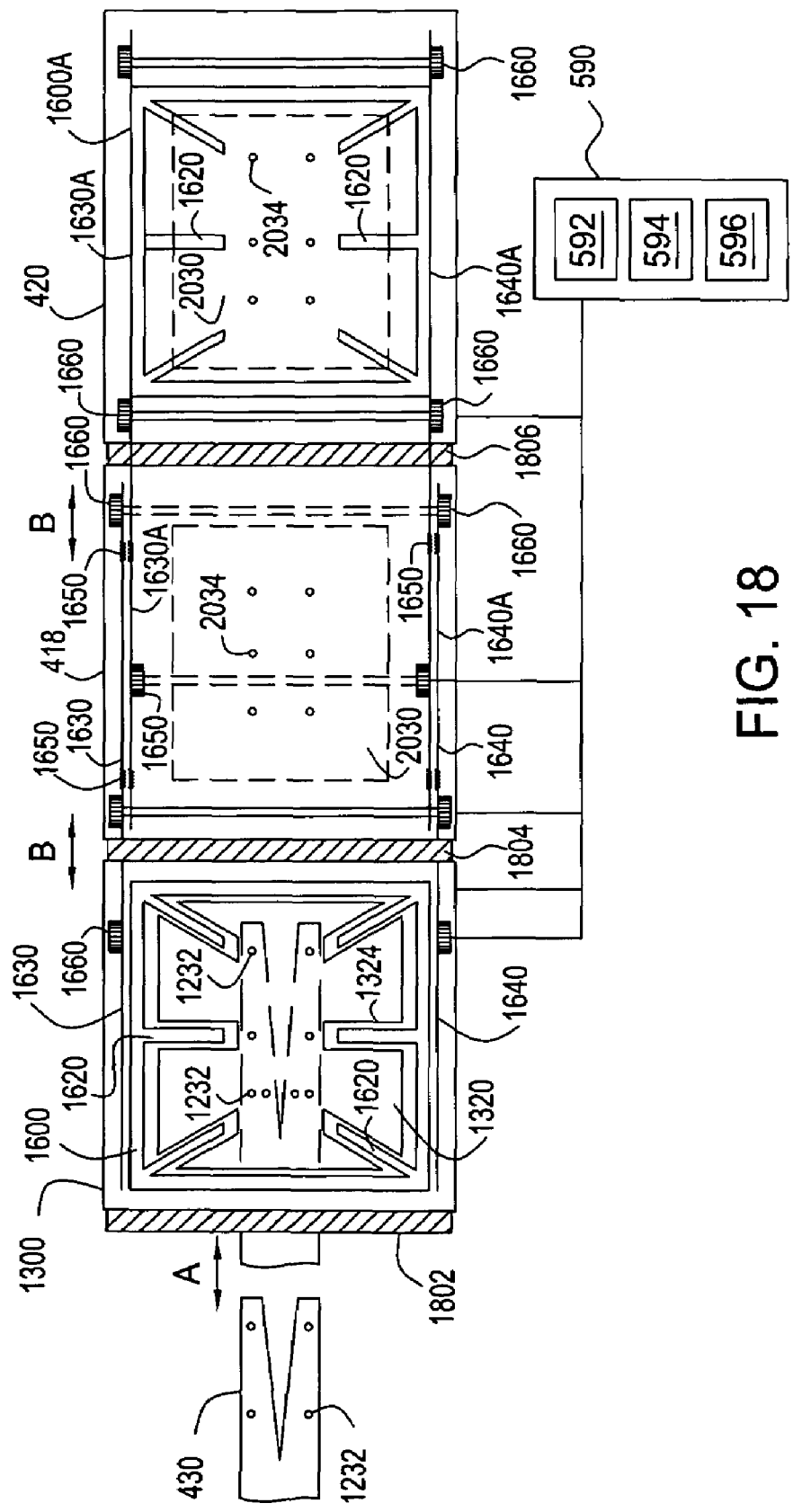
FIG. 18 is a sectional view of one exemplary substrate transfer shuttle coupled to a load lock chamber and a process chamber according to one embodiment of the invention.

FIG. 18 depicts one example of the substrate transfer shuttle 1600 when coordinated with the transfer robot 430 of the invention and coupled to various chambers, such as the load lock chamber 1300 and the process chambers 418, 420, in accordance with one or more aspects of the invention. The transfer robot 430 may include a number of supports 1232 thereon to support a substrate thereon. The transfer robot 43 may load or load the substrate by entering into the load lock chamber 1300 in both a forward and a reverse direction of "A" through a valve 1802 and coordinating with the substrate support plate 1320 and the support fingers 1620 of the substrate transfer shuttle 1600.

As shown in FIG. 18, a number of the chambers of the invention can be configured to include one or more toothed racks 1630, 1640, one or more rotating pinion gears 1650, and one or more guide rollers 1660, such that the substrate transfer shuttle 1600 having the substrate thereon, which are supported by the support fingers 1620, can be moved from the load lock chamber 1300 into and out of the process chamber 418 in both a forward and a reverse direction of "B" through a valve 1804. In addition, using the same toothed racks 1630, 1640 or additional toothed racks 1630A, 1640A, the substrate can be moved from the process chamber 418 into and out of the process chamber 420 in both a forward and a reverse direction of "B" through a valve 1806.

As mentioned before, all the components and movements of the transfer robots, the substrate transfer shuttles, the load lock chambers, and process chambers of the invention are controlled by the controller 590, coupled thereto in order to coordinate various steps of transferring, loading, unloading, deposition, etc., by the substrate processing systems of the invention. Further, the invention contemplates using one or more substrate transfer shuttle for transferring the substrate among various load lock chamber and process chambers. For example, one substrate transfer shuttle 1600 may be used to shuttle the substrate among the load lock chamber 1300 and the one or more process chambers 418, 420. As another example, additional substrate transfer shuttle, such as a substrate transfer shuttle 1600A, can be used to transfer the substrate among the process chambers, such as between the process chamber 418 and the process chamber 420.

Figure 20:
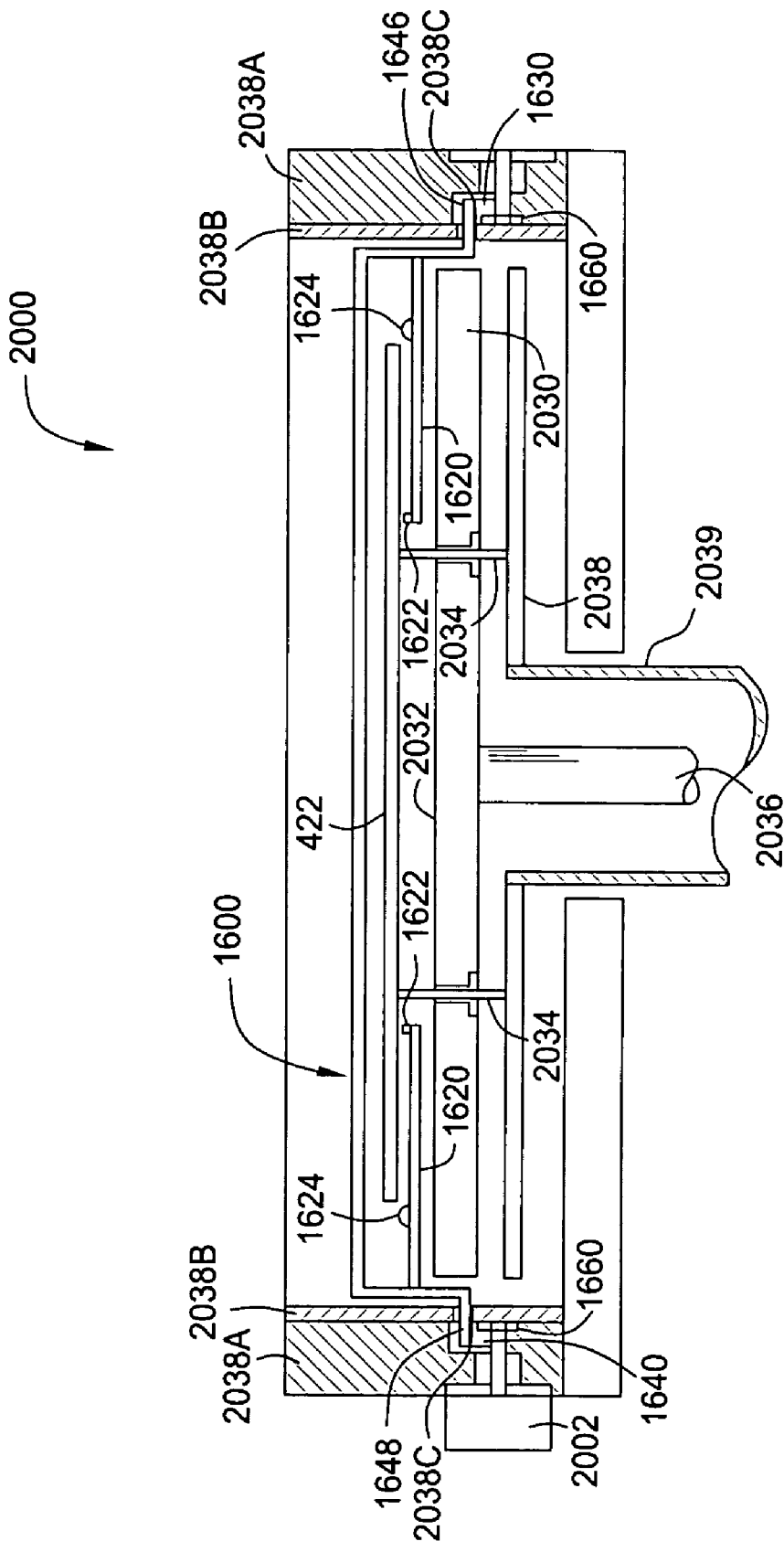
FIG. 20 is a cross-sectional view of an exemplary substrate transfer shuttle positioned above a substrate support plate of a process chamber according to one embodiment of the invention.

When the substrate is transferred inside the process chambers, 418, 420, as shown in FIGS. 18 and 20, each process chamber may include a substrate support mechanism, such as a susceptor 2030, for supporting the substrate 422 during processing. The plan area of the susceptor 2030 may be slightly larger or smaller than the surface area of the substrate 422 and the susceptor 2030 generally include an upper surface 2032 configured to contact substantially the entire underside of the substrate 422. The upper surface 2032 of the susceptor 2030 is continuous except for interruptions caused by the presence of passages for a plurality of lift pins 2034 which may extend through the susceptor 2030 from below.

FIG. 20 depicts one example of a process chamber 2000 of the invention which is coupled to the substrate transfer shuttle 1600 in accordance with one or more aspects of the invention. The process chamber 200 may include inner and outer chamber walls 2038B and 2038A, respectively. A slot 2038C is located in inner wall 38B to allow the toothed racks 1630, 1640 of the substrate transfer shuttle 1600 to extend into the opening in the inner wall 2038B in order to engage one or more guide roller 1660 and/or one or more pinion gears 1650, which may be coupled to a motor 2002. Similar arrangements and mechanisms can be configured in the load lock chamber 1300 of the invention. In this way, contamination caused by the guide rollers 1660 or the pinion gears 1650 may be minimized. Further, the process performed within the chamber is kept separate from the mechanical components of the substrate transfer shuttle 1600 for effecting the movement of the substrate transfer shuttle 1600.

As illustrated in FIG. 20, the susceptor 2030 has a central pedestal 2036 which may be raised and lowered to raise and lower the susceptor 2030. The lift pins 2034 are secured at their lower ends to a pin plate 2038. The lift pins 2034 and the pin plate 2038 are generally raised and lowered by an outer shaft 2039 which surrounds the central pedestal 2036. In one embodiment, the lift pins 2034 and the pin plate 2038 move independently from the susceptor 2030. The lift pins 2034 support the substrate 422 when they are in an extended position. As the lift pins 2034 are retracted, the substrate 422 is lowered to be positioned and placed onto the susceptor 2030. When the susceptor 2030 is caused to rise, the lift pins 2034 are caused to retract to a position below the upper surface 2032 of the susceptor 2030. The lift pins 2034 may pass below the upper surface 2032 by virtue of a counterbore located within the upper surface 2032.

The numbers of lift pins that can be used are not limiting. A total of six lift pins 2034 arranged in pairs are exemplarily illustrated. The invention contemplates that the support fingers 1620 and the lift pins 2034 may be advantageously located at different positions and different angles, such as at positions which are about 15% to 30% of the dimension of the substrate 422, or at positions which are about 22% of the width of the substrate 422. For example, the lift pins 2034 may even be located just inside of the distal ends of the support pad 1622 locations. While it would be preferable to have both the lift pins 2034 and the support pads 1622 at the 22% point as compared to the size of the substrate 422, such placement would not allow the same to pass around each other. Thus, it may be advantageous to have the lift pins 2034 and the support pads 1622 close to each other, but to have the lift pins 2034 just nearer to the centerline of the substrate 422 than the support pads 1622. In this way, relative movement of the substrate transfer shuttle 1600 and the susceptor 2030 of the process chamber 2000 can be accomplished without contacting or conflicting with each other.

Figure 19:
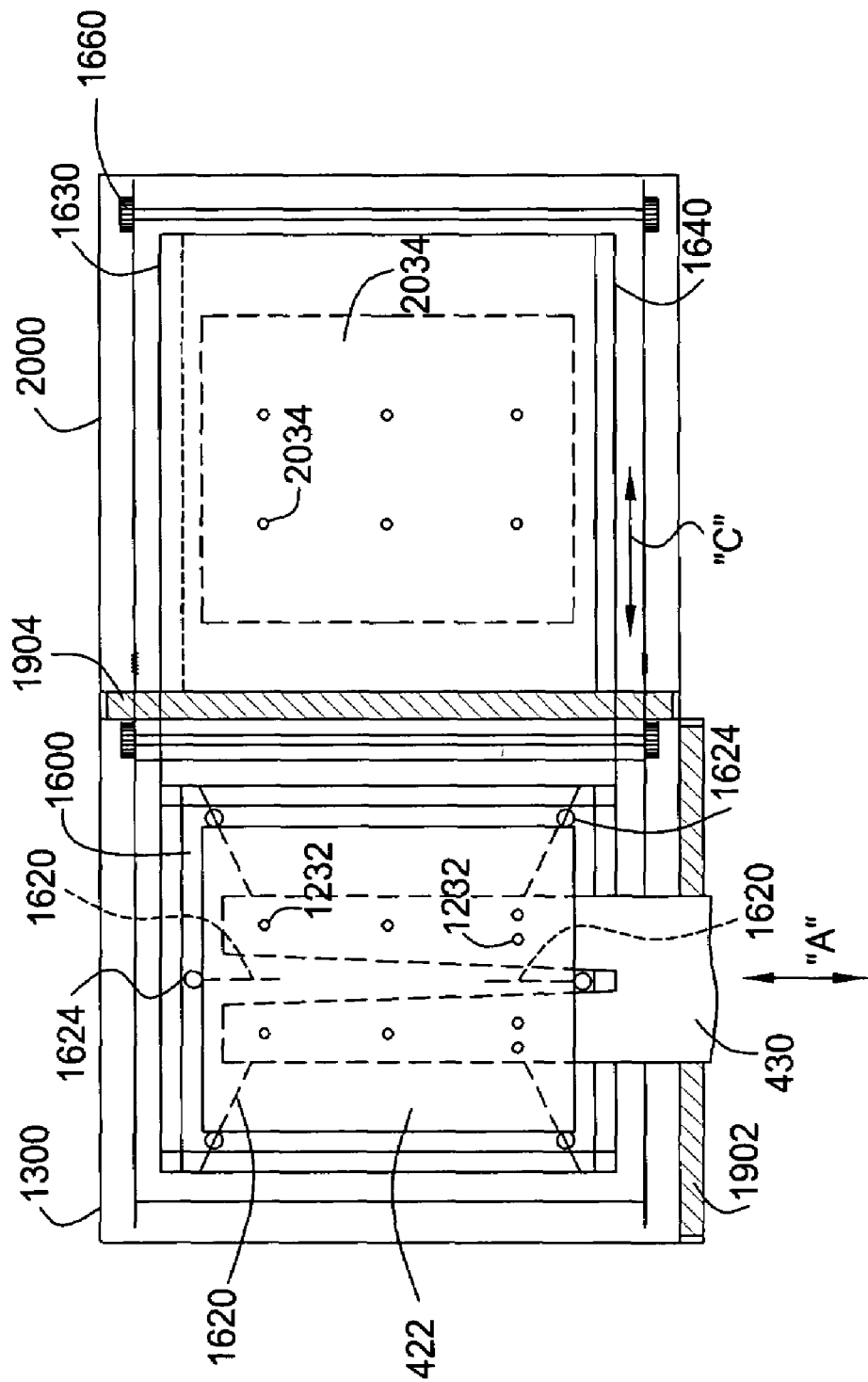
FIG. 19 is a sectional view of another exemplary substrate transfer shuttle coupled to a load lock chamber and a process chamber according to another embodiment of the invention.

In the embodiment of FIG. 18, the direction "A" and the direction "B" can be parallel. The invention contemplates using one or more substrate transfer shuttles 1600 to transfer the substrate 422 in different direction, such as at a 90° interval changes. For example, FIG. 19 depicts one example of the substrate transfer shuttle 1600 to coordinate with the transfer robot 430 of the invention such that the substrate transfer shuttle 1600 is configured to flexibly change the orientations of the substrate 422 received from the transfer robot 430 into a desired orientation in order to be shuttle into and out of the process chamber 2000, in accordance with one or more aspects of the invention.

The transfer robot 430 having the supports 1232 thereon for supporting the substrate 422 thereon may load or load the substrate 422 by entering into the load lock chamber 1300 in both a forward and a reverse direction of "A" through a valve 1902 and coordinating with the support fingers 1620 of the substrate transfer shuttle 1600. The support fingers 1620 of the substrate transfer shuttle 1600 include the finger guides 1624 for guiding the substrate 422 positioned on the substrate transfer shuttle 1600 and assisting the support pads 1622 to support the substrate 422. The substrate 422 positioned on the substrate transfer shuttle 1600 can be moved/shuttled from the load lock chamber 1300 into and out of the process chamber 2000 in both a forward and a reverse direction of "C" through a valve 1904 using one or more toothed racks 1630, 1640, one or more rotating pinion gears 1650, and one or more guide rollers 1660 coupled to the substrate transfer shuttle 1600 and the process chamber 2000. The substrate 422 can be loaded onto or unloaded from the susceptor 2030 of the process chamber 2000 by raising and retracting the lift pins 2034 and/or raising and lowering the susceptor 2030.

Substrate transfer shuttles that may be adapted to benefit from the invention are described in commonly assigned U.S. Pat. Nos. 6,517,303 and 6,746,198, filed on May 20, 1998, titled "Substrate Transfer Shuttle" by White et al.; U.S. Pat. No. 6,176,668, filed on May 20, 1998, titled "in-situ Substrate Transfer Shuttle" by Kurita et al.; U.S. Pat. Nos. 6,206,176; 6,471,459; 6,679,671, filed on May 20, 1998, titled "Substrate Transfer Shuttle Having a Magnetic Drive" by White et al.; all of which are hereby incorporated by reference in their entireties.

FIGS. 21A-21E illustrate one embodiment of depositing multilayer film stacks 2100A, 2100B, 2100C, 2100D, 2100E on the substrate 422 using the method and apparatus of the invention. This type of film stack can be applied to a 4 mask substrate processing and patterning technique. The invention provides the convenience that all the deposition steps can be completed in a single substrate processing system, thereby reducing and eliminating unnecessary substrate transfer and vacuum break.

Figure 21A:
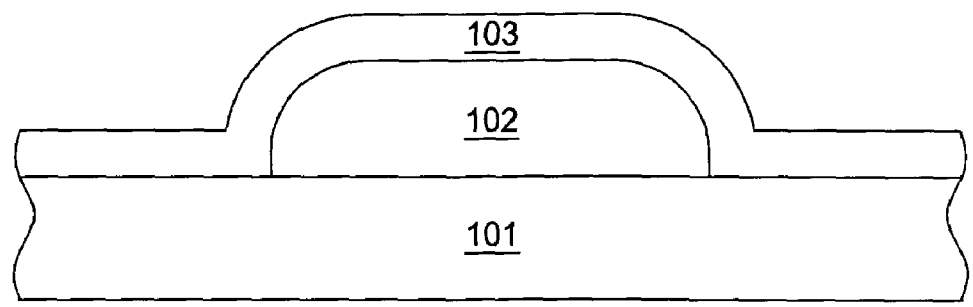
FIGS. 21A-21E depict a cross-sectional schematic view of fabricating an exemplary bottom gate thin film transistor using methods of the invention according to embodiments of the invention.

In FIG. 21A, the film stack 2100A includes the gate electrode layer 102 deposited and patterned on the surface of the substrate 101 and the gate insulation layer 103 deposited over the gate electrode layer 102 using the substrate processing systems of the invention. For example, the gate insulation layer 103 can be deposited using any of the process chamber of the invention, such as the process chambers 410, 412, 414, 416, 410A.

Figure 21B:
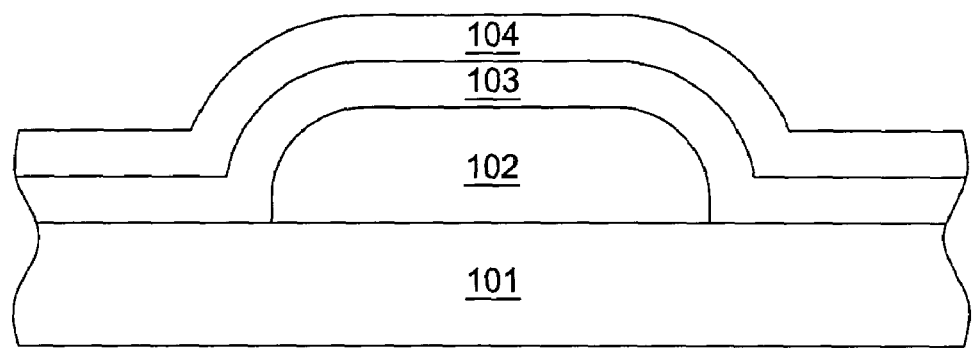

In FIG. 21B, the film stack 2100B further includes the bulk semiconductor layer 104 deposited over the gate insulation layer 103 using the substrate processing systems of the invention. In the embodiment of FIG. 21B, the bulk semiconductor layer 104 and the gate insulation layer 103 are deposited in-situ in a single substrate processing system of the invention using the same process chamber for depositing the two layers, such as a PECVD process chamber of the invention, or sequentially in two process chambers(e.g., the process chamber 410, 412, 414, 416, 410A).

Figure 21C:
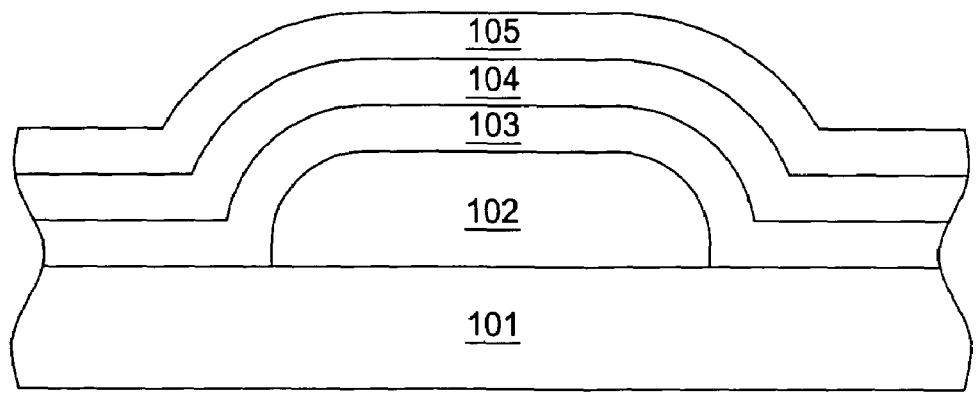

In FIG. 21C, the film stack 2100C further includes the doped semiconductor layer 105 deposited over the bulk semiconductor layer 104 using the substrate processing systems of the invention. In the embodiment of FIG. 21C, the doped semiconductor layer 105, the bulk semiconductor layer 104, and/or the gate insulation layer 103 can be deposited in-situ in a single substrate processing system of the invention using the same process chamber for depositing the three layers or sequentially in two or more process chambers (e.g., the process chamber 410, 412, 414, 416, 410A).

Figure 21D:
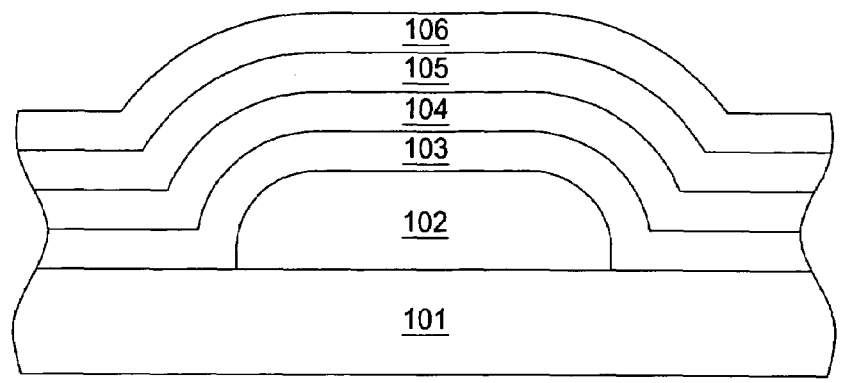
Figure 21E:
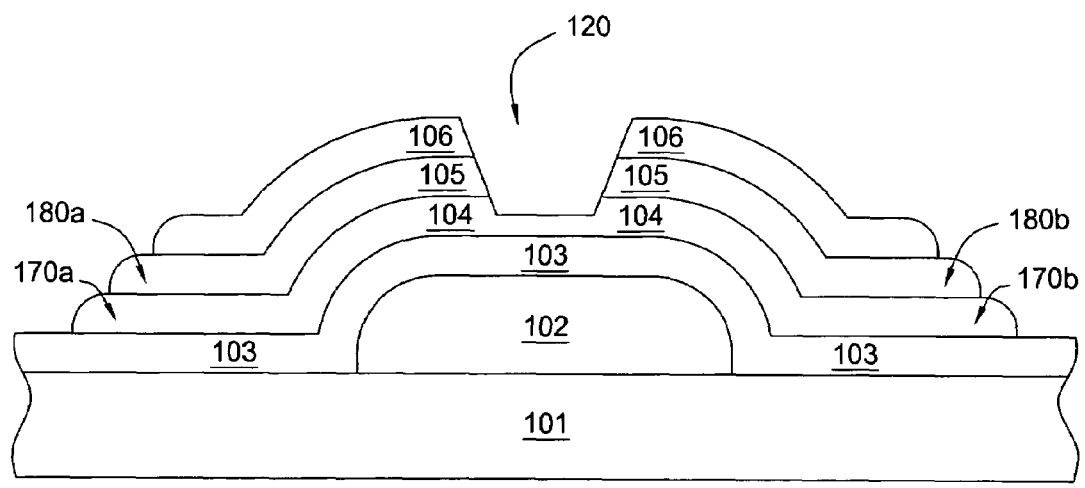

In FIG. 21D, the film stack 2100D further includes the conductive layer 106 deposited over the doped semiconductor layer 105 using the substrate processing systems of the invention. In the embodiment of FIG. 21E, the conductive layer 106 are deposited in-situ over the doped semiconductor layer 105 in a single substrate processing system of the invention using two different types of process chambers configured into the first process module 450 and the second process module 460 without taking the substrate out of the substrate processing system to clean the surface of the substrate. This is especially desirable when a metal-containing material layer, such as the conductive layer 106, is usually deposited by a PVD process and a silicon-containing material layer, such as the semiconductor layer 105, is usually deposited by a CVD process. The invention provides that these two different types of material layers, even if different types of CVD and PVD process chambers are required, can be deposited in-situ in a single substrate processing system, such that no cleaning the surface of the contamination or breaking the vacuum is needed.

In one embodiment, the conductive layer 106 deposited by the substrate processing system is a single material as deposited using one process chamber of the invention, such as the process chamber 418, 420. In another embodiment, the conductive layer 106 deposited by the substrate processing system includes multilayer of different conductive materials deposited by one or more process chambers of the invention, such as one or more PVD process chambers. For example, the conductive layer 106 may include a triple layer having a molybdenum layer as deposited by the process chamber 418 which may be configured to include a molybdenum containing PVD target. An aluminum layer can be deposited over the molybdenum layer by transferring the substrate to the process chamber 420 configured to include an aluminum containing PVD target. A second molybdenum layer can be deposited over the aluminum layer by transferring the substrate back to the process chamber 418 having the molybdenum containing PVD target. The methods and the substrate processing systems of the invention thus provided require no additional need to change the PVD target above the process chamber during multilayer thin film deposition of a PVD process and no cleaning of the substrate surface prior to and after a PVD process.

In FIG. 21E, the film stack 2100D are patterned into a film stack 2100E, including an active region 120 in the channel, a source region 170a and a drain region 170b in the doped semiconductor layer 105, and a source contact region 180a and a drain contact region 180b in the conductive layer 106.

While the foregoing is directed to embodiments of the present invention, other and further embodiments of the invention may be devised without departing from the basic scope thereof, and the scope thereof is determined by the claims that follow.

The invention claimed is:

1. A method of processing a film stack containing one or more silicon-containing layers and one or more metal-containing layers on a substrate in a substrate processing system, comprising:
depositing the one or more silicon-containing layers on the substrate in a chemical vapor deposition process chamber of the substrate processing system;
transferring the substrate from the chemical vapor deposition process chamber into a first transfer chamber maintained at a vacuum level equal to a vacuum level of the chemical vapor deposition process chamber;
transferring the substrate from the first transfer chamber to a second transfer chamber without breaking vacuum;
transferring the substrate from the second transfer chamber to a physical vapor deposition process chamber, the second transfer chamber and the physical vapor deposition process chamber maintained at the same vacuum level, the vacuum level of the physical vapor deposition process chamber is different than the vacuum level of the chemical vapor deposition process chamber; and
depositing the one or more metal-containing layers on the surface of the silicon-containing layers in the physical vapor deposition process chamber without any surface treatment of the one or more silicon-containing layers.

2. The method of claim 1, wherein the one or more silicon-containing layers comprises a material selected from the group consisting of amorphous silicon, n+ doped amorphous silicon, silicon nitride, p+ doped amorphous silicon, silicon oxide, silicon carbide, silicon oxynitride, and combinations thereof.

3. The method of claim 1, wherein the one or more metal-containing layers comprises a material selected from the group consisting of aluminum (Al), molybdenum (Mo), neodymium (Nd), aluminum neodymium (AlNd), tungsten (W), chromium (Cr), tantalum (Ta), titanium (Ti), copper (Cu), aluminum nitride (AlxNy), molybdenum nitride (MoxNy), tantalum nitride (TaN), titanium nitride (TiN), other metal nitrides, their alloys, and combinations thereof.

4. The method of claim 1, wherein the substrate processing system is configured to process one or more large area substrates for fabricating devices selected from the group consisting of flat panel display (FPD), organic light emitting diode (OLED) displays, flexible organic light emitting diode (FOLED) display, polymer light emitting diode (PLED) display, liquid crystal displays (LCD), organic thin film transistor, active matrix, passive matrix, top emission device, bottom emission device, solar cell, solar panel, and combinations thereof.

5. The method of claim 1, wherein the substrate processing system is configured to process one or more large area substrates of about one square meter or larger.

6. The method of claim 1, further comprising transferring the substrate into the chemical vapor deposition process chamber using a first rotably movable vacuum transfer robot positioned in the first transfer chamber of the substrate processing system.

7. The method of claim 1, further comprising transferring the substrate into and out of the physical vapor deposition process chamber using a second rotably movable vacuum transfer robot positioned in the second transfer chamber of the substrate processing system.

8. A method of processing a film stack containing one or more silicon-containing layers and one or more metal-containing layers on a substrate in a substrate processing system, comprising:
    loading the substrate into one or more load lock chambers of the substrate processing system;
    transferring the substrate from the one or more load lock chambers into a first transfer chamber having a rotably movable vacuum transfer robot;
    transferring the substrate from the first transfer chamber into one or more chemical vapor deposition process chambers of the substrate processing system without breaking vacuum, the first transfer chamber and the one or more chemical vapor deposition process chambers maintained at equal vacuum levels;
    depositing the one or more silicon-containing layers on the substrate in the one or more chemical vapor deposition process chambers;
    transferring the substrate from the one or more chemical vapor deposition process chambers into the first transfer chamber without breaking vacuum;
    transferring the substrate from the first transfer chamber into a second transfer chamber without breaking vacuum;
    transferring the substrate from the second transfer chamber into one or more physical vapor deposition process chamber of the same substrate processing system without breaking vacuum, the second transfer chamber and the one or more physical vapor deposition process chambers maintained at equal vacuum levels, the one or more physical vapor deposition process chambers maintained at a different vacuum level than the one or more chemical vapor deposition process chambers;
    depositing the one or more metal-containing layers on the surface of the silicon-containing layers in the one or more physical vapor deposition process chambers without any surface treatment of the one or more silicon-containing layers;
    transferring the substrate from the one or more physical vapor deposition process chambers into the first transfer chamber;
    transferring the substrate from the first transfer chamber into the one or more load lock chambers; and
    unloading the substrate from the one or more load lock chambers.

9. The method of claim 8, further comprising transferring the substrate among the one or more physical vapor deposition process chambers using the second transfer chamber having a second rotably movable vacuum transfer robot coupled thereto.

10. A method of processing a film stack containing one or more silicon-containing layers and one or more metal-containing layers on a substrate in a substrate processing system, comprising:
    loading the substrate into a first load lock chamber of the substrate processing system;
    transferring the substrate into one or more chemical vapor deposition process chambers of the substrate processing system using a vacuum transfer robot positioned in a first transfer chamber of the substrate processing system, the first transfer chamber and the one or more chemical vapor deposition process chambers maintained at an equal vacuum level;
    depositing the one or more silicon-containing layers on the substrate in the one or more chemical vapor deposition process chambers of the substrate processing system;
    transferring the substrate from the one or more chemical vapor deposition process chambers into the first transfer chamber without breaking vacuum;
    transferring the substrate from the first transfer chamber into a second transfer chamber without breaking vacuum;
    transferring the substrate from the second transfer chamber into one or more physical vapor deposition process chambers of the same substrate processing system without breaking vacuum, the second transfer chamber and the one or more physical vapor deposition process chambers maintained at an equal vacuum level, the one or more physical vapor deposition process chambers maintained at a different vacuum level than the one or more chemical vapor deposition process chambers;
    depositing the one or more metal-containing layers on the surface of the one or more silicon-containing layers in the one or more physical vapor deposition process chambers;
    transferring the substrate from the one or more physical vapor deposition process chambers into the first load lock chamber; and
    unloading the substrate from the first load lock chamber of the substrate processing system.

11. The method of claim 10, wherein the one or more silicon-containing layers comprises a material selected from the group consisting of amorphous silicon, n+ doped amorphous silicon, silicon nitride, p+ doped amorphous silicon, silicon oxide, silicon carbide, silicon oxynitride, and combinations thereof.

12. The method of claim 10, wherein the one or more metal-containing layers comprises a material selected from the group consisting of aluminum (Al), molybdenum (Mo), neodymium (Nd), aluminum neodymium (AlNd), tungsten (W), chromium (Cr), tantalum (Ta), titanium (Ti), copper (Cu), aluminum nitride (AlxNy), molybdenum nitride (MoxNy), tantalum nitride (TaN), titanium nitride (TiN), other metal nitrides, their alloys, and combinations thereof.

13. The method of claim 10, wherein the substrate processing system is configured to process one or more large area substrates for fabricating devices selected from the group consisting of flat panel display (FPD), organic light emitting diode (OLED) displays, flexible organic light emitting diode (FOLED) display, polymer light emitting diode (PLED) display, liquid crystal displays (LCD), organic thin film transistor, active matrix, passive matrix, top emission device, bottom emission device, solar cell, solar panel, and combinations thereof.

14. The method of claim 10, wherein the substrate processing system is configured to process one or more large area substrates of about one square meter or larger.

15. The method of claim 10, wherein the vacuum transfer robot in the first transfer chamber is configured to be rotably movable among the one or more chemical vapor deposition process chambers.

16. The method of claim 10, further comprising transferring the substrate from the second transfer chamber into a second load lock chamber and transferring the substrate from the second load lock chamber into the first transfer chamber.

17. A method of processing a film stack containing one or more silicon-containing layers and one or more metal-containing layers on a substrate in a substrate processing system, comprising:

loading the substrate into a first load lock chamber of the substrate processing system;

transferring the substrate from the first load lock chamber through a first transfer chamber into a second transfer chamber;

transferring the substrate from the second transfer chamber into one or more chemical vapor deposition process chambers of the substrate processing system the second transfer chamber and the one or more chemical vapor deposition process chambers maintained at an equal vacuum level;

depositing the one or more silicon-containing layers on the substrate in the one or more chemical vapor deposition process chambers of the substrate processing system;

transferring the substrate from the one or more chemical vapor deposition process chambers into the second transfer chamber without breaking vacuum;

transferring the substrate from the second transfer chamber into the first transfer chamber without breaking vacuum;

transferring the substrate form the first transfer chamber into one or more physical vapor deposition process chambers of the same substrate processing system without breaking vacuum, the first transfer chamber and the one or more physical vapor deposition process chambers maintained at an equal vacuum level, the one or more physical vapor deposition process chambers maintained at a different vacuum level than the one or more chemical vapor deposition process chambers;

depositing the one or more metal-containing layers on the surface of the one or more silicon-containing layers in the one or more physical vapor deposition process chambers;

transferring the substrate from the one or more physical vapor deposition process chambers into the first transfer chamber without breaking vacuum;

transferring the substrate from the first transfer chamber into the first load lock chamber; and unloading the substrate from the first load lock chamber of the substrate processing system.

18. The method of claim 17, wherein the substrate is transferred into the one or more chemical vapor deposition process chambers using a vacuum robot positioned in the second transfer chamber and adapted to be rotably movable among the one or more chemical vapor deposition process chambers.

19. The method of claim 17, further comprising transferring the substrate from the first transfer chamber through a second load lock chamber into the second transfer chamber, and transferring the substrate from the second transfer chamber through the second load lock chamber into the first transfer chamber.

20. The method of claim 19, wherein the second load lock chamber further comprises one or more substrate transfer shuffle mechanisms.

21. The method of claim 17, wherein the first transfer chamber is a shuttle chamber comprising one or more substrate transfer shuttle mechanisms.

22. The method of claim 21, wherein at least one of the one or more substrate transfer shuffle mechanisms is also coupled to a chamber selected from the group consisting of at least one of the one or more physical vapor deposition process chambers, the first load lock chamber, the second load lock chamber, and combinations thereof.

* * * * *

UNITED STATES PATENT AND TRADEMARK OFFICE
CERTIFICATE OF CORRECTION

| | |
|---|---|
| PATENT NO. | : 7,432,201 B2 |
| APPLICATION NO. | : 11/185535 |
| DATED | : October 7, 2008 |
| INVENTOR(S) | : Takehara et al. |

It is certified that error appears in the above-identified patent and that said Letters Patent is hereby corrected as shown below:

In the Claims:

Column 42, Claim 20, Line 25, please delete "shuffle" and insert --shuttle-- therefor;

Column 42, Claim 22, Line 30, please delete "shuffle" and insert --shuttle-- therefor.

Signed and Sealed this

Third Day of February, 2009

JOHN DOLL
*Acting Director of the United States Patent and Trademark Office*